US008531884B2

(12) United States Patent
Min et al.

(10) Patent No.: US 8,531,884 B2
(45) Date of Patent: Sep. 10, 2013

(54) MEMORY DEVICE, SYSTEMS AND DEVICES INCLUDING A MEMORY DEVICE, METHODS OF OPERATING A MEMORY DEVICE, AND/OR METHODS OF OPERATING SYSTEMS AND DEVICES INCLUDING A MEMORY DEVICE

(75) Inventors: Byung Jun Min, Suwon-si (KR); Hoi Ju Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 246 days.

(21) Appl. No.: 13/094,382

(22) Filed: Apr. 26, 2011

(65) Prior Publication Data

US 2012/0039132 A1  Feb. 16, 2012

(30) Foreign Application Priority Data

Aug. 11, 2010  (KR) .......................... 10-2010-0077450

(51) Int. Cl.
*G11C 11/34* (2006.01)

(52) U.S. Cl.
USPC ................. 365/185.14; 365/185.28; 365/113; 365/163

(58) Field of Classification Search
USPC ..................... 365/185.14, 185.28, 113, 163
See application file for complete search history.

(56) References Cited

U.S. PATENT DOCUMENTS

| 7,463,611 | B2 | 12/2008 | Kuskin |
| 7,580,322 | B2 | 8/2009 | Im |
| 2006/0152959 | A1* | 7/2006 | Jung et al. ........................ 365/94 |
| 2008/0278997 | A1 | 11/2008 | Katagiri |

FOREIGN PATENT DOCUMENTS

| JP | 2006114042 A | 4/2006 |
| JP | 2008282434 A | 11/2008 |
| KR | 20060032507 A | 4/2006 |
| KR | 100719383 B1 | 5/2007 |

* cited by examiner

*Primary Examiner* — Jason Lappas
(74) *Attorney, Agent, or Firm* — Harness, Dickey & Pierce

(57) ABSTRACT

In one embodiment, a memory device includes a plurality of unit cell arrays. Each unit cell array includes an array of memory cells arranged in a plurality of columns, and each column is associated with a bit line. The memory device further includes a program control circuit configured to program cells in the plurality of unit cell arrays based on program bits associated with the plurality of unit cell arrays. For example, the program control unit is configured to simultaneously program one memory cell in each unit cell array having at least one associated program bit.

12 Claims, 42 Drawing Sheets

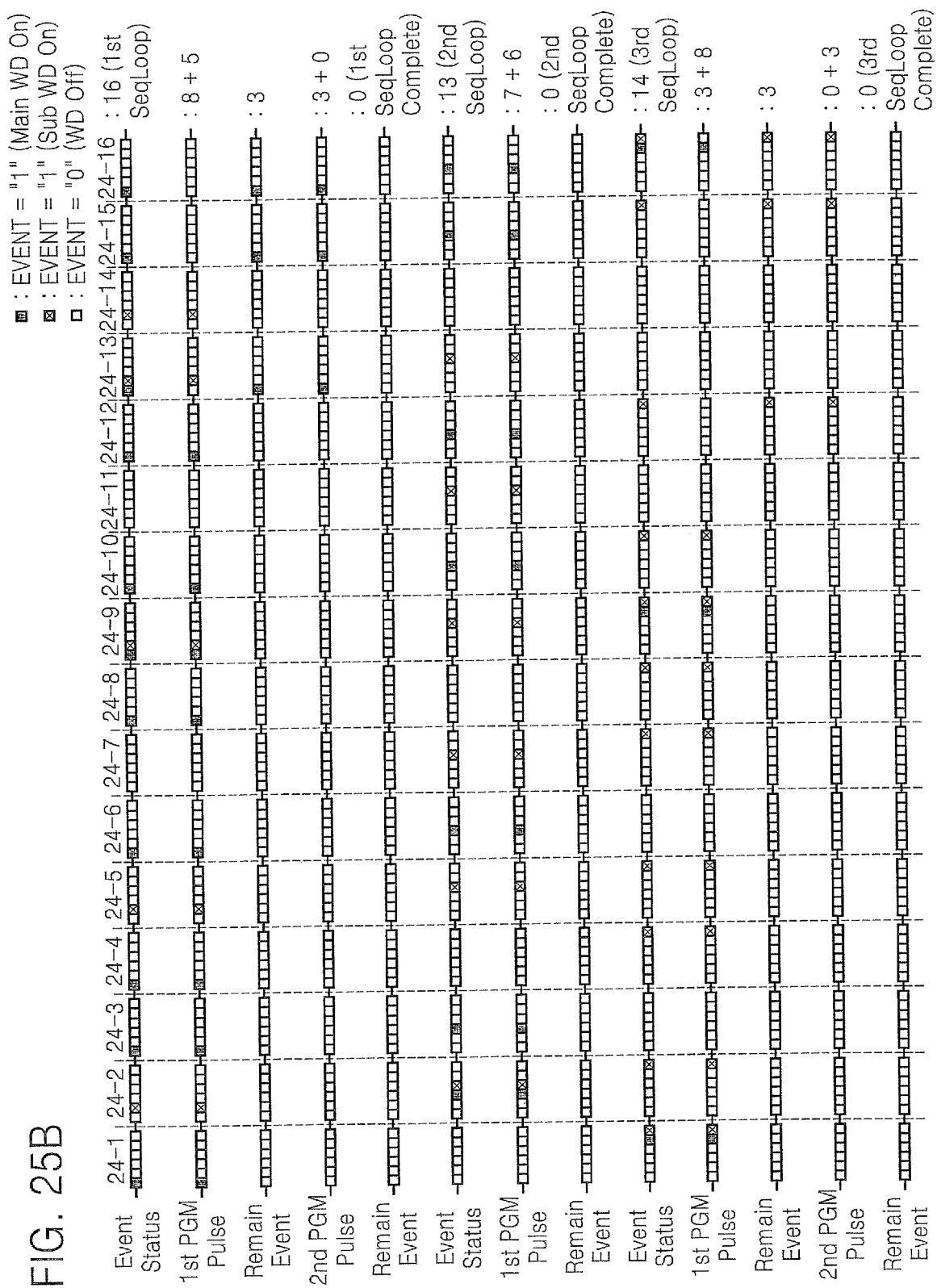

MEMORY DEVICE, SYSTEMS AND DEVICES INCLUDING A MEMORY DEVICE, METHODS OF OPERATING A MEMORY DEVICE, AND/OR METHODS OF OPERATING SYSTEMS AND DEVICES INCLUDING A MEMORY DEVICE

CROSS-REFERENCE TO RELATED APPLICATIONS

This application claims priority under 35 U.S.C. §119 from Korean Patent Application No. 10-2010-0077450 filed on Aug. 11, 2010; the disclosure of which is hereby incorporated by reference in its entirety.

BACKGROUND

Embodiments of the present inventive concepts relate to a data processing technique, and more particularly, to a method of programming program bits in a memory cell array by using a bit sequence scheme in a memory device where an unit cell array constraint exists, and apparatuses performing the method.

A chalcogenide alloy is used as a phase change material used in a phase change RAM (PRAM), and the phase change material causes a reversible phase change between a crystal state (i.e., low resistance) and an amorphous state (i.e., high resistance) by Joule heating occurred by a current or a voltage supplied to the phase change material. Accordingly, the PRAM stores information by using resistance difference of a phase change material, which is occurred by the phase change. In terms of property of PRAM, the number of a plurality of write drivers, which may program a plurality of PRAMs included in a memory cell array during a program operation, is limited.

SUMMARY

Embodiments relates to a memory device, systems and devices including a memory device, methods of operation a memory device, and/or methods of operating systems and devices including a memory device.

In one embodiment, a memory device includes a plurality of unit cell arrays. Each unit cell array includes an array of memory cells arranged in a plurality of columns, and each column is associated with a bit line. The memory device further includes a program control circuit configured to program cells in the plurality of unit cell arrays based on program bits associated with the plurality of unit cell arrays. For example, the program control unit is configured to simultaneously program one memory cell in each unit cell array having at least one associated program bit.

In another embodiment, the memory device includes a plurality of unit cell arrays, each unit cell array including an array of memory cells. The memory device also includes a program control circuit configured to program cells in the plurality of unit cell arrays based on received write data. The write data includes a plurality of data portions, and each data portion corresponds to one of the unit cell arrays. The program control unit is configured to simultaneously program at least one memory cell in each unit cell array having a corresponding data portion that indicates to program at least one memory cell.

In a further embodiment, a memory device includes a plurality of unit cell arrays. Each unit cell array includes an array of memory cells, and the unit cell arrays are grouped into pairs. The memory device also includes a program control circuit configured to program cells in the plurality of unit cell arrays based on program bits associated with the plurality of unit cell arrays. The program control unit is configured to simultaneously program one memory cell in each pair of unit cell arrays having at least one associated programming bit.

In an additional embodiment, a memory device includes a plurality of unit cell arrays, each unit cell array including an array of memory cells arranged in columns. The memory device also includes a program control circuit configured to program cells in the plurality of unit cell arrays based on program bits associated with the unit cell arrays. The program control circuit is configured to simultaneously program a memory cell in the Tth column of no more than N unit cell arrays having an associated program bit during a current main programming operation, and the program control circuit is configured to simultaneously program a memory cell in the (T+1)th column of no more than M unit cell arrays having an associated program bit during a current sub programming operation.

In yet another embodiment, a memory device includes N unit cell arrays, each unit cell array including a number of memory cells arranged in columns, where N is a natural number. The memory device also includes a program control circuit selectively assigning a Tth and (T+1)th columns of the N unit cell arrays to a current main programming operation and a current sub programming operation such that two consecutively assigned columns are assigned to different ones of the current main programming operation and the current sub programming operation. The program control circuit is configured to simultaneously program the Tth and (T+1)th columns assigned to the current main programming operation, and the program control circuit is configured to simultaneously program the Tth and (T+1)th columns assigned to the current sub programming operation.

A further embodiment of a memory device includes N unit cell arrays, each unit cell array including a number of memory cells arranged in columns, where N is a natural number. The memory device also includes a program control circuit selectively assigning a Tth and (T+1)th columns of the N unit cell arrays to a current main programming operation and a current sub programming operation such that two consecutively assigned columns are not both assigned to the current main programming operation. The program control circuit is configured to simultaneously program the Tth and (T+1)th columns assigned to the current main programming operation, and the program control circuit is configured to simultaneously program the Tth and (T+1)th columns assigned to the current sub programming operation, the current sub programming operation overlapping a portion of the current main programming operation.

An additional embodiment of a memory device includes N unit cell arrays, each unit cell array including a number of memory cells arranged in columns, where N is a natural number. The memory device also includes a program control circuit selectively assigning a Tth and (T+1)th columns of the N unit cell arrays to a current main programming operation and a current sub programming operation such that two consecutively assigned columns are not both assigned to the current sub programming operation. The program control circuit is configured to simultaneously program the Tth and (T+1)th columns assigned to the current main programming operation, and the program control circuit is configured to simultaneously program the Tth and (T+1)th columns assigned to the current sub programming operation, the current sub programming operation overlapping a portion of the current main programming operation.

Embodiments further include methods of operating a memory device according to one of the above described embodiments.

Embodiments further include electronic devices, memory cards, systems, etc. that include a memory device according to one of the above described embodiments.

Still further, embodiment include method of operating electronic devices, memory cards, systems, etc. that include a memory device according to one of the above described embodiments.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which:

FIG. 25B shows an example of a diagram for explaining a data process method of a memory device of FIG. 1, which includes a program control block illustrated in FIG. 25A;

DETAILED DESCRIPTION OF EXAMPLE EMBODIMENTS

Figure 1:
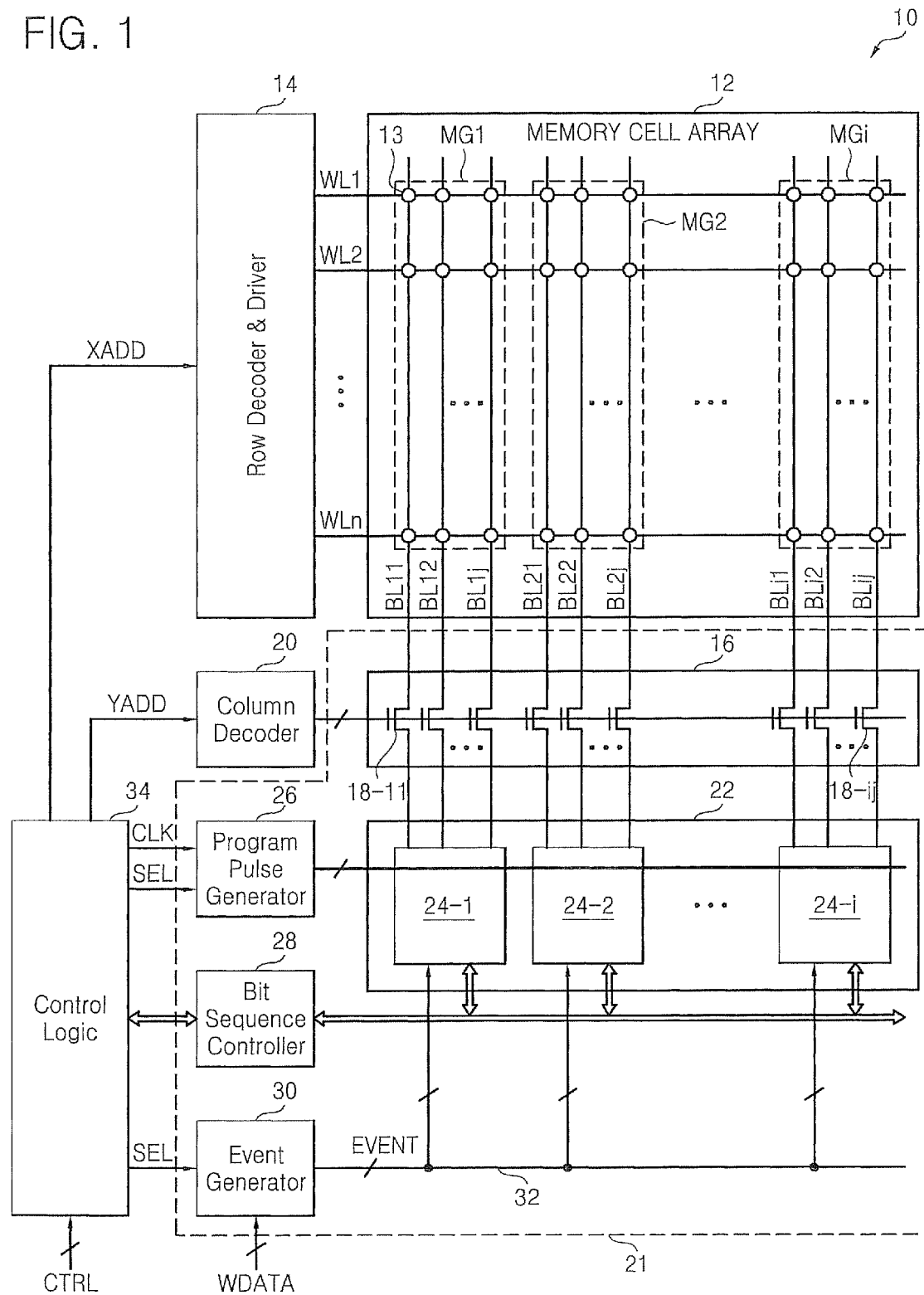
FIG. 1 shows a block diagram of a memory device according to an example embodiment.

Example embodiments will now be described more fully hereinafter with reference to the accompanying drawings. The embodiments may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 shows a block diagram of a memory device according to an example embodiment. The memory device 10 illustrated in FIG. 1 means a semiconductor device performing a bit sequence scheme according to technical concepts and includes a volatile memory device or a non-volatile memory device.

The volatile memory device includes a dynamic random access memory (DRAM), a static random access memory (SRAM), a thyristor RAM (T-RAM), a zero capacitor RAM (Z-RAM) or a twin transistor RAM (TTRAM). The non-volatile memory device includes an electrically erasable programmable read-only memory (EEPROM), a flash memory, a ferroelectric RAM (FeRAM or FRAM), a magneto-resistive random access memory (MRAM), a phase-change RAM (PRAM), a resistive random-access memory (RRAM) or a Nano-RAM (NRAM).

For an ease of explanation, a non-volatile memory device, e.g., PRAM, is taken as an example and explained, however, the present technical concepts may be applied to the volatile memory device or the non-volatile memory device described above.

Referring to FIG. 1, a non-volatile memory device 10 includes a memory cell array which may be two or three dimensionally embodied (12 of FIG. 1 or 12a of FIG. 5), a row decoder & driver 14, a column decoder 20, a program control block 21 and a controller 34.

The memory cell array 12 embodied two dimensionally includes a plurality of word lines WL1 to WLn, a plurality of bit lines BL11 to BLij and a plurality of non-volatile memory cells 13. Each of the plurality of non-volatile memory cells 13 is connected to each of the plurality of word lines WL1 to WLn and each of the plurality of bit lines BL11 to BLij. For the convenience of explanation, the plurality of bit lines BL11 to BLij are shown in FIG. 1. Each of the plurality of bit lines BL11 to BLij may be a global bit line and a plurality of local bit lines are connected to the global bit line. The memory cell array 12 includes a plurality of unit cell arrays MG1 to MGi each arranged adjacently to each other in a bit line direction. Each of the plurality of unit cell arrays MG 1 to MGi includes a plurality of non-volatile memory cells 13.

During a program operation, each of a plurality of enabled write circuits among a plurality of write circuits 24-1 to 24-i may program a program bit in a corresponding non-volatile memory cell among a plurality of non-volatile memory cells, which are included in each corresponding one of a plurality of unit cell arrays MG1 to MGi.

Each of the plurality of non-volatile memory cells 13 includes a memory element and a select element as a memory cell storing data by using a phase change material like GST Ge—Sb—Te. The phase change material has one of two stable states, i.e., a crystal state and an amorphous state, based on a temperature.

Figure 2:
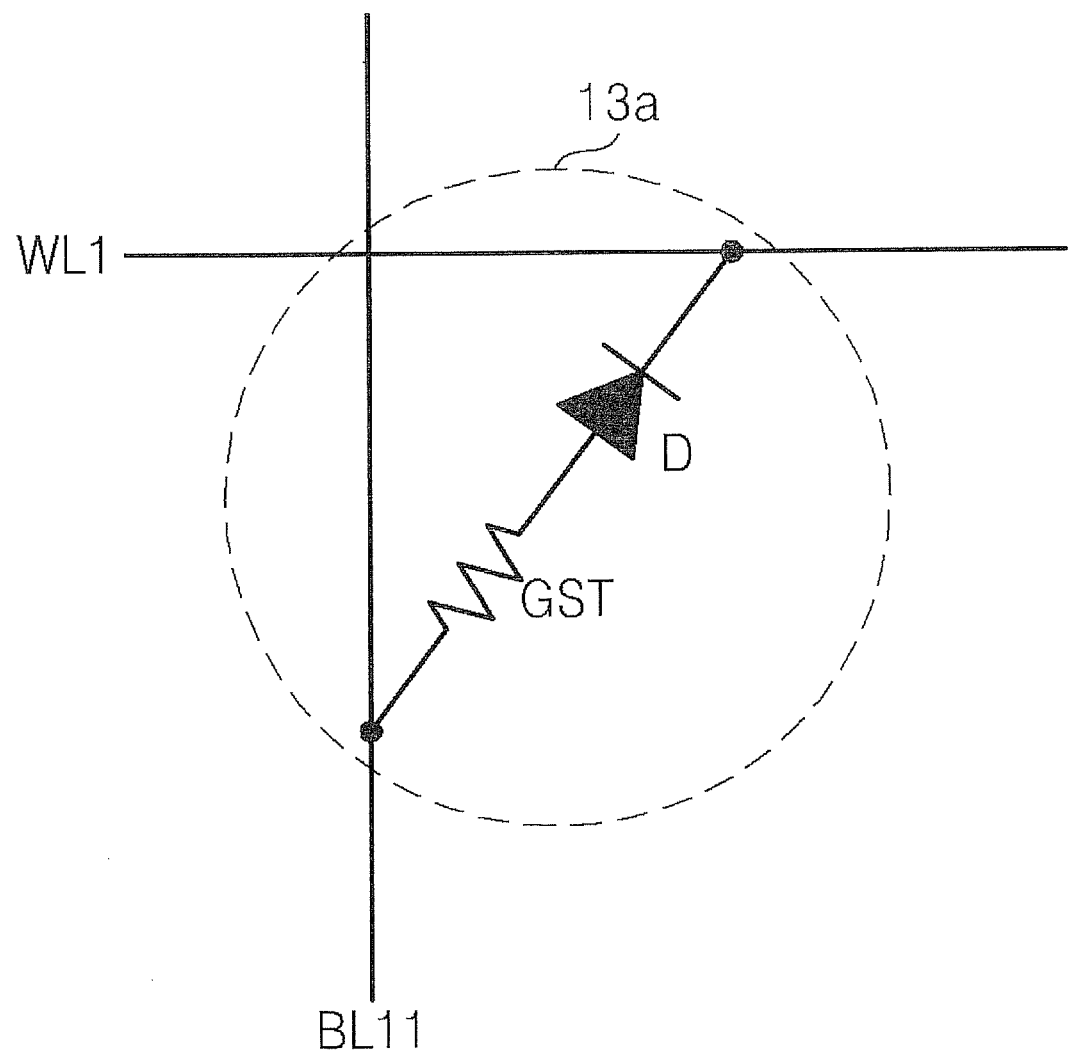
FIG. 2 shows an example embodiment of a memory cell illustrated in FIG. 1.

FIG. 2 shows an example embodiment of a memory cell illustrated in FIG. 1. A non-volatile memory cell is illustrated as the memory cell in FIG. 2, and a non-volatile memory cell (13=13a) includes a memory element GST and a select element D connected in series between a bit line BL11 and a word line WL1. Here, a phase change material GST is used as a memory element and a diode D is used as a select element. That is, anode of the diode D is connected to the memory element GST and cathode of the diode D is connected to a word line WL1.

For example, when a voltage difference between anode and cathode of the diode D is higher than a threshold voltage of the diode D, the memory element GST of a non-volatile memory cell 13a may be supplied with a program current, e.g., a set current or a reset current, through a bit line BL11.

Figure 3:
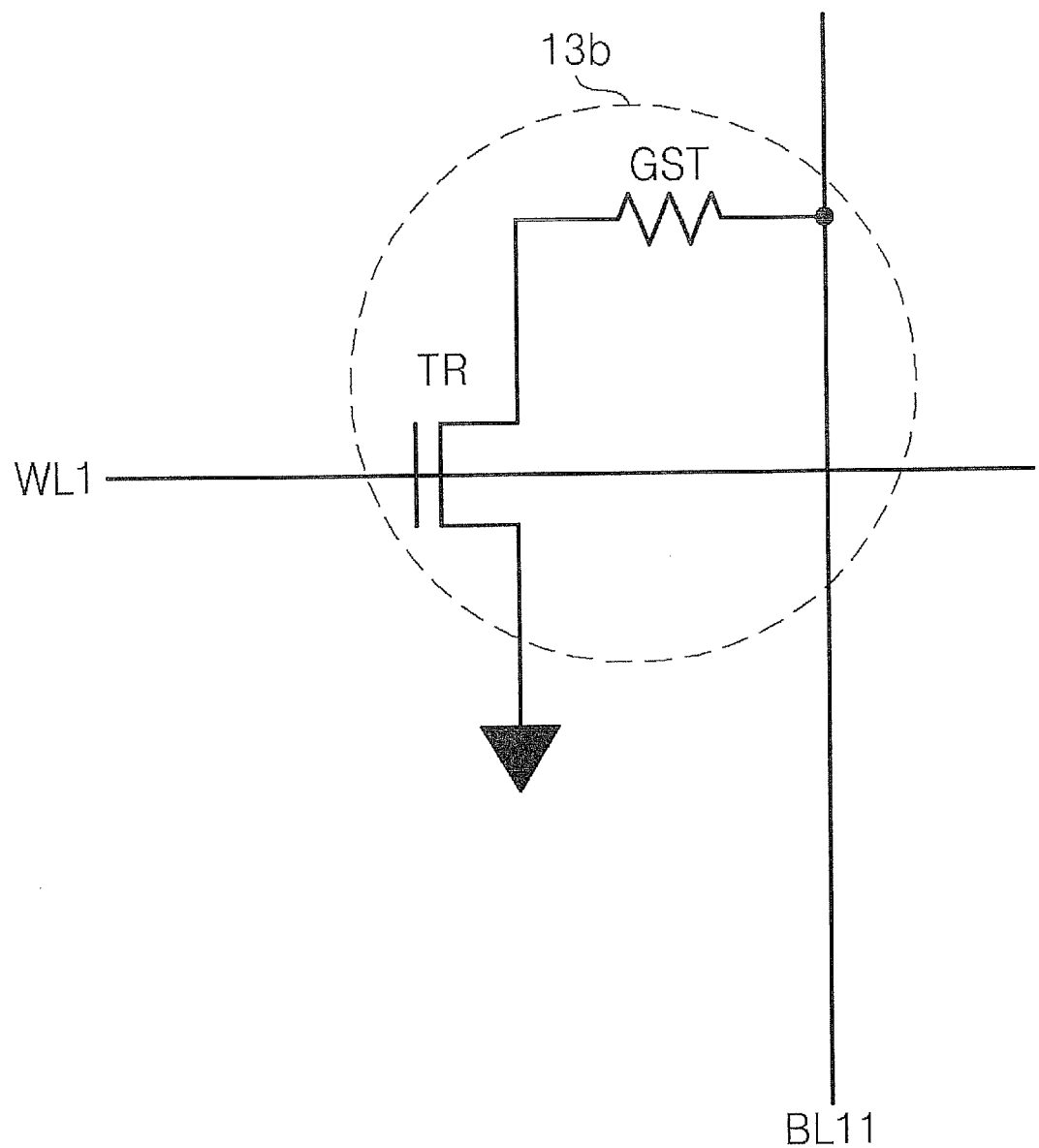
FIG. 3 shows another example embodiment of the memory cell illustrated in FIG. 1.

FIG. 3 shows another example embodiment of a memory cell illustrated in FIG. 1. A non-volatile memory cell is illustrated as the memory cell in FIG. 3, and a non-volatile memory cell (13=13b) includes a memory element (GST) and a select element (TR), which are connected in series between a bit line BL11 and a power line (e.g., a ground line supplying a ground voltage or a power line supplying a fixed voltage). Here, the phase change material GST is used as a memory element and a transistor TR is used as a select element. For example, when a voltage supplied to a word line WL1 is higher than a threshold voltage of the transistor TR, the memory element GST of the non-volatile memory cell 13b may be supplied with a program current, e.g., a set current or a reset current, through a bit line BL11.

Figure 4:
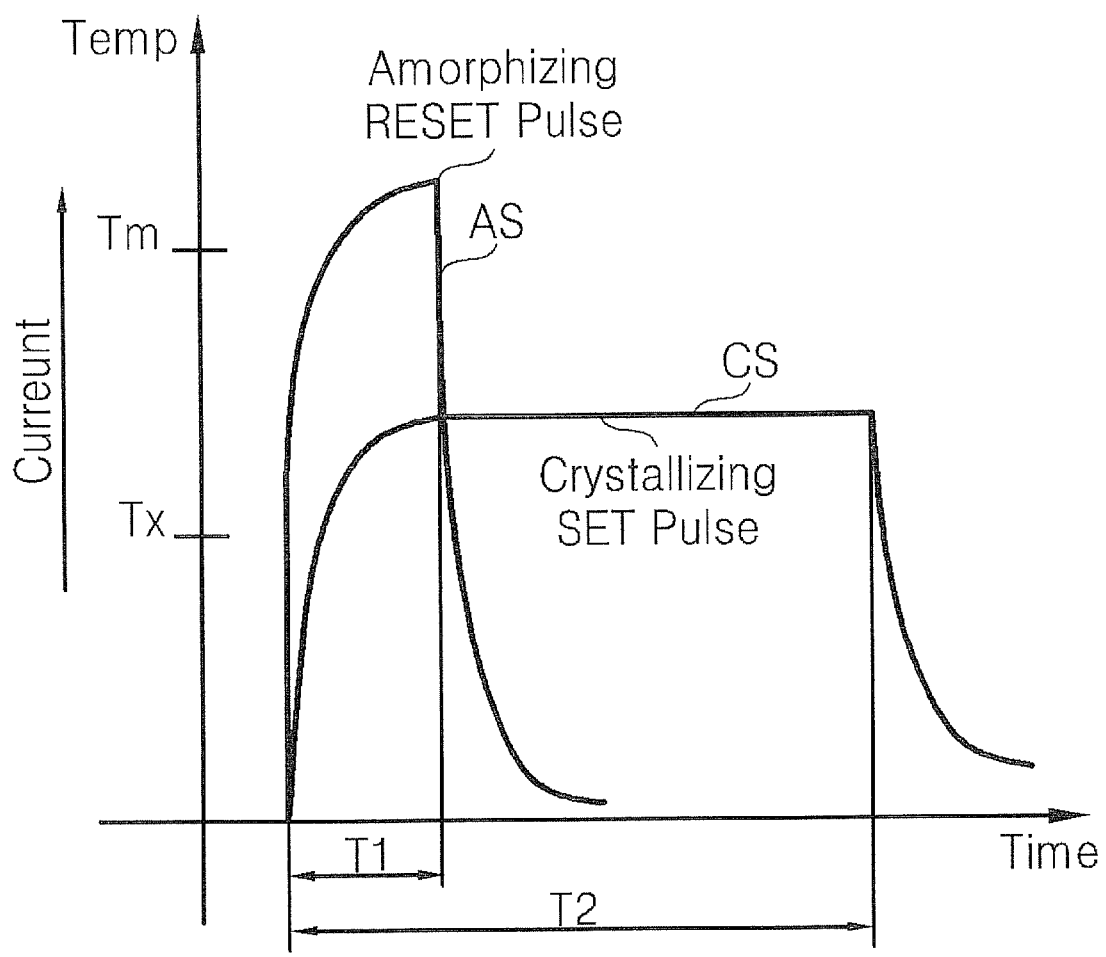
FIG. 4 is a graph for explaining property of a phase change material illustrated in FIGS. 2 and 3.

FIG. 4 is a graph for explaining property of a phase change material illustrated in FIGS. 2 and 3. AS means a condition, e.g., a current, which is for making a phase change material GST of FIGS. 2 and 3 in an amorphous state, and CS means a condition, e.g., a current, which is for making the phase change material GST in a crystal state.

As illustrated in FIGS. 2 to 4, the phase change material GST turns to be in an amorphous state when it is heated with a higher temperature than a melting temperature Tm and quenched rapidly by a current AS supplied through a bit line BL11 during a first time T1.

The phase change material GST turns to be in a crystal state when it is heated with a temperature, which is lower than a melting temperature Tm and higher than a crystallization temperature Tc, and quenched slowly by a current CS supplied through a bit line BL11 during a second time T2 which is longer than the first time T1 (T2>T1). Resistance of the non-volatile memory cell 13, 13a or 13b when the phase change material GST is in an amorphous state is greater than resistance of the non-volatile memory cell 13, 13a or 13b when the phase change material GST is in a crystal state. Therefore, the phase change material GST may store data by using such a resistance difference.

The amorphous state is called a reset state and may mean to store data '1', and the crystal state is called a set state and may mean to store data '1'. Of course, according to how a reset state and a set state are defined, it may be defined that the reset state stores data '0' and the set state stores data '1'.

A set operation of the present specification means an operation to program data '0' in a non-volatile memory cell 13, i.e., an operation to make a phase change material GST of the non-volatile memory cell 13 in a crystal state. Additionally, a rest operation means an operation to program data '1' in the non-volatile memory cell 13, i.e., an operation to make a phase change material GST of the non-volatile memory cell 13 in an amorphous state. Therefore, the program operation includes the set operation and the reset operation.

Referring to FIG. 1 again, the row decoder and driver 14 decodes row addresses XADD output from the controller 34 and drives one of a plurality of word lines WL1 to WLn embodied in a memory cell array 12 selectively.

The column decoder 20 decodes column addresses XADD output from the controller 34 and outputs a plurality of selection signals.

During a program operation, the program control block 21 operates each one or two of plural write drivers WD (See FIG. 6) included in each of a plurality of write circuits 24-1 to 24-i selectively and doesn't operate rest write drivers.

Figure 17:
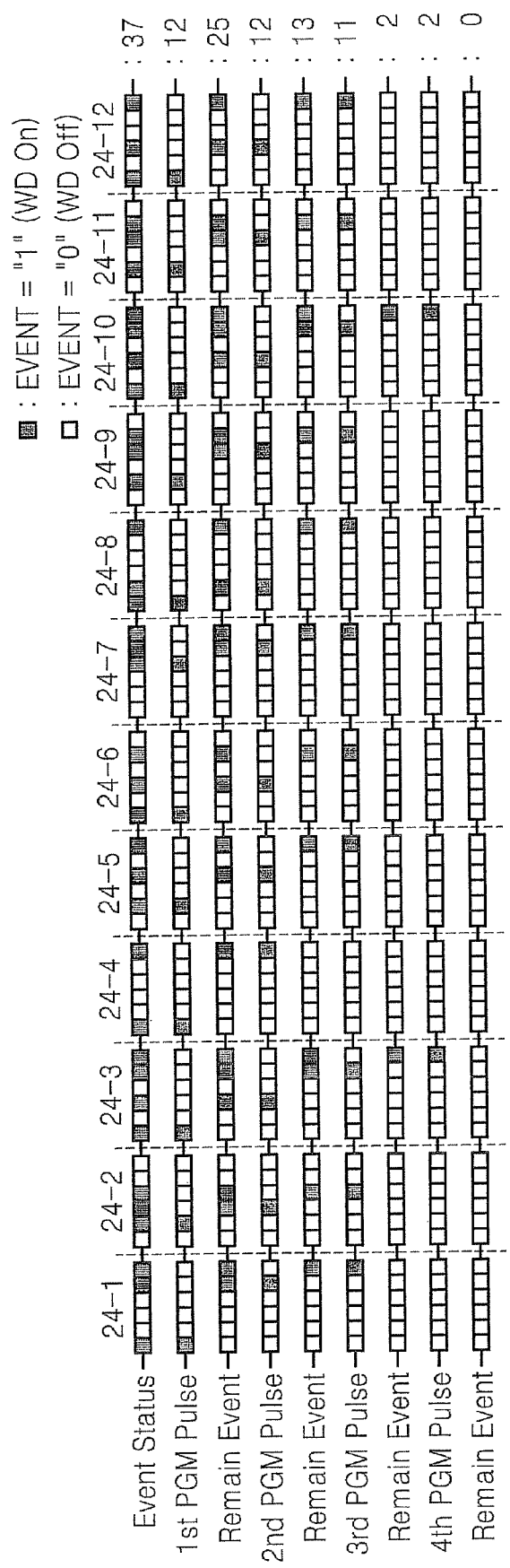
FIG. 17 shows an example embodiment of a diagram for explaining a data process method of a memory device of FIG. 1, which includes a program control block illustrated in FIG. 6.

According to embodiments, e.g., as illustrated in FIG. 17, the program control block 21 may program each one of bits to be programmed (hereinafter: program bits), assigned in each of a plurality of unit cell arrays MG1 to MGi, in each corresponding one of a plurality of non-volatile memory cells, included in each of the plurality of unit cell arrays MG1 to MGi, at the same time. That is, the program control block 21 operates only one of a plurality of write drivers included in a write circuit 24-1 corresponding to a unit cell array, e.g., MG1. More detail, the number of write drivers which may operate simultaneously in every write circuit 24-1 to 24-i is one.

Figure 19:
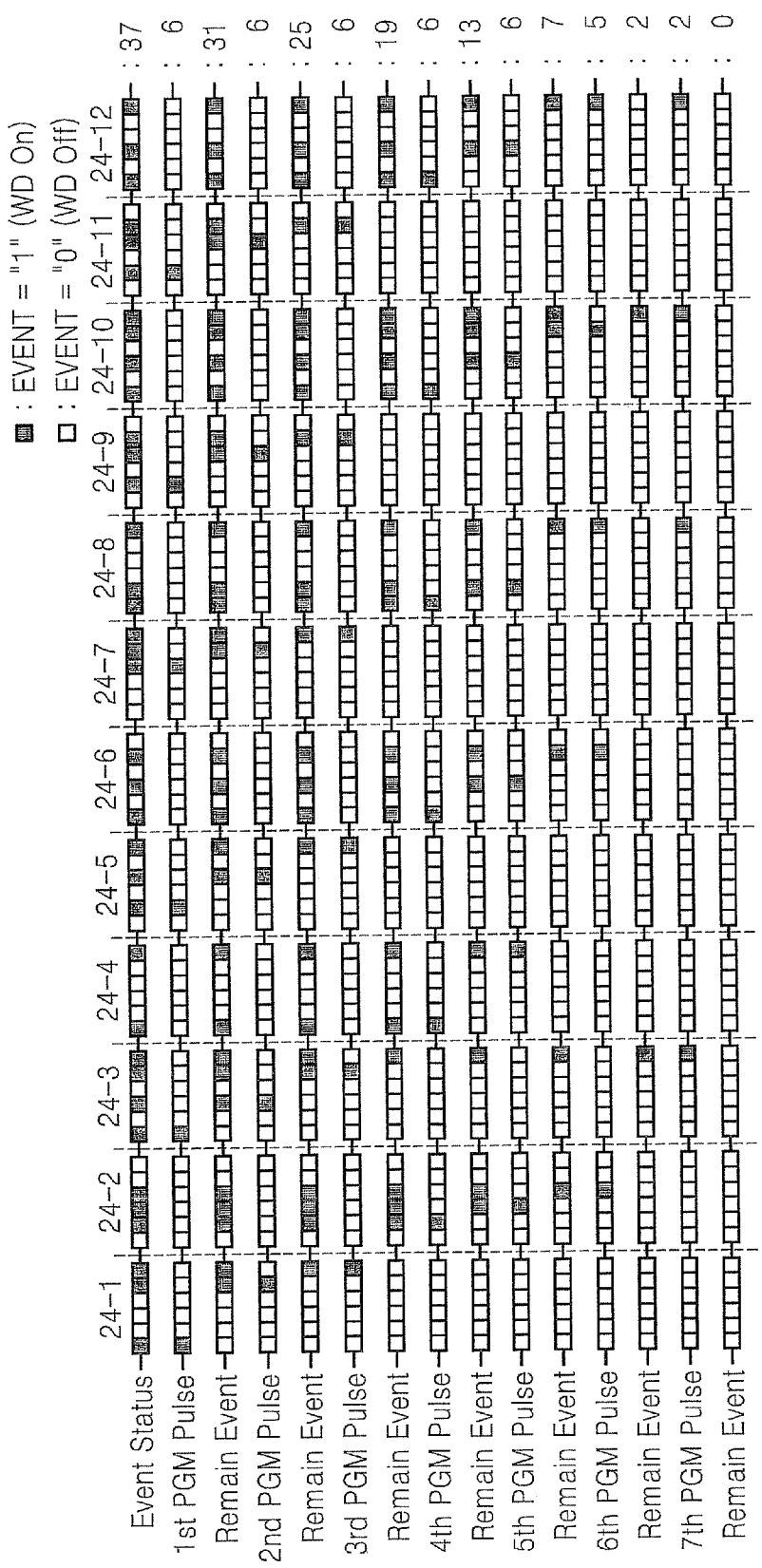
FIG. 19 shows an example of a diagram for explaining a data process method of a memory device of FIG. 1, which includes a program control block illustrated in FIG. 18.

According to another example embodiment, e.g., as illustrated in FIG. 19, the program control block 21 operates only one of all write drivers included in two write circuits corresponding to two unit cell arrays during a program operation. More detail, the number of write driver which may operate simultaneously in every two write circuits is one.

Figure 31:
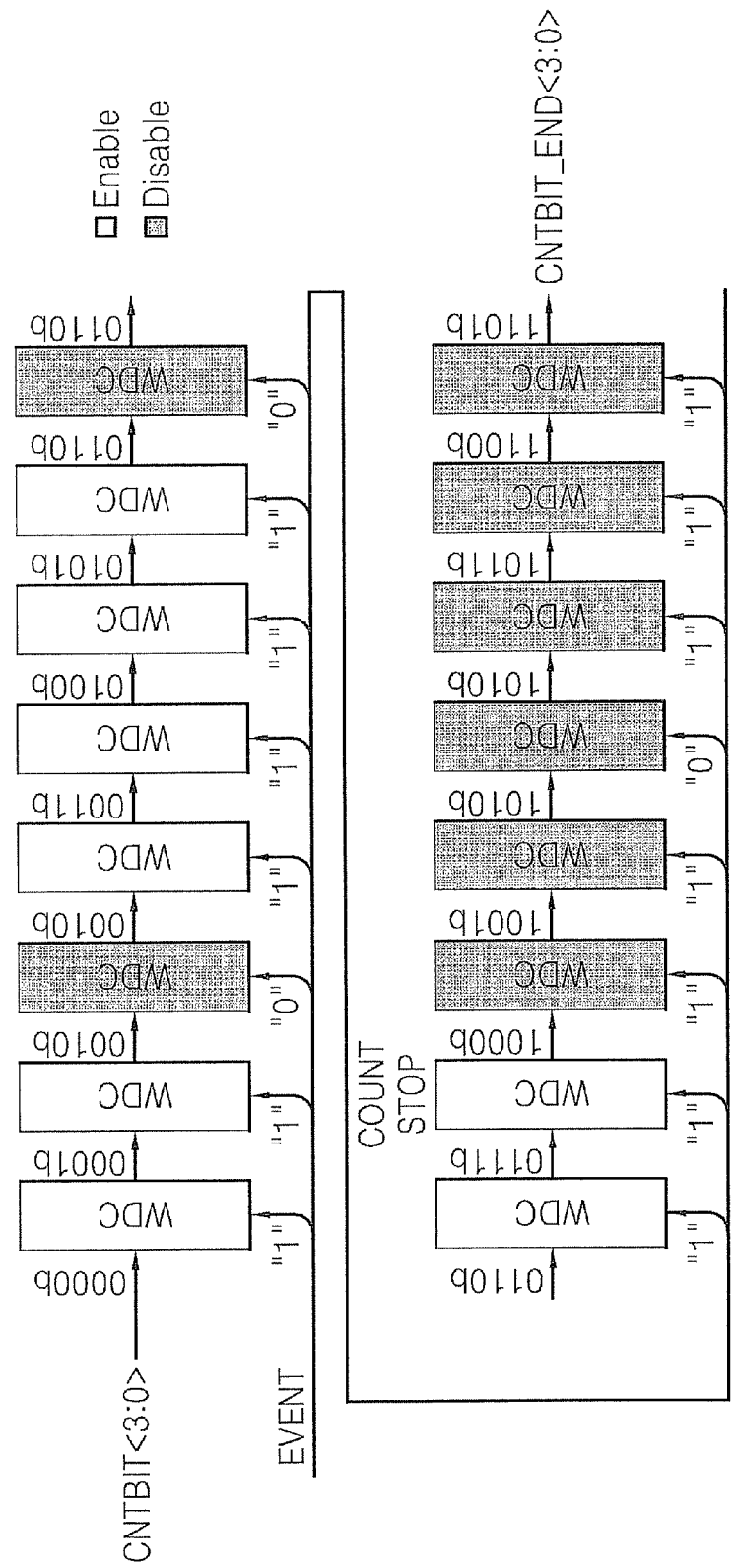
FIGS. 31 and 32 show diagrams for explaining an operation of a plurality of write driver controllers included in a write circuit block illustrated in FIG. 1.

According to still another example embodiment, the program control block 21, as illustrated in FIG. 25 or 31, may program each N program bit among program bits, assigned in each of a plurality of unit cell arrays MG1 to MGi, in each corresponding N non-volatile memory cell among a plurality of non-volatile memory cells, included in each of the plurality of unit cell arrays MG1 to MGi, during a program operation. Here, N is a natural number.

Figure 20:
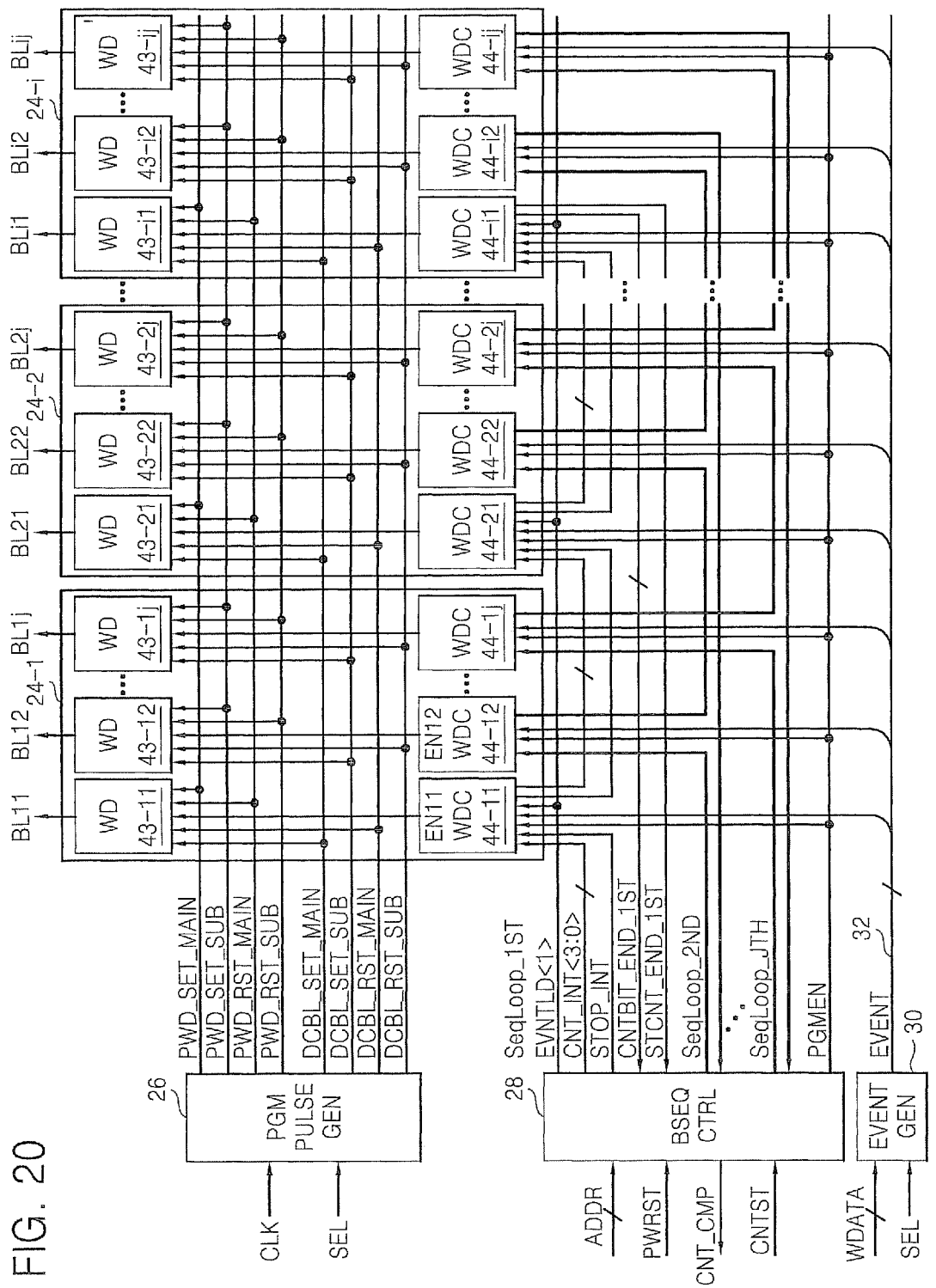
FIG. 20 shows a block diagram of a program control block of FIG. 1, which may perform a data process operation according to still another example embodiment.

When the N is 2, the program control block 21 may program one of two bits in one of two non-volatile memory cells by using a first program pulse, e.g., PWD_SET_MAIN or PWD_RST_MAIN of FIG. 20, and program the other of the two bits in the other of the corresponding two non-volatile memory cells by using a second program pulse, e.g., PWD_SET_SUB or PWD_RST_SUB of FIG. 20.

The program control block 21 includes a selection circuit 16, a write circuit block 22, a program pulse generator 26, a bit sequence controller 28 and an event generator 30.

The selection circuit 16 controls connection of the memory cell array 12 and the write circuit block 22 in response to a plurality of selection signals output from a column decoder 20. For example, each of a plurality of selection switches 18-11 to 18-ij included in the selection circuit 16 controls a connection between each of a plurality of bit lines BL11 to BLij and each write driver included in the write circuit block 22 in response to each of a plurality of selection signals output from the column decoder 20.

The write circuit block 22 includes a plurality of write circuits (or tiles) 24-1 to 24-i. Each of the plurality of write circuits 24-1 to 24-i includes a plurality of write drivers WD and a plurality of write driver controllers WDC as illustrated in FIGS. 6, 18, 20 and 27. Each of the plurality of write driver controllers WDC may control an operation, e.g., enable or disable, of each one of the plural write drivers WD.

Figure 6:
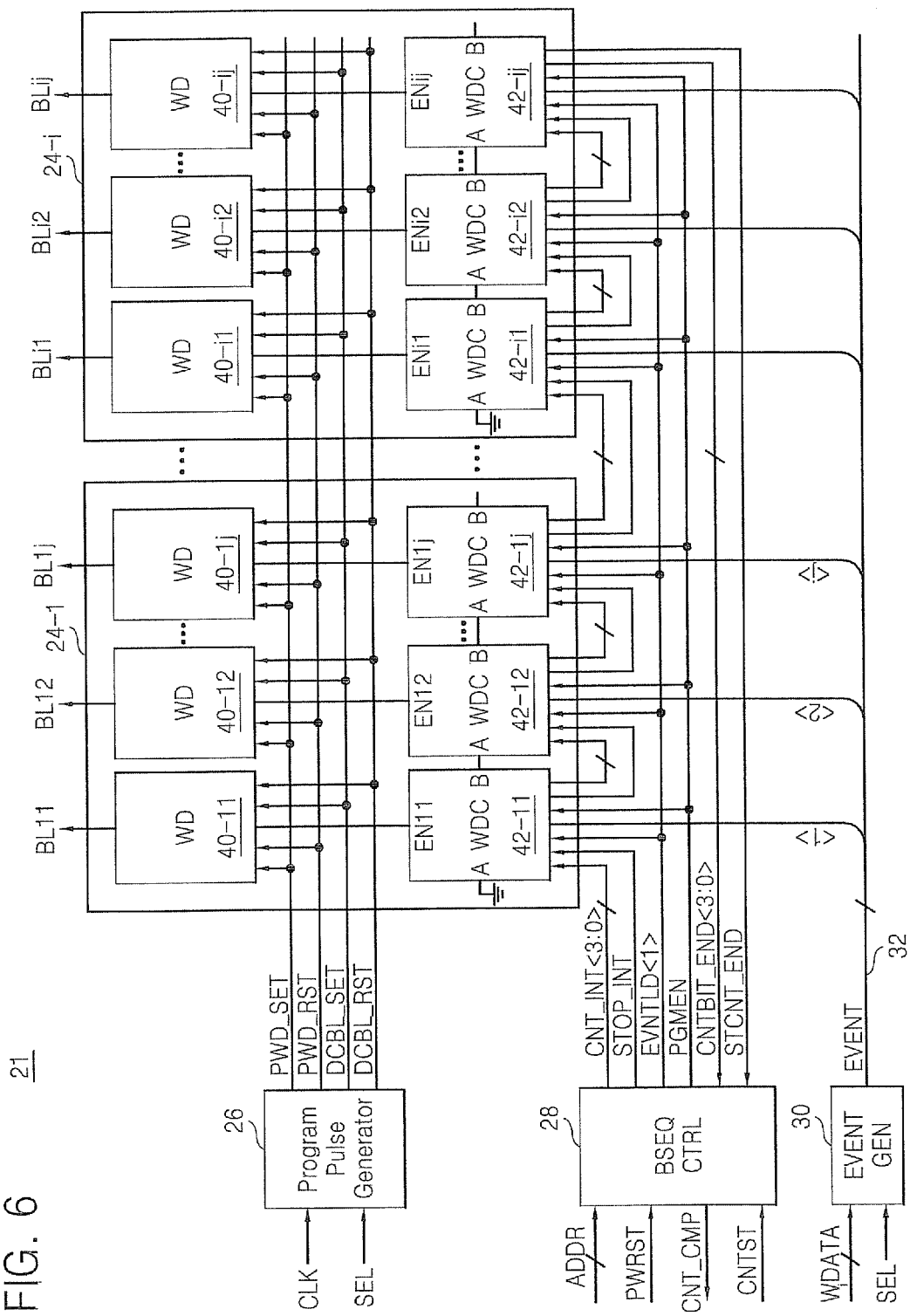
FIG. 6 shows a block diagram of a program control block illustrated in FIG. 1, which may perform a data process operation according to an example embodiment.

The program pulse generator 26 generates a program pulse (PWD_SET or PWD_RST) and a bias voltage (DCBL_SET or DCBL_RST) based on a clock signal CLK and a selection signal SEL as illustrated in FIG. 6, and outputs a generated program pulse (PWD_SET or PWD_RST) and a generated bias voltage (DCBL_SET or DCBL_RST) to the write circuit block 22.

Figure 7:
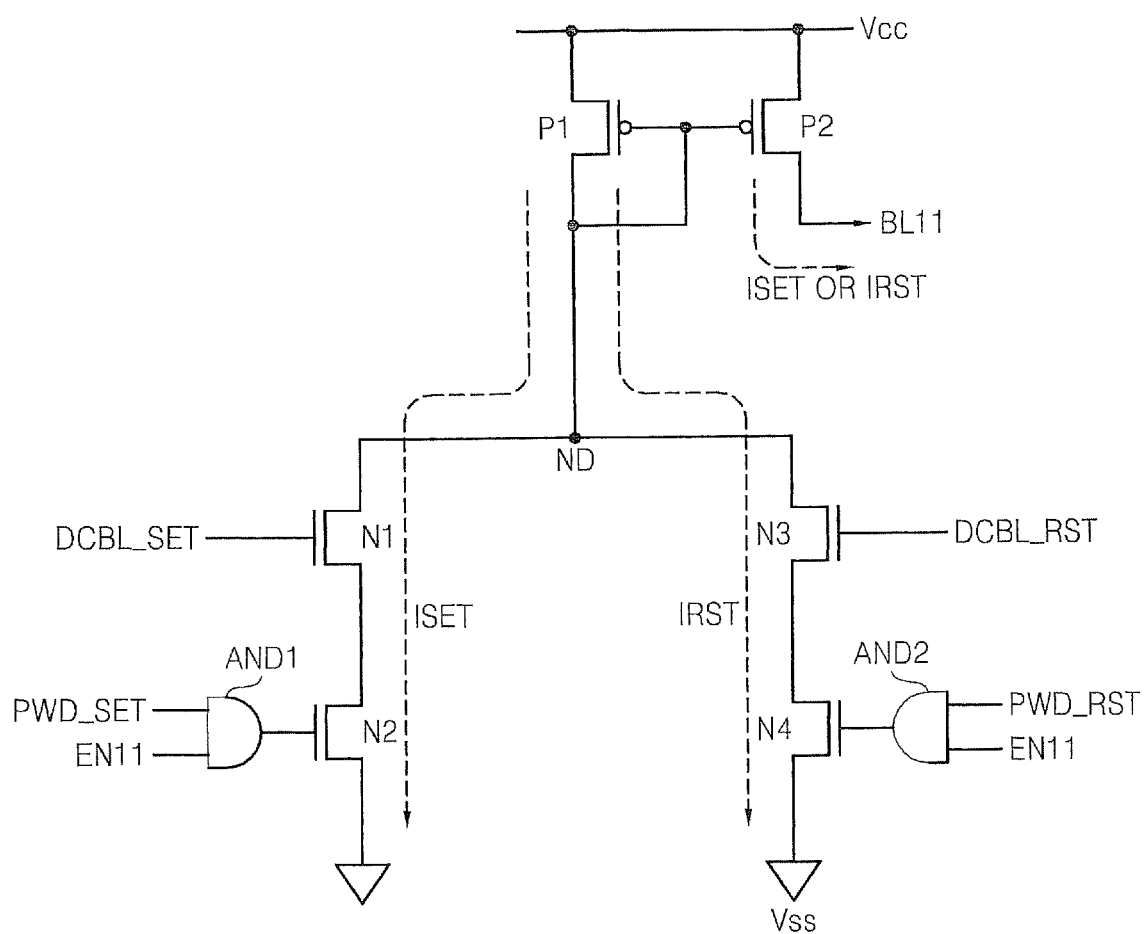
FIG. 7 shows an example embodiment of a circuit diagram of a write driver illustrated in FIG. 6.

The program pulse (PWD_SET or PWD_RST) includes a set pulse (PWD_SET) and a reset pulse (PWD_RST). The program current supplied to a non-volatile memory cell includes a set current ISET and a reset current IRST as illustrated in FIG. 7. The bias voltage (DCBL_SET or DCBL_RST) includes a set bias voltage DCBL_SET and a reset bias voltage DCBL_RST.

The set bias voltage DCBL_SET may control at least one of a level and a slope of the set current ISET. The reset bias voltage DCBL_RST may also control at least one of a level and a slope of the reset current IRST. Here, the slope includes at least one of rising time and falling time.

For example, the program pulse generator 26 during a set operation generates the set pulse PWD_SET and the set bias voltage DCBL_SET according to the selection signal SEL. Accordingly, when the set pulse PWD_SET, the set bias voltage DCBL_SET and an enable signal EN 11 are all at a high level, a write driver 40-11 illustrated in FIG. 7 may supply the set current ISET to the bit line BL11. However, the program pulse generator 26 during a reset operation generates the reset pulse PWD_RST and the rest bias voltage DCBL_RST according to the selection signal SEL. Accordingly, when the reset pulse PWD_RST, the reset bias voltage DCBL_RST and the enable signal EN11 are all at a high level, the write driver 40-11 illustrated in FIG. 7 may supply the reset current IRST to the bit line BL11.

A program pulse in the specification may include a program pulse (PWD_SET or PWD_RST) and a bias voltage (DCBL_SET or DCBL_RST).

The bit sequence controller 28 may output control signals necessary for performing a bit sequence loop scheme to the write circuit block 21. The bit sequence controller 28 may be varied adaptively according to the number of write driver to be operated simultaneously among a plurality of write drivers included in the write circuit block 22.

Figure 16:
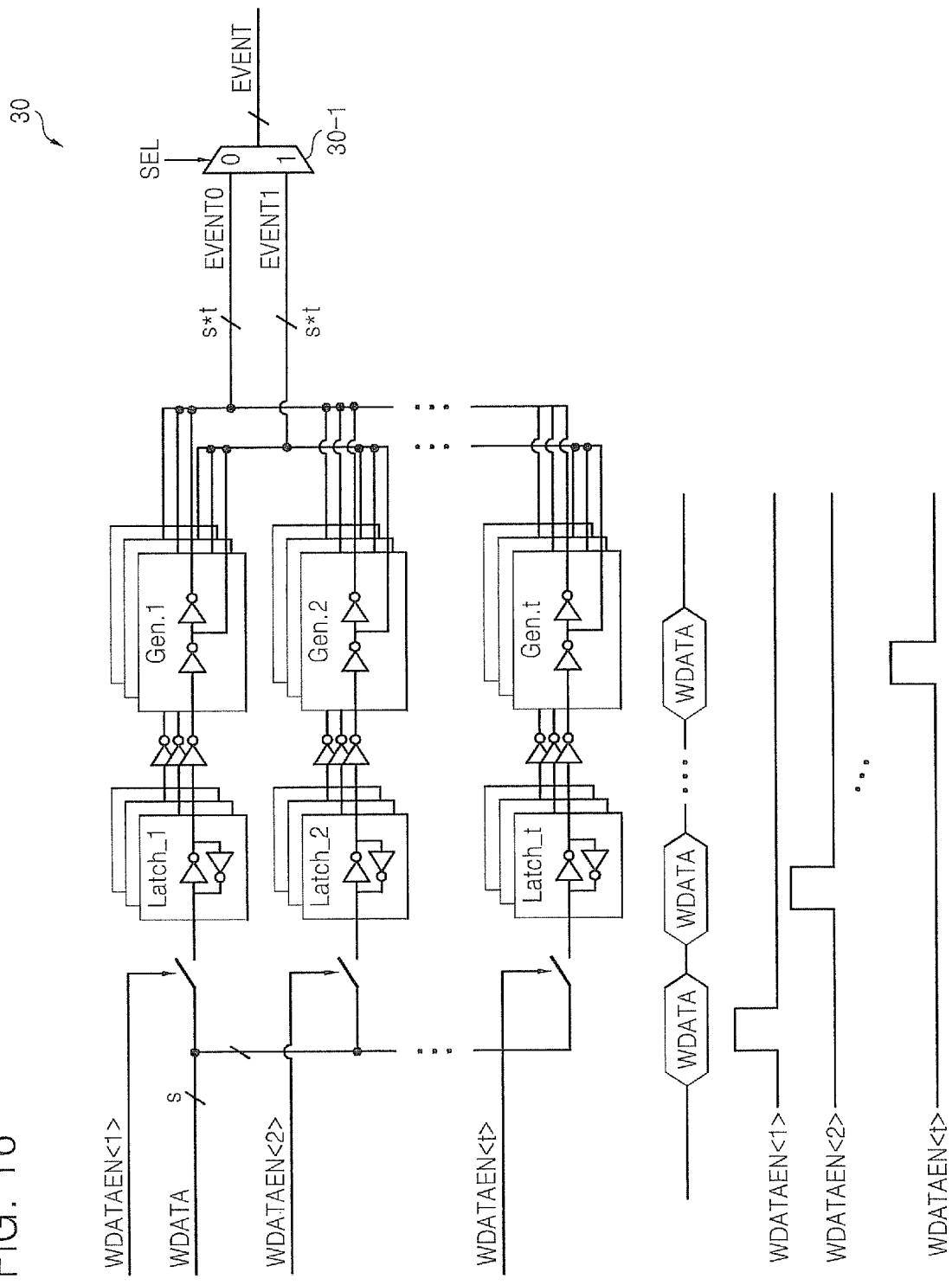
FIG. 16 shows an example embodiment of a circuit diagram of an event generator illustrated in FIG. 6.

The event generator 30 separates data '1' and data '0' which are included in a multi-bit program data WDATA as illustrated in FIG. 16 and outputs a generated event EVENT through an event bus 32.

For example, when the program data WDATA is '11000101', the event generator 30 illustrated in FIG. 16 may output a first event EVENT0 for programming data '1', i.e., '11000101' having the same phase as program data WDATA, as an event according to a selection signal SEL output from the controller 34. The event generator 30 may also output a second event for programming data '0', i.e., '00111010' having an opposite phase to a program data WDATA, as an event according to a selection signal SEL.

According to whether data '1' or data '0' included in a program data WDATA is programmed, the event generator 30 may output the first event EVENT0 or the second event EVENT1 as an event EVENT according to a selection signal SEL output from the controller 34.

The controller 34 may control a general operation of the memory device 10, e.g., a program operation or a write operation according to a bit sequence loop scheme. Accordingly, the controller 34 may control an operation of a row decoder & driver 14, a column decoder 20 and a program control block 21 according to a command input from outside of the memory device, i.e., a plurality of control signals CTR.

Figure 5:
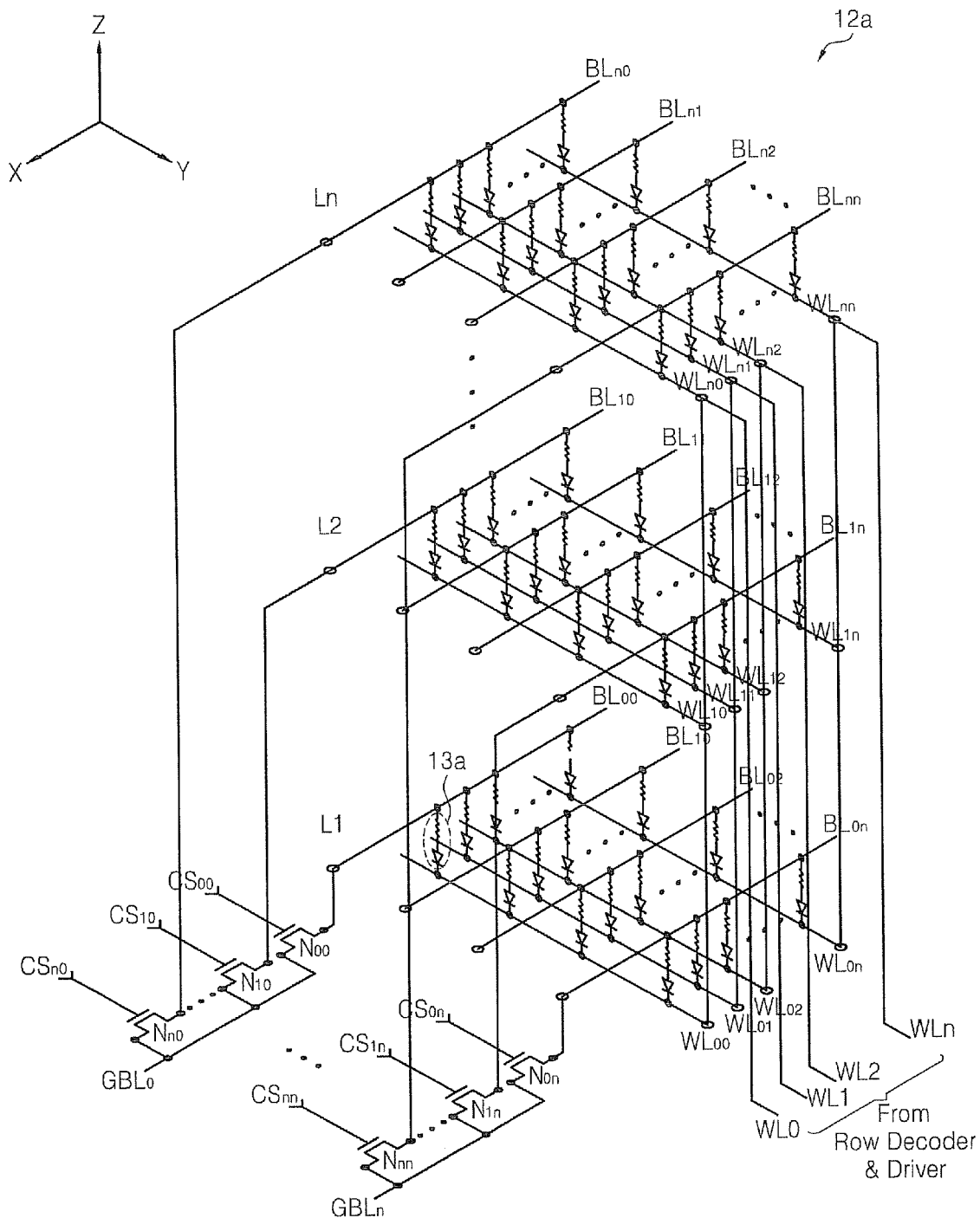
FIG. 5 shows a memory cell array illustrated in FIG. 1, which is three-dimensionally embodied.

FIG. 5 shows a memory cell array illustrated in FIG. 1, which is three-dimensionally embodied. Referring to FIGS. 1 and 5, the memory device 10 may include a memory cell array 12a embodied three-dimensionally. The memory cell array 12a includes a plurality of layers L1 to Ln. The plurality of layers L1 to Ln may be embodied as a wafer typed multi-layer, a chip typed multi-layer or a cell multi-layer. An electrical connection between each layer may use a through silicon via (TSV), a wire bonding or a bump.

On a first layer L1, a plurality of word lines $WL_{00}$ to $WL_{0n}$, a plurality of bit lines $BL_{00}$ to $BL_{0n}$ and a plurality of non-volatile memory cells 13 are embodied. The plurality of word lines $WL_{10}$ to $WL_{1n}$, a plurality of bit lines $BL_{10}$ to $BL_{1n}$ and a plurality of non-volatile memory cells are embodied on a second layer L2. On an $n^{th}$ layer Ln, a plurality of word lines $WL_{n0}$ to $WL_{nn}$, a plurality of bit lines $BL_{n0}$ to $BL_{nn}$ and a plurality of non-volatile memory cells are embodied.

As illustrated in FIG. 5, each word lines $WL_{00}$ to $WL_{0n}$ and $WL_{n0}$ to $WL_{nn}$ embodied on each layer L1 to Ln may be connected to each other. For example, as illustrated in FIGS. 1 and 5, each word line $WL_{00}$, $WL_{10}$, ..., $WL_{n0}$ may form a word line WL0 by being connected to each other and each word line $WL_{0n}$, $WL_{1n}$, ..., WLnn may form a word line WLn by being connected to each other. Accordingly, the row decoder and driver 14 may drive each word line WL0 to WLn selectively.

Each first bit line $BL_{00}$, $BL_{10}$, ..., $BL_{n0}$ embodied on each layer L1 to Ln may be connected to a first global bit line GBL0 through each first selection switch $N_{00}$, $N_{10}$, ..., $N_{n0}$. Each first selection switch $N_{00}$, $N_{10}$, ..., $N_{n0}$ may switch according to each selection signal $CS_{00}$, $CS_{10}$, ..., $CS_{n0}$ output from the column decoder 20. Each $N^{th}$ bit line BL0n, BL1n, ..., BLnn embodied on each layer L1 to Ln may be connected to a $N^{th}$ global bit line GBLn through a respective $n^{th}$ selection switch N0n, N1n, ..., Nnn. Each $n^{th}$ selection switch N0n, N1n, ..., Nnn may switch according to each selection signal CS0n, CS1n, ..., CSnn output from the column decoder 20. A global bit line GBL0 to GBLn may be connected to a write circuit block 22.

FIG. 6 shows a block diagram of a program control block illustrated in FIG. 1, which may perform a data process operation according to an example embodiment, and FIG. 7 shows an example embodiment of a write driver illustrated in FIG. 6. The program control block 21 illustrated in FIG. 6 has a structure for explaining a method of operating maximum T (T is integer, for example T=8) of a plurality of write drivers 40-11 to 40-ij included in the write circuit block 22 by using a program pulse.

The program current (ISET or IRST) output from an enabled write driver among a plurality of write drivers 40-11 to 40-ij is transmitted to a bit line selected among a plurality of bit lines BL11 to BLij through a turned-on selection switch among a plurality of selection switches 18-11 to 18-ij embodied in a selection circuit 16, so that the selection circuit is not illustrated from FIG. 6. The selected bit line may be one of a plurality of global bit lines or one of a plurality of local bit lines connected the one of the plurality of global bit lines. Each of plurality of global bit line selection switches connects each of the plurality of global bit lines and each of plurality of write drivers 40-11 to 40-ij in response to each of plurality of global bit line selection signals output from column decoder 20. Also, each of plurality of local bit line selection switches connects each of the plurality of global bit lines and each of plurality of local bit lines in response to each of plurality of local bit line selection signals output from column decoder 20.

In addition, programming a program bit in a memory cell means a program current output from a corresponding write driver is supplied as a phase change material of the memory cell through a corresponding selection switch and a corresponding bit line. The program bit to be explained below also means a bit having data '1' among a plurality of bits included in an event.

As illustrated in FIG. 1, the program control block 21 includes a plurality of write circuits 24-1 to 24-i. Each of the plurality of write circuits 24-1 to 24-i controls a program operation of each of a plurality of unit cell arrays MG1 to MGi.

Each of the plurality of write circuits (or tiles) 24-1 to 24-i includes a plurality of write drivers WD and a plurality of write driver controllers WDC. Each of the plurality of write driver controllers WDC controls an operation, e.g., enable or disable, of each of the plural write drivers WD. For example, the first write circuit 24-1 includes a plurality of write drivers 40-11 to 40-1j and a plurality of write driver controllers 42-11 to 42-1j. The $m^{th}$ write circuit 24-i includes a plurality of write drivers 40-i1 to 40-ij and a plurality of write driver controller 42-i1 to 42-ij.

As illustrated in FIG. 6, the number of write driver operating in each write circuit 24-1 to 24-i simultaneously is 1. Accordingly, when one of a plurality of write drivers 40-11 to 40-ij, included in the first write circuit, e.g., 24-1, operates, the rest write drivers do not operate. For example, whether or not the second write driver 40-12 in the first write circuit 24-1 operates is determined according to whether or not the first write driver 40-11 operates. In addition, a last write driver 40-1j of the first write circuit 24-1 operates is determined according to whether or not each of prior write drivers operates.

During a set operation, e.g., when data 0 is included in a program data WDATA, that is data '1' included in a second event EVENT1 is programmed, each write driver 40-11 to 40-ij may generate a sent current ISET according to a set pulse PWD_SET and a set bias voltage DECB_SET output from a program pulse generator 26 and a level of each enable signal EN11 to ENij output from each write driver controller 42-11 to 42-ij. During a reset operation, e.g., when data 1 is included in the program data WDATA, that is data '1' included in a first event EVENT0 is programmed, each write driver 40-11 to 40-ij may generate a reset current IRST according to a reset pulse PWD_RST and a reset bias voltage DECB_RST output from the program pulse generator 26 and a level of each enable signal EN11 to ENij output from each write driver controller 42-11 to 42-ij.

Referring to FIG. 7, the write driver 40-11 includes a current mirror, a set current generation circuit for generating a set current ISET and a reset current generation circuit for generating a reset current IRST.

The current mirror includes a first PMOS transistor P1 connected between a power Vcc and a node ND and a second PMOS transistor P2 connected between the power Vcc and a bit line BL11 (or selection switch 18-11).

The set current generation circuit includes NMOS transistors N1 and N2 connected in series between a node ND and a ground Vss, and an AND gate AND1. When a set bias voltage DCBL_SET, a set pulse PWD_SET and an enable signal EN11 are at a high level, a set current ISET generated by the set current generation circuit is supplied to a bit line BL11 through the current mirror. Accordingly, a phase change material GST of a non-volatile memory cell 13 connected to the bit line BL11 is supplied with the set current ISET, so that the phase change material GST may store data '0'.

The reset current generation circuit includes NMOS transistors N3 and N4 connected in series between a node ND and a ground Vss, and an AND gate AND2. When a reset bias voltage DCBL_RST, a reset pulse PWD_RST and an enable signal EN11 are at a high level, a rest current IRST generated by the reset current generation circuit is supplied to a bit line BL11 through the current mirror. Accordingly, a phase change material GST of a non-volatile memory cell 13 connected to the bit line BL11 receives the reset current IRST, so that the phase change material GST may store data '1'.

The bit sequence controller 28 illustrated in FIG. 6 is initialized in response to a power-up reset signal PWRST, and outputs an initial count bit (CNT_INT<3:0>), an initial comparison signal (STOP_INT) and an event load signal (EVNTLD<1>) in response to a count start signal CNTST output from the controller 34. Each of a plurality of write driver controllers 42-11 to 42-ij stores and counts each of a plurality of bits included in an event output from an event generator 30 in response to the event load signal EVNTLD<1>.

Figure 14:
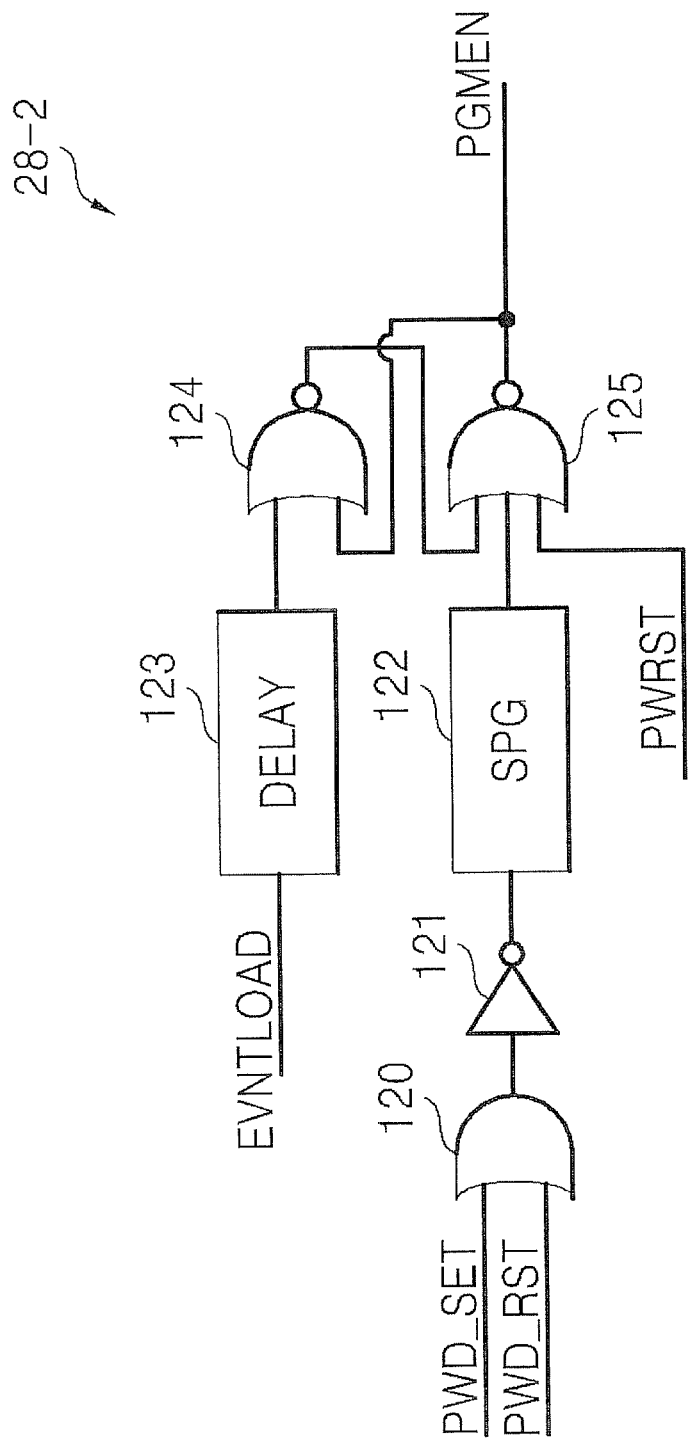
FIG. 14 shows an example embodiment of a circuit diagram of a program enable signal generator illustrated in FIG. 12.

Additionally, the bit sequence controller 28 generates a program enable signal PGMEN for controlling a program operation. As illustrated in FIG. 14, the program enable signal PGMEN becomes activated, e.g., a high level, after a predetermined time has passed since a fifth event load signal EVENLOAD was generated, and is inactivated after a program pulse PWD_SET or PWD_RST becomes inactivated, e.g., a low level. Accordingly, when the program enable signal PGMEN becomes activated, a program bit is programmed in a non-volatile memory cell.

The bit sequence controller 28 may generate a count termination signal CNT_CMP based on a last count bit CNTBIT_END<3:0> and a last comparison signal STCNT_END output from a last write driver controller 42-ij of a last write circuit 24-i. The controller 34 may control an operation of a program pulse generator 26 generating a program pulse according to a level of the count termination signal CNT_CMP.

The program pulse generator 26 may generate a program pulse PWD_SET or PWD_RST and a bias voltage DCBL_SET or DCBL_RST according to a clock signal CLK and a selection signal SEL output from the controller 34 in response to the count termination signal CNT_CMP.

As illustrated in FIG. 14, the program enable signal generator 28-2 activates or inactivates a program enable signal PGMEN according to a level of the program pulse PWD_SET or PWD_RST. The program control block 21 may perform a program operation according to an activated program enable signal PGMEN.

The count termination signal CNT_CMP is a signal indicating whether a current bit sequence loop is to be terminated or not. Accordingly, the controller 34 may terminate a current bit sequence loop in response to an activated count termination signal CNT_CMP, and control, when there's a next bit sequence loop, a start of the next bit sequence loop.

Figure 8:
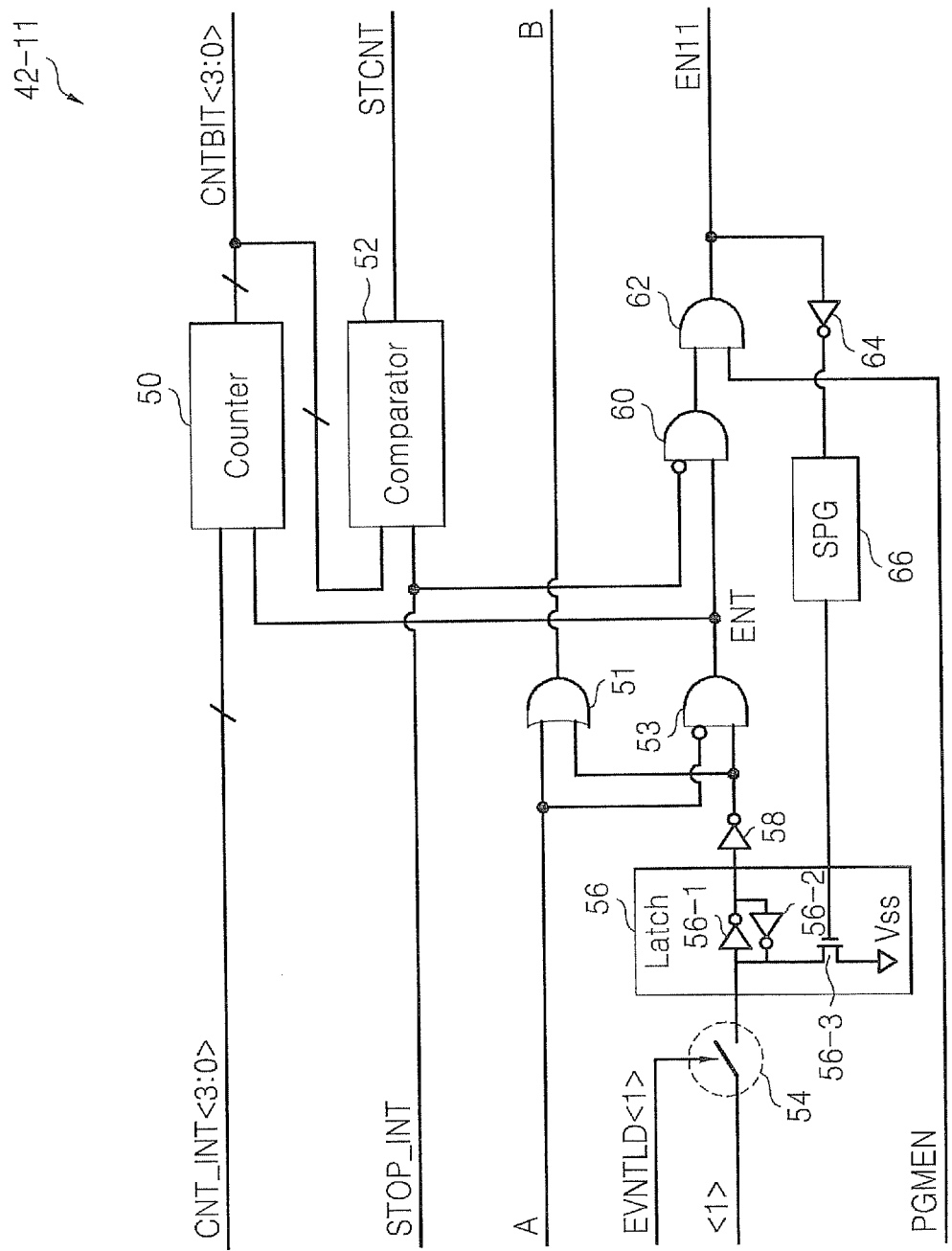
FIG. 8 shows a block diagram of write driver controllers illustrated in FIG. 6.

FIG. 8 shows a block diagram of write driver controllers illustrated in FIG. 6. Each structure of a plurality of write driver controllers 42-11 to 42-ij illustrated in FIG. 6 is substantially the same as a structure of a first write driver controller 42-11 illustrated in FIG. 8.

As illustrated in FIG. 6, each of a plurality of write driver controllers 42-11 to 42-1j embodied in the first write circuit 24-1 is connected to each other in series. Here, the terminal A of the first write driver controller 42-11 is connected to a ground and the terminal B of the last write driver controller 42-1j becomes floating.

Except for the first write driver controller 42-11 and the last write driver controller 42-1j, the terminal A of the current write driver controller is connected to the terminal B of the right previous write driver controller, and the terminal B of the current write driver controller is connected to the terminal A of the right next write driver controller.

Similarly, each of a plurality of write driver controllers 42-i1 to 42-ij embodied in an $m^{th}$ write circuit 24-i is connected to each other in series. The terminal A of the first write driver controller 42-i1 is connected to a ground and the terminal B of the last write driver controller 42-ij becomes floating. Except for the first write driver controller 42-i1 and the last write driver controller 42-ij, the terminal A of the current write driver controller is connected to the terminal B of the right previous write driver controller and the terminal B of the current write driver controller is connected to the terminal A of the right next write driver controller.

Referring to FIGS. 6 and 8, an operation of a write driver controller 42-11 is explained as follows. FIG. 8 illustrates a write driver controller 42-11 including a four-bit counter 50 and a four-bit comparator 52 for an ease of explanation, however, it is not more than an exemplification. It is assumed that an initial count bit (CNT_INT<3:0>) is '0000' and an initial comparison signal STOP_INT is '0'.

First of all, to explain a case when an event <1> is '0', when the event load signal EVENLD<1> is input to a switch 54 in a state where the terminal A is connected to a ground, the event<1>, i.e., '0', is transmitted to a latch 56. Since the output signal of the inverter 58 connected to the latch 56 is '0', an OR gate 51 outputs '0' to the terminal B. Here, since the NAND gate 53 outputs '0', the AND gate 60 outputs '0'. Accordingly, although the program enable signal PGMEN is at a high level, the AND gate 62 outputs the enable signal EN11 at a low level. Accordingly, the first write driver 40-11 illustrated in FIG. 7 becomes disabled.

Next, to explain a case when the event<1> is 1, when the event load signal EVENLD<1> is input to the switch 54 in a state where the terminal A is connected to the ground, the event<1>, i.e., '1', is transmitted to the latch 56. Since the output signal of the inverter 58 connected to the latch 56 is '1', the OR gate 51 outputs '1' to the terminal B. Here, the NAND gate 53 outputs '1', so that the AND gate 60 also outputs '1'. Accordingly, when the program enable signal PGMEN is at a high level, the AND gate 62 outputs an enable signal EN11 at a high level. Accordingly, the first write driver 40-11 may become enabled according to the program pulse PWD_SET or PWD_RST and the bias voltage DCBL_SET or DCBL_RST.

In case '1' or high level is input to the terminal A, the OR gate 51 outputs '1' or high level. Accordingly, the AND gate 53 outputs '0' or low level regardless of the output signal of the inverter 58, so that the enable signal EN11 is at a low level. Accordingly, as described above, only one write driver in each of write circuits 24-1 to 24-*i* illustrated in FIG. 6 becomes enabled.

Figure 9:
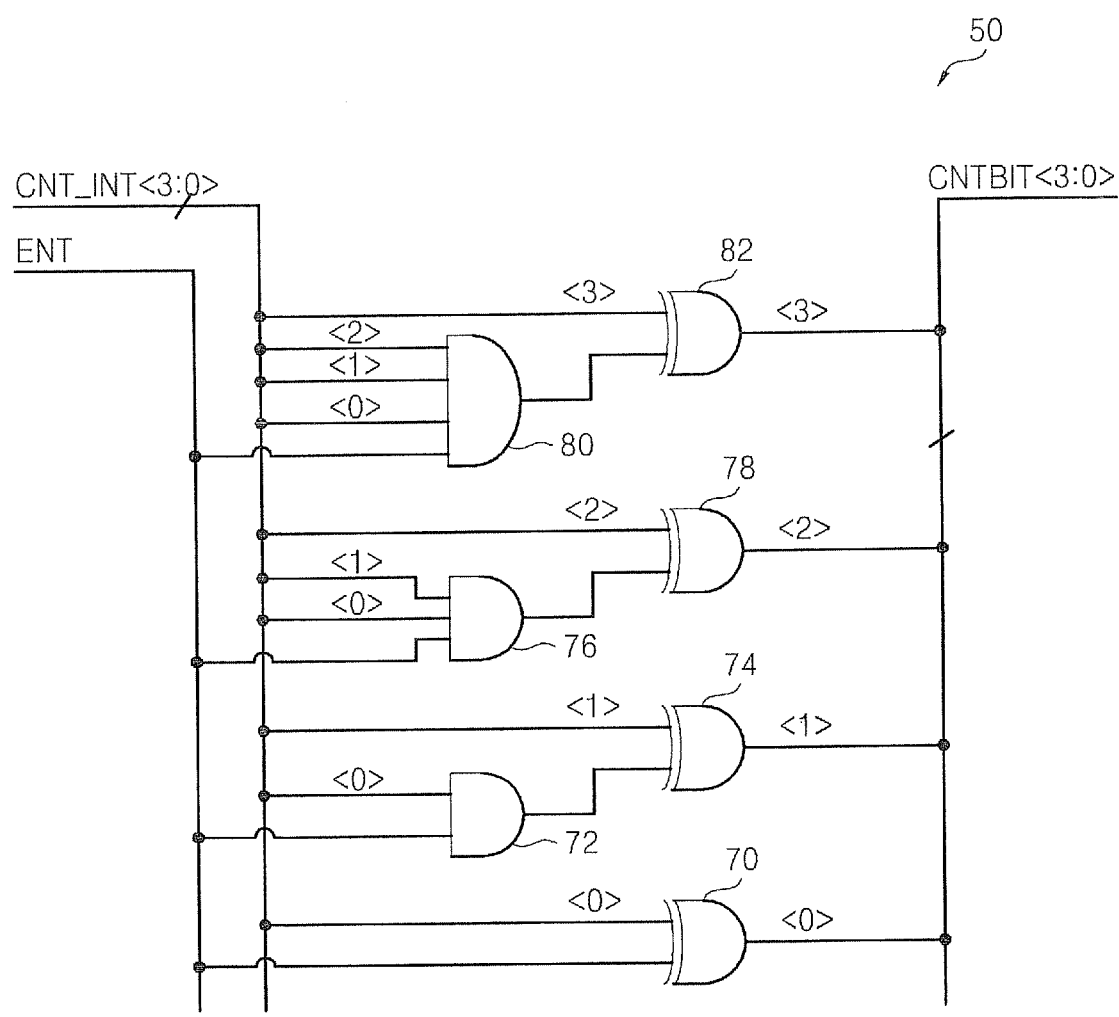
FIG. 9 shows an example embodiment of a circuit diagram of a counter illustrated in FIG. 8.

FIG. 9 shows an example embodiment of a circuit diagram of a counter illustrated in FIG. 8. As illustrated in FIG. 9, the counter 50 includes a plurality of AND gates 72, 76 and 80 and a plurality of exclusive-OR gates 70, 74, 48 and 82. Referring to FIGS. 6 and 9, a counter of a current write driver controller, except for a first write driver controller 42-11, receives a count bit output from a counter of a previous write driver controller. The comparator 50 of the first write driver controller 42-11 receives an initial count bit CNT_INT<3:0>, and a count bit output from a counter of a last write driver controller 42-*ij* is input to a bit sequence controller 28 as a last count bit CNTBIT_END<3:0>. When an output signal ENT of an AND gate 53 illustrated in FIG. 8 is '0', a counter 50 outputs an initial count bit (CNT_INT<3:0>=0000) as it is. However, when an output signal ENT of the AND gate 53 is '1', the counter 50 outputs a count bit (CNTBIT<3:0>=0001) which is increased by 1 from the initial count bit (CNT_INT<3:0>=0000). Therefore, although the number of program bits and the number of a plurality of write driver controllers included in the first write circuit 24-1 are the same, the last write driver controller 42-1*j* of the first write circuit 24-1 outputs '0001'. The counter 50 may be embodied as a ripple carry adder according to embodiments.

Figure 10:
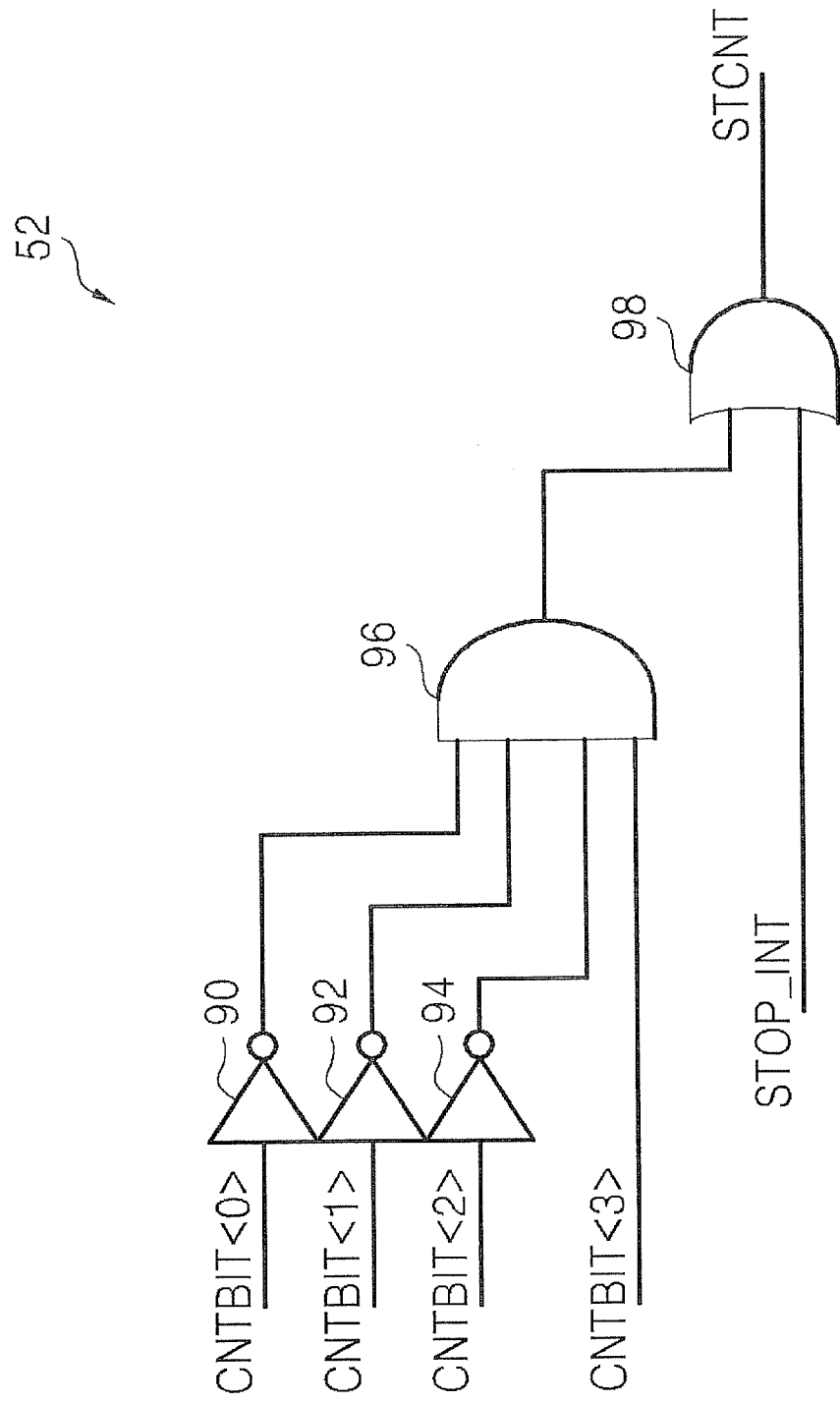
FIG. 10 shows an example embodiment of a circuit diagram of a comparator illustrated in FIG. 8.

FIG. 10 shows an example embodiment of a circuit diagram of a comparator illustrated in FIG. 8. Referring to FIG. 10, the comparator 52 includes a plurality of inverters 90, 92 and 94, an AND gate 96 and an OR gate 98.

As illustrated in FIG. 10, when the initial comparison signal STOP_INT is at a low level, the comparator 52 outputs a comparison signal STCNT at a low level until the count bit CNTBIT<3:0> becomes '1000'. Here, '1000' used as a reference count value means the maximum number of write drivers, which may operate simultaneously among a plurality of write drivers included in the write circuit block 22, is 8.

Accordingly, when 12 or 16 write drivers among the plurality of write drivers included in the write circuit block 22 operate at the same time, a reference count value may be set to '1100' or '10000'. Therefore, the program control block 21 of FIG. 1 may be varied adaptively according to the number of write drivers which may operate among a plurality of write drivers included in the write circuit block 22.

Referring to FIGS. 6, 8 and 10, except for the first write driver controller 42-11, the comparator of a current write driver controller receives a comparison signal output from a comparator of a previous write driver controller. The comparator 52 of the first write driver controller 42-11 receives an initial comparison signal STOP_INT, and a comparison signal output from a comparator of a last write driver controller 42-*ij* is input to a bit sequence controller 28 as a last comparison signal STCNT_END.

Figure 11:
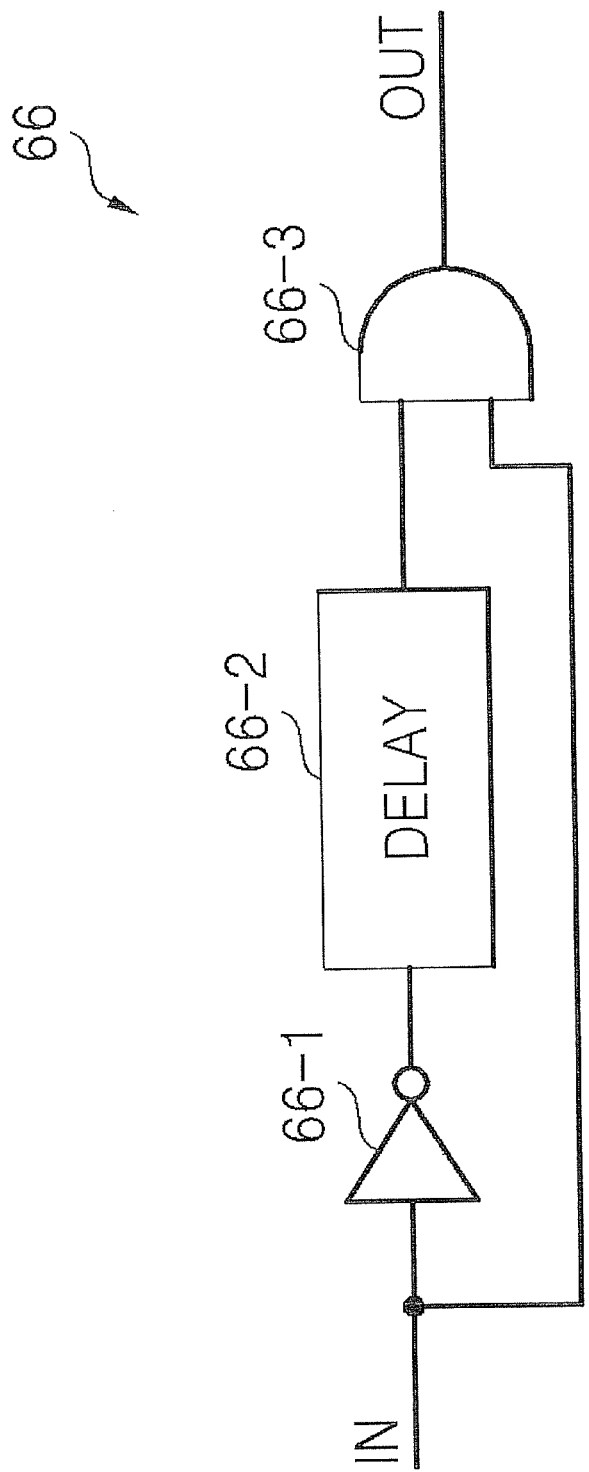
FIG. 11 shows an example embodiment of a circuit diagram of a short pulse generator illustrated in FIG. 8.

FIG. 11 shows an example embodiment of a circuit diagram of a short pulse generator illustrated in FIG. 8. As illustrated in FIG. 11, the short pulse generator 66 includes an inverter 66-1 for inverting an input signal IN, a delay element 66-2 for delaying an output signal of the inverter 66-1 for a predetermined time, and an AND gate 66-3. The AND gate 66-3 generates an output signal OUT by performing an AND operation on the input signal IN and the output signal of the delay element 66-2.

Referring to FIG. 8 again, the short pulse generator 66 generates a short pulse in response to an output signal of the inverter 64 inverting an enable signal EN11.

As illustrated in FIG. 8, the latch 56 includes two inverters 56-1 and 56-2 and the reset circuit 56-2. The reset circuit 56-2 initializes the input terminal of the latch 56 to a ground Vss according to the output signal of the short pulse generator 66. Accordingly, the enable control signal CEN11 has a low level. The reset circuit 56-2 may be embodied as a NMOS transistor. As described above, when the initial comparison signal STOP_INT is at a low level, '1' is input as an event<1> and a program enable signal PGMEN is at a high level, a write driver controller 42-11 outputs an enable signal EN11 having a high level.

Figure 12:
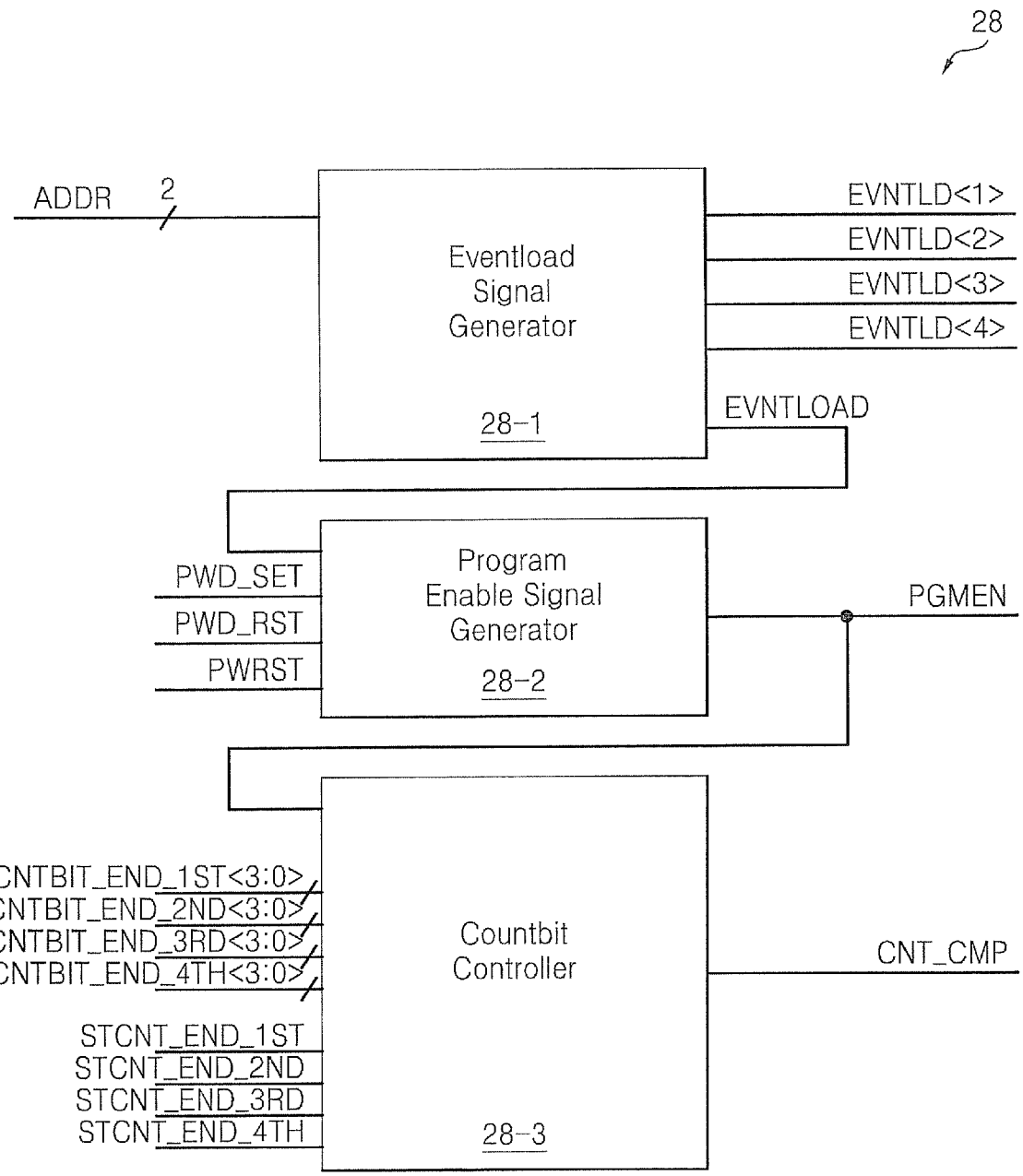
FIG. 12 shows a block diagram of a bit sequence controller illustrated in FIG. 6.
Figure 13:
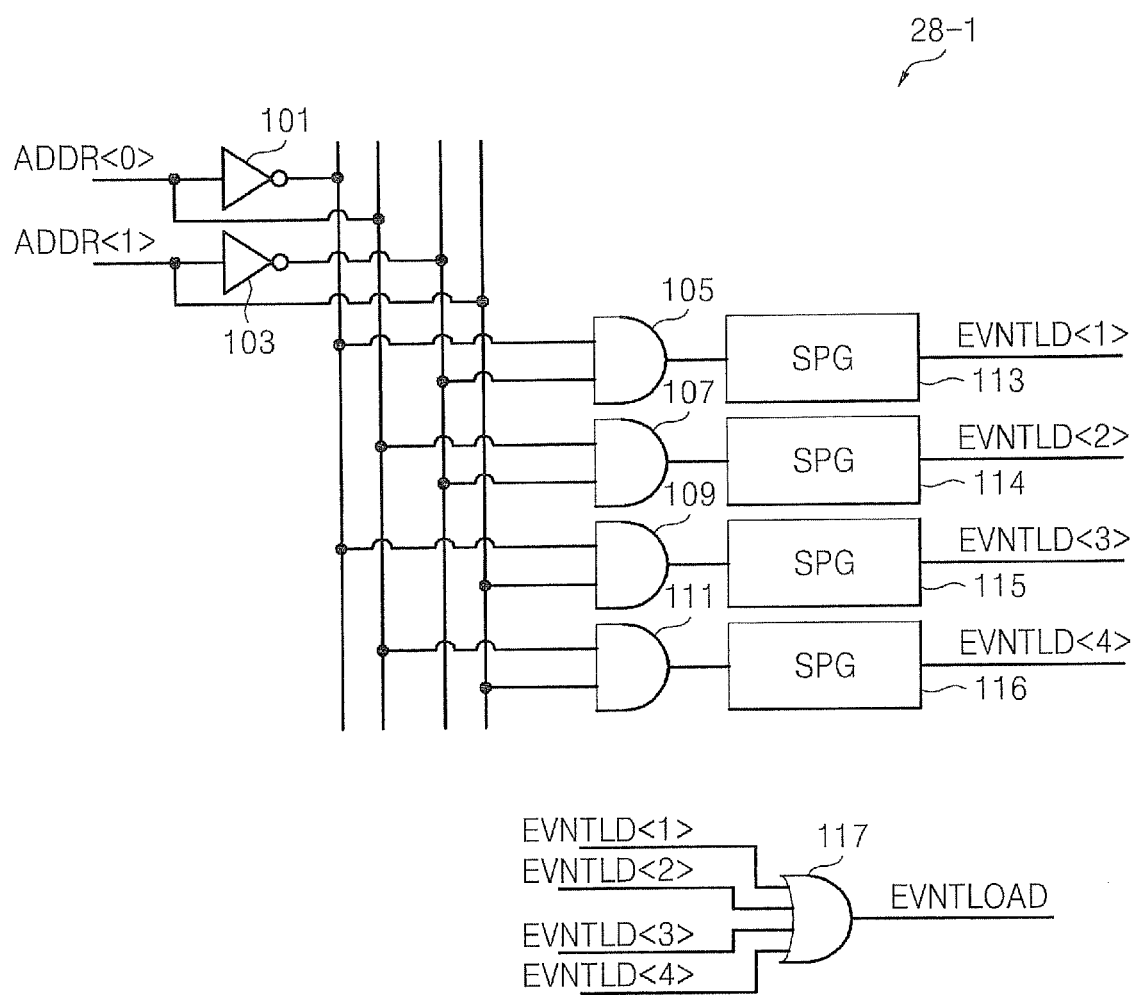
FIG. 13 shows an example embodiment of a circuit diagram of an event load signal generator illustrated in FIG. 12.

FIG. 12 shows a block diagram of a bit sequence controller illustrated in FIG. 6, FIG. 13 shows an example embodiment of a circuit diagram of an event load signal generator illustrated in FIG. 12, and FIG. 14 shows an example embodiment of a circuit diagram of a program enable signal generator illustrated in FIG. 12. Referring to FIG. 12, the bit sequence controller 28 includes an event load signal generator 28-1, a program enable signal generator 28-2 and a count bit controller 28-3.

The event load signal generator 28-1 generates a plurality of event load signals EVNTD<1> to EVNTD<4> according to a plurality of selection addresses ADDR. Each of a plurality of bit sequence loops may be selected based on a result of decoding the plurality of selection addresses ADDR.

For a convenience of explanation, FIGS. 12 and 13 illustrate the event load signal generator 28-1 generating $2^2(=4)$ event load signals EVNTLD<1> to EVNTLD<4> based on 2-bit selection addresses ADDR. The event load signal generator 28-1 generates $2^2$ event load signals EVNTLD<1> to EVNTLD<4> which may select one of four bit sequence loops.

Referring to FIG. 13, the event load signal generator 28-1 includes a plurality of inverters 101 and 103, a plurality of AND gates 105, 107, 109 and 111, and a plurality of short pulse generators 113 to 116.

The AND gate 105 perform an AND operation on an output signal of the inverter 101 and an output signal on the inverter 103. The AND gate 107 performs an AND operation on a first bit ADDR<0> among two-bit selection addresses ADDR and an output signal of the inverter 103. The AND gate 109 performs an AND operation on an output signal of the inverter 101 and a second bit ADDR<1> among the two-bit selection addresses ADDR. The AND gate 111 performs an AND operation on a first bit ADDR<0> and a second bit ADDR<1>.

Each circuit of the plurality of short pulse generators 113 to 116 is substantially the same as a circuit of the short pulse generator 66 illustrated in FIG. 11. Each of the plurality of short pulse generators 113 to 116 generates each of a plurality of event load signals EVNTLD<1> to EVNTLD<4> based on each output signal of the plurality of AND gates 105, 107, 109 and 111.

For example, as illustrated in FIG. 8, a first event load signal EVNTLD<1> is a switching signal used for transmitting an event<1> from a first bit sequence loop to the latch 56, and a fourth event load signal EVNTLD<4> is a switching signal for transmitting an event from a fourth bit sequence loop to the latch. An OR gate 117 performs an OR operation on event load signals EVNTLD<1> to EVNTLD<4> and outputs a fifth event load signal EVNTLOAD to the program enable signal generator 28-2.

Referring to FIG. 14, the program enable signal generator 28-2 generates a program enable signal PGMEN activated or inactivated according to the fifth event load signal EVNTLOAD, a set pulse PWD_SET, a reset pulse PWD_RST and a power-up reset signal PWRST.

Referring to FIG. 14, the program enable signal generator 28-2 includes an OR gate 120 for performing an OR operation on the set pulse PWD_SET and the reset pulse PWD_RST, the inverter 121 for inverting the output signal of the OR gate 120, the short pulse generator 122 for generating a short pulse based on the output signal of the inverter 121, the delay element 123 for delaying the fifth event load signal EVNT-LOAD, the NOR gate 124 for performing a NOR operation on the output signal of the delay element 123 and the output signal PGMEN of the NOR gate 124, and the NOR gate 125 for performing a NOR operation on the output signal of the short pulse generator, the output signal of the NOR gate 124 and the power-up reset signal PWRST. The structure of the short pulse generator 122 is substantially the same as one of the short pulse generator 66 illustrated in FIG. 11.

The NOR gate 125 generates the program enable signal PGMEN. For example, the program enable signal PGMEN may be activated a predetermined time after the fifth event load signal EVNTLOAD is activated, and be inactivated when the program pulse PWD_SET or PWD_RST is inactivated.

Figure 15:
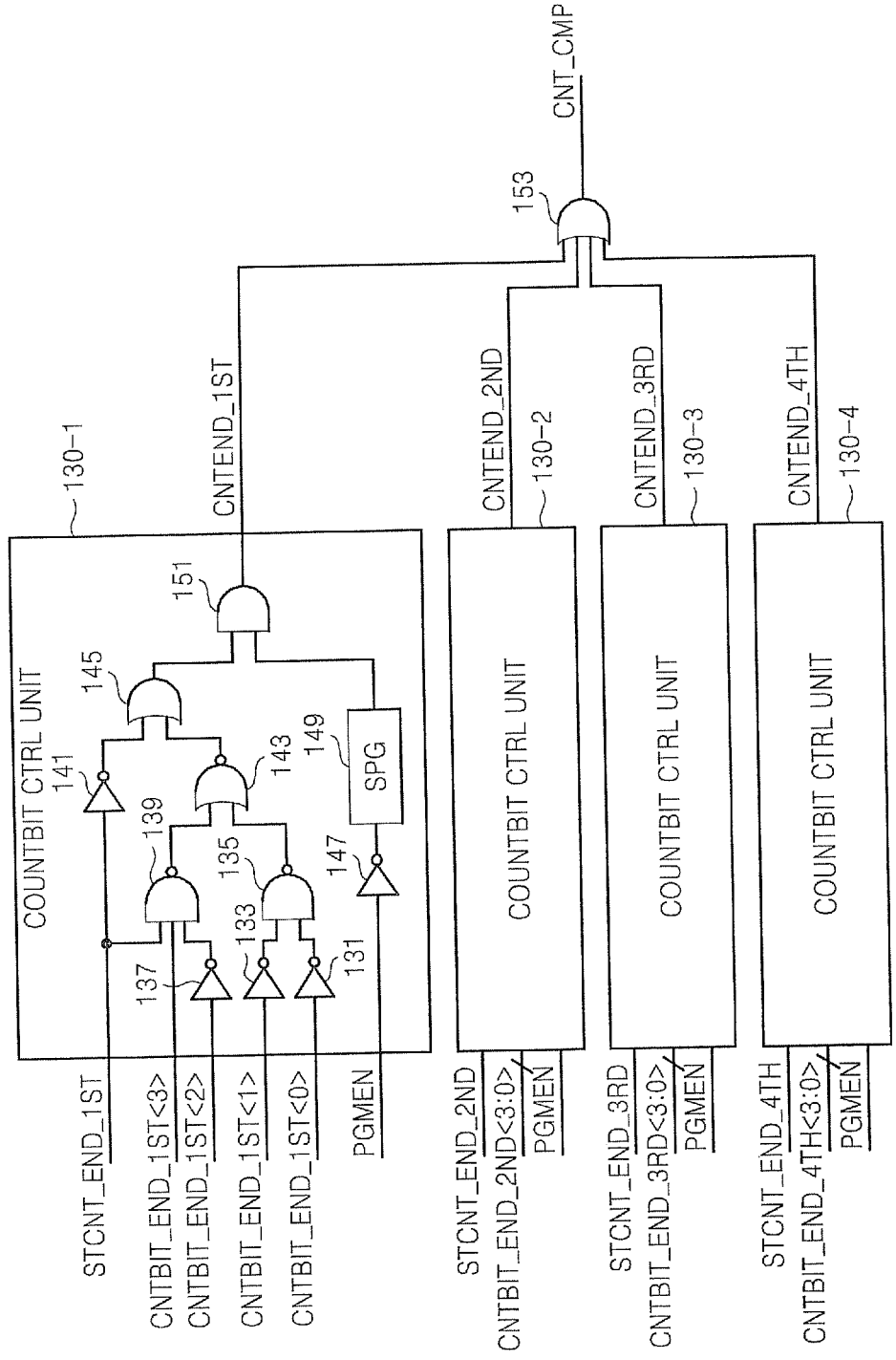
FIG. 15 shows an example embodiment of a circuit diagram of a count bit controller illustrated in FIG. 12.

FIG. 15 shows an example embodiment of a circuit diagram of a count bit controller illustrated in FIG. 12. The count bit controller 28-3 illustrated in FIG. 15 shows an example embodiment when the number of bit sequence loops is 4. As the number of bit sequence loops increases, the number of count bit control units also increases.

The count bit controller 28-3 includes four count bit control units 130-1 to 130-4. Each structure of the four count bit control units 130-1 to 130-4 is substantially the same each other.

The first count bit control unit 130-1 generates a first termination indication signal CNTEND_1ST indicating whether a first bit sequence loop is terminated according to a last count bit CNTBIT_END_1ST<3:0> output from a count of a last write driver controller performing a first bit sequence loop, a last comparison signal STCNT_END_1ST output from a comparator of the last write driver controller, and a program enable signal PGMEN.

The second count bit control unit 130-2 generates a second termination indication signal CNTEND_2ND indicating whether a second bit sequence loop is terminated according to a last count bit CNTBIT_END_2ND<3:0> output from a count of a last write driver controller performing a second bit sequence loop, a last comparison signal STCNT_END_2ND output from a comparator of the last write driver controller, and the program enable signal PGMEN.

The third count bit control unit 130-3 generates a third termination indication signal CNTEND_3RD indicating whether a third bit sequence loop is terminated according to a last count bit CNTBIT_END_3RD<3:0> output from a count of a last write driver controller performing a third bit sequence loop, a last comparison signal STCNT_END_3RD output from a comparator of the last write driver controller, and the program enable signal PGMEN.

The fourth count bit control unit 130-4 generates a fourth termination indication signal CNTEND_4TH indicating whether a fourth bit sequence loop is terminated according to a last count bit CNTBIT_END_4TH<3:0> output from a last write driver controller performing a fourth bit sequence loop, a last comparison signal STCNT_END_4TH output from a comparator of the last write driver controller, and the program enable signal PGMEN.

The OR gate 153 of the count bit controller 28 performs an OR operation on each termination indication signal CNTEND_1ST to CNTEND_4TH output from each count bit control unit 130-1 to 130-4 and outputs the count termination signal CNT_CMP to the controller 34. Accordingly, the controller 34 may control a generation of a program pulse or a start of a new bit sequence loop based on a level of the count termination signal CNT_CMP.

The first count bit control unit 130-1 includes a plurality of inverters 131, 133, 137, 141 and 147, a plurality of NAND gates 135 and 139, a NOR gate 143, an OR gate 145, a short pulse generator 149 and an AND gate 151. The NAND gate 135 performs a NAND operation on output signals of two inverters 131 and 133, and the NAND gate 139 performs a NAND operation on an output signal of the inverter 137, a CNTBIT_END_1ST<3>, and a STCNT_END_1ST.

The NOR gate 143 performs a NOR operation on an output signal of the NAND gate 135 and an output signal of the NAND gate 139. The OR gate 145 performs an OR operation on an output signal of the inverter 141 and an output signal of the NOR gate 143. The short pulse generator 149 generates a short pulse based on an output signal of the inverter 147. The AND gate 151 performs an AND operation on an output signal of the OR gate 145 and an output signal of the short pulse generator 149, and outputs a first termination indication signal CNTEND_1ST. The structure of the short pulse generator 149 is substantially the same as a structure of the short pulse generator 66 illustrated in FIG. 11.

The operation of the first count bit control unit 130-1 is explained as follows. When a last count bit (CNTBIT_END_1ST<3:0>) is less than a reference count value, e.g., 1000, that is, a number of write drivers which may be driven simultaneously is less than a reference count value (e.g., a number of write drivers driven at maximum according to a program pulse), a last comparison signal STCNT_END_$1^{ST}$, which is output from a comparator embodied in a last write driver controller of a bit sequence loop in progress, is in a low level, so that an inverter 141 may output a signal having a high level. Accordingly, an OR gate 145 outputs a signal having a high level according to an output signal of the inverter 141 having a high level. Here, when a short pulse having a high level is output from a short pulse generator 149, the AND gate 151 generates a count termination signal CNT_CMP having a high level. Therefore, a control logic 34 may terminate a first bit sequence loop according to a count termination signal CNT_CMP having a high level.

In addition, when a last count bit (CNTBIT_END_1ST<3:0>) is equal to a reference count value, e.g., 1000, a last comparison signal STCNT_END_$1^{st}$ is in a high level, so that the inverter 141 outputs a signal having a low level. Since a NOR gate 143 outputs a signal having a high level, the OR gate 145 outputs a signal having a high level. Here, when a short pulse having a high level is output from the short pulse generator 149, the AND gate 151 generates a count termination signal CNT_CMP having a high level. Therefore, the control logic 34 may terminate a first bit sequence loop according to a count termination signal CNT_CMP having a high level.

However, when the last count bit (CNTBIT_END_1ST<3:0>) is greater than a reference count value, e.g., 1000, a last comparison signal (STCNT_END_1ST) is at a high level, so that the inverter 141 outputs a signal having a low level and the NOR gate 143 outputs a signal having a low level. Accordingly, the OR gate 145 outputs a signal having a low level. Here, when a short pulse having a high level is output from the short pulse generator 149, the AND gate 151 generates a count termination signal CNT_CMP having a low level. Accordingly, the control logic 34 recognizes there are remaining program bits and controls an operation of the program pulse generator 26 in order that a next program pulse may be generated according to a count termination signal CNT_CMP having a low level. Accordingly, the first bit sequence loop is continuously performed.

FIG. 16 shows an example embodiment of a circuit diagram of the event generator illustrated in FIG. 6. Referring to FIGS. 1, 6 and 16, the event generator 30 may output a first event EVENT0 or a second event EVENT1 as an event EVENT according to whether data '1' or data '0' included in a program data WDATA is performed.

That is, the event generator 30 may output one of the first event EVENT0 having a same phase as the program data WDATA and the second event EVENT1 having an opposite phase to the program data WDATA as an event EVENT. The event generator 30 latches the program data WDATA to a corresponding one of a plurality of latch circuits Latch_1 to Latch_t in response to each of a plurality of writ enable signal WDATAEN<1> to WDATAEN<t> output from the controller 34. Each generator Gen.1 to Gen.t outputs a signal having the same phase as an output signal of each inverter and a signal having an opposite phase to an output signal of each inverter.

The selection circuit 30-1 outputs the first event EVENT0 or the second event EVENT1 as an event EVENT according to the selection signal SEL output from the controller 34.

As illustrated in FIG. 16, when the number of write enable signals WDATAEN<1> to WDATAEN<t> is t and a program data WDATA is s-bits, the number of event which may be generated by the event generator 30 is totally (t*s). Here, t and S are natural numbers.

For example, when the width of the event bus 32 is different from the number of event, the event generator 30 may output the event successively to the event bus 32 in response to each of a plurality of write enable signals WDATAEN<1> to WDATAEN<t> output from the controller 34.

FIG. 17 shows an example of a diagram for explaining a data process method of a memory device including the program control block illustrated in FIG. 6. FIG. 17 is a drawing for explaining a scheme, which operates only a write driver WD in every write circuit 24-1 to 24-i, in a single bit sequence loop scheme.

Referring to FIGS. 1, 6, 7 and 17, a write circuit block 22 may includes 12 write circuits 24-1 to 24-12. Each of the 12 write circuits 24-1 to 24-12 may control a program operation of a respective one of a plurality of cell arrays MG1 to MG12 and include a plurality of write drivers WD and a plurality of write driver controllers WDC. It is assumed that a reference count value, e.g., the number of bits programmed simultaneously by a write circuit block 22 or the number of write drivers operating according to a program pulse, is 12 (i.e., one bit by each write circuit 24-1 to 24-12 at the same time) and a program bit during an event is data '1'.

Accordingly, the program control block 21 as illustrated in FIG. 17 skips the program on data '0' included in an event EVENT.

As illustrated in FIG. 17, in each event status or remain event, '■' means the program bit among event, i.e., data '1' or an enabled write driver, '□' means data to be skipped among event, i.e., data '0' or a disabled write driver. For the purposes of providing an example discussion only, the input date for the first, second, eleventh and twelfth write circuit 24-1, 24-2, 24-11 and 24-12 will be described. As illustrated in FIG. 17, when '100011' is input to the first write circuit 24-1 as an event, program bits assigned in the first write circuit 24-1 are a first bit, a fifth bit and a sixth bit. Also, in this example, each bit corresponds to a different column of the respective cell array MG. When '011100' is input to the second write circuit 24-2 as an event, program bits assigned in the second write circuit 24-2 are from a second bit to a fourth bit.

When '010110' is input to an eleventh write circuit 24-11 as an event, program bits assigned in the eleventh write circuit 24-11 are second bit, a fourth bit and a fifth bit. When '101001' is input to a twelfth write circuit 24-12 as an event, program bits assigned in the twelfth write circuit 24-12 are a first bit, a third bit and a sixth bit.

Since only one of a plurality of write drivers WD included in each write circuit 24-1 to 24-12 operates, similar to an operation of a first count bit control unit 130-1 explained referring to FIG. 15, a last count bit (e.g., a decimal number of 37, which equals the total number of program bits for the write circuits 24-1 to 24-12), is greater than a reference count value (e.g., a decimal number of 12, which equals the number of program bits that can be simultaneously written), so that a last comparison signal output from a comparator included in a twelfth write circuit 24-12 is in a high level and a count bit controller 28-3 outputs a count termination signal CNT_CMP having a low level. Each write circuit 24-1 to 24-12 programs a first program bit in each unit cell array MG1 to MG12 according to a first program pulse 1st PGM pulse, e.g., a reset pulse PWD_RST and a reset bias voltage DCBL_RST. Accordingly, 12 of the 37 program bits are programmed simultaneously by the first program pulse 1st PGM Pulse.

After the program operation is terminated by the first program pulse 1st PGM Pulse, each write circuit 24-1 to 24-12 resets a first program bit programmed by the first program pulse 1st PGM Pulse as explained referring to FIG. 8. For example, after a program operation is terminated by the first program pulse 1st PGM Pulse, events latched to the first write circuit 24-1 are varied from '100011' to '000011', events latched to the second write circuit 24-2 are varied from '011100' to '001100', events latched to the eleventh circuit 24-11 are varied from '010110' to '000110', and events latched to the twelfth write circuit 24-12 are varied from '101001' to '001001'.

After the program operation is terminated by the first program pulse 1st PGM Pulse, a last count bit, e.g., a decimal number of 25, is greater than a reference count value, e.g., a decimal number of 12, so that a count terminal signal (CNT_CMP) is in low level. After the program operation is terminated by the first program pulse 1st PGM Pulse, each write circuit 24-1 to 24-12 programs a first valid program bit, i.e., an originally second program bit, in each unit cell array MG1 to MG12 according to a second program pulse 2nd PGM Pulse, e.g., the reset pulse PWD_RST and the reset bias voltage DCBL_RST. Accordingly, in the example of FIG. 17, 12 of the remaining 25 program bits are programmed simultaneously by the second program pulse 2 ns PGM Pulse.

After the program operation is terminated by the second program pulse 2nd PGM Pulse, each write circuit 24-1 to 24-12 resets the first valid program bit programmed by the second program pulse 2nd PGM Pulse. For example, after the program operation is terminated by the second program pulse 2nd PGM Pulse, events stored in the first write circuit 24-1 are varied from '000011' to '000001', events stored in the second write circuit 24-2 are varied from '001100' to '000100', events stored in the eleventh write circuit 24-11 are varied from '000110' to '000010' and events stored in the twelfth write circuit 24-12 are varied from '001001' to '000001'.

After the program operation is terminated by the second program pulse 2nd PGM Pulse, a last count bit, e.g., a decimal number of 13, is greater than a reference count value, e.g., a decimal number of 12, so that a count terminal signal (CNT_CMP) is in low level. After the program operation is terminated by the first program pulse 1st PGM Pulse, each write circuit except for the fourth write circuit 24-4 programs a first valid program bit, i.e., an originally third program bit, in each unit cell array MG1, MG2, MG3 and MG5 to MG12 based on the third program pulse 3rd PGM Pulse. Accordingly, 11 of 13 program bits are programmed at the same time by the third program pulse 3rd PGM Pulse.

After the program operation is terminated by the third program pulse 3rd PGM Pulse, each write circuit 24-1, 24-2, 24-3 and 34-5 to 24-12 resets the first valid program bit programmed by the third program pulse 3rd PGM Pulse. After the program operation is terminated by the third program pulse $3^{rd}$ PGM Pulse, a last count bit, e.g., a decimal number of 2, is less than a reference count value, e.g., a decimal number of 12, so that a count terminal signal (CNT_CMP) is in high level. Each write circuit G3 and 24-10 programs a first valid program bit, i.e., an originally fourth program bit, in each unit cell array MG3 and MG10 according to a fourth program pulse 4th PGM Pulse. Accordingly, two of two program bits are programmed simultaneously by the fourth program pulse 4th PGM Pulse.

The controller 34 terminates a current bit sequence according to the count termination signal CNT_CMP having a high level.

As described above, a program control block 21 programs one of at least a program bit, which is allocated in each of unit cell arrays MG1 to MG12, or MG3 and MG10 of a first group among a plurality of unit cell arrays MG1 to MG12, in each corresponding memory cell among a plurality of memory cells in each of the unit cell arrays MG1 to MG12, or MG3 and MG10 of the first group simultaneously by using a program pulse (1st PGM Pulse or 4th PGM Pulse). The program control block 21 may select unit cell arrays as many as a number corresponding to a count value, (e.g., 12 or 2 in the example of FIG. 17), among a plurality of unit cell arrays MG1 to MG12 as unit cell arrays of the first group when a count value, (e.g., a decimal number of 12 or 2 in the example of FIG. 17), counting a number of an available first bit included in at least each program bit allocated in each of a plurality of unit cell arrays MG1 to MG12 is equal to or smaller than a reference count value, e.g., a decimal number of 12.

In a program operation, a first valid program bit among program bits assigned (or allocated) in each write circuit 24-1 to 24-12 may be programmed in each unit cell array according to a corresponding program pulse during a program operation.

Figure 18:
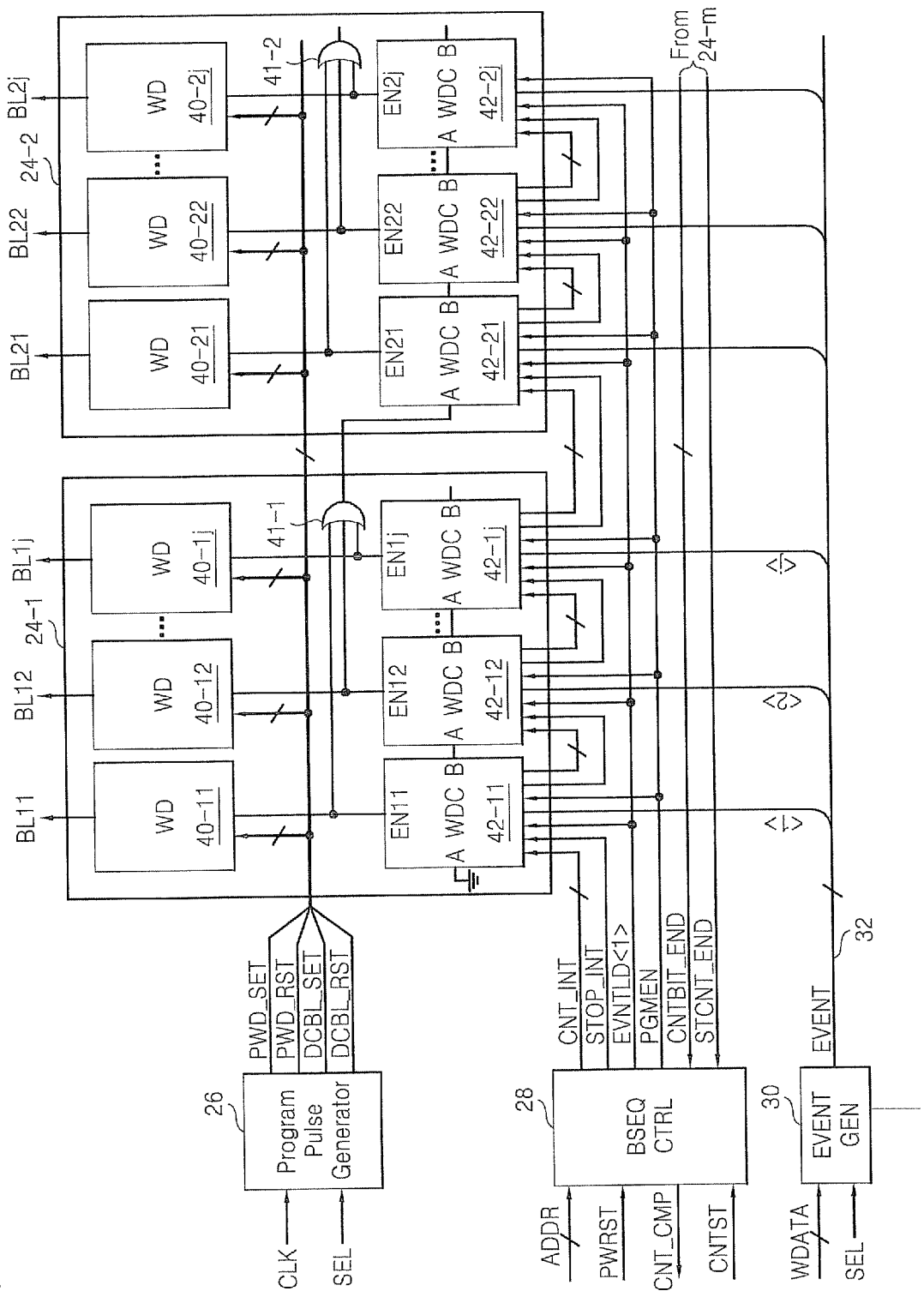
FIG. 18 shows a block diagram of a program control block illustrated in FIG. 1, which may perform a data process operation according to another example embodiment.

FIG. 18 shows a block diagram of a program control block illustrated in FIG. 1, which may perform a data process operation according to another example. The program control block illustrated in FIG. 18 may enable only one write driver in every two write circuit. That is, when one of a plurality of write drivers included in two write circuits becomes enabled, all of the rest write drivers become disabled.

Referring to FIGS. 1 and 18, each of the plurality of write circuits 24-1 to 24-i included in the write circuit block 22 further includes an OR gate. For an ease of explanation, FIG. 18 illustrates the first write circuit 24-1 and the second write circuit 24-2. In case one of a plurality of write drivers included in the first write circuit 24-1 becomes enabled, not only the rest of the write drivers among the plurality of write drivers, include in the first write circuit 24-1, but also all of a plurality of write drivers included in the second write circuit 24-2 become disabled.

However, when any one of a plurality of write drivers 40-11 to 40-1j included in a first write circuit 24-1 is not enabled and one of a plurality of write drivers 4-21 to 40-2j included in a second write circuit 24-2 is enabled, not only the other write drivers of the plurality of write drivers 40-21 to 40-2j included in the second write circuit 24-2 but also a plurality of write drivers included in a third write circuit 24-3 become all disabled.

Referring to FIG. 18, the output signal of an OR gate 41-1 included in the first write circuit 24-1 is input to the terminal A of the first write driver controller 42-21 of the second write circuit 24-2, and the output signal of an OR gate 41-2 included in the second write circuit 24-2 is input to the terminal A of the first write driver controller of the third write circuit. Except for such connections, the structure of the program control block of FIG. 6 is substantially the same as one of a program control block of FIG. 18.

FIG. 19 shows an example of a diagram for explaining a data process method of a memory device including the program control block illustrated in FIG. 18 assuming twelve write circuits 24-1 to 24-12. Referring to FIGS. 1 to 16, 18 and 19, the first write circuit 24-1 latches '100011' as an event assigned in the first write circuit 24-1, and a second write circuit 24-2 latches '011100' as an event assigned in the second write circuit 24-2. Again, in this example, each bit corresponds to a different column in the associated cell array MG.

When the enable signal having a high level is output from one of a plurality of write driver controller 41-11 to 41-1j included in the first write circuit 24-1, the signal having a high level is input to the terminal A of the first write driver controller 42-21 in the second write circuit 24-2. Accordingly, each of a plurality of write driver controllers 42-11 to 42-2j included in the second write circuit 24-2 outputs an enable signal EN21 to EN2j having a low level, so that each write driver 40-21 to 40-2j becomes disabled as illustrated in FIG. 7.

In the same way, the program control block 21 operates selectively only one of a plurality of write drivers 40-11 to 40-1j and 40-21 to 40-2j included in two write circuit blocks 24-1 and 24-2, so that the first write driver 42-11 of the first write circuit 24-1 supplies a reset current IRST to a corresponding bit line BL11 according to the first program pulse 1st PGM Pulse, e.g., the reset pulse PWD_RST and the reset bias voltage DCBL_RST as mentioned in FIG. 19.

After the program operation is terminated by the first program pulse 1st PGM Pulse, events stored in the first write circuit 24-1 are varied from '100011' to '000011', and events stored in the second write circuit 24-2 retains '011100'. The fifth write driver of the first write circuit 24-1 may supply a reset current IRST to a corresponding bit line according to a second program pulse 2nd PGM Pulse, e.g., the reset pulse PWD_RST and the reset bias voltage DCBL_RST. Accordingly, the fifth write driver of the first write circuit 24-1 may program a corresponding program bit in a non-volatile memory cell connected to a corresponding bit line.

After the program operation is terminated by the second program pulse 2nd PGM Pulse, events stored in the first write circuit 24-1 are varied from '000011' to '000001', events stored in the second write circuit 24-2 retain '011100'. The sixth write driver of the first write circuit 24-1 may program a corresponding program bit in a non-volatile memory cell connected to a corresponding bit line according to a third program pulse 3rd PGM Pulse.

After the program operation for each program bit assigned in the first write circuit 24-1 is terminated by the first write circuit 24-1, the second write circuit 24-2 performs a program operation on each program bit assign in the second write circuit 24-2. That is, after the program operation for the first write circuit 24-1 is terminated by the third program pulse 3rd PGM Pulse, the second write driver of the second write circuit 24-2 supplies a reset current IRST to a corresponding bit line according to a fourth program pulse 4th PGM Pulse, e.g., the reset pulse PWD_RST and the reset bias voltage DCBL_RST.

Accordingly, the second write driver of the second write circuit 24-2 may program a corresponding program bit in a non-volatile memory cell connected to a corresponding bit line.

After the program operation is terminated by the fourth program pulse 4th PGM Pulse, events stored in the second write circuit 24-2 are varied from '011100' to '001100'. The third write driver of the second write circuit 24-2 may program a corresponding program bit in a non-volatile memory cell connected to a corresponding bit line according to the fifth program pulse 5th PGM Pulse.

After the program operation is terminated by the fifth program pulse 5th PGM Pulse, events stored in the second write circuit 24-2 are varied from '001100' to '000100'. The fourth write driver of the second write circuit 24-2 may program a corresponding program bit in a corresponding non-volatile memory cell according to the sixth program pulse 6th PGM Pulse. After the program operation is terminated by the sixth program pulse 6th PGM Pulse, events stored in the second write circuit 24-2 are varied from '000100' to '000000'.

When events to be programmed by the program control block 21 are 37 events as shown in FIG. 19, the program control block 21 programs each of 6 program bits in each write circuit 24-1, 24-3, 24-5, 24-7, 24-9 and 24-11 by using the first program pulse 1st PGM Pulse. After the program operation is terminated by the first program pulse 1st PGM Pulse, events to be programmed by the program control block 21 are decreased to 31.

The program control block 21 programs each of 6 program bits in each write circuit 24-1, 24-3, 24-5, 24-7, 24-9 and 24-11 by using the second program pulse 2nd PGM Pulse. After the program operation is terminated by the second program pulse 2nd PGM Pulse, events to be programmed by the program control block 21 are decreased to 25. In the same manner, the program control block 21 performs program operations repetitively until an event to be programmed becomes 0.

As described above, the program control block 21 skips a program operation for each program bit assigned in each even numbered write circuit 24-2, 24-4, 24-6, 24-8, 24-10 and 24-12 while a program operation for each program bit assigned in each odd numbered write circuit 24-1, 24-3, 24-5, 24-7, 24-9 and 24-11 is performed. Then, the program control block 21 performs program operations for each program bit assigned in each even numbered write circuit 24-2, 24-4, 24-6, 24-8, 24-10 and 24-12 after the program operation for each program bit assigned in each odd numbered write circuit 24-1, 24-3, 24-5, 24-7, 24-9 and 24-11 is completed. The program control block 21 may program each one of at least one program bit, which is allocated in each of a plurality of pairs of unit cell arrays selected among a plurality of unit cell arrays 24-1 to 24-12, in each corresponding memory cell simultaneously among the plurality of memory cells included in each of the selected plurality of pairs of unit cell arrays by using a program pulse.

FIG. 20 shows a block diagram of a program control block illustrated in FIG. 1, which may perform a data process operation according to another example embodiment. Referring to FIGS. 1 and 20, during a main set operation, e.g., an operation programming data '0' included in a program data WDATA in a corresponding memory cell by using a main set program pulse (PWD_SET_MAIN and DCBL_SET_MAIN), the program pulse generator 26 generates a main set pulse PWD_SET_MAIN and a main set bias voltage DCBL_SET_MAIN according to a clock signal CLK and a selection signal SEL output from a control logic 34. During a sub set operation, e.g., an operation programming data '0' included in a program data WDATA in a corresponding memory cell by using a sub set program pulse (PWD_SET_SUB and DCBL_SET_SUB), the program pulse generator 26 generates a sub set pulse PWD_SET_SUB and a sub set bias voltage DCBL_SET_SUB according to a clock signal CLK and a selection signal SEL output from the controller 34.

The program pulse generator 26 generates a main reset pulse PWD_RST_MAIN and a main reset bias voltage DCBL_RST_MAIN according to a clock signal CLK and a selection signal SEL during a main reset operation, and generates a sub reset pulse PWD_RST_SUB and a sub reset bias voltage DCBL_RST_SUB during a sub reset operation.

In general, the sub pulses (set and reset) are the same as the main pulses, except for being time offset from the respective main pulses. Accordingly, a sub pulse may still overlap with a corresponding main pulse. Stated another way, a sub pulse may be considered a skew pulse with respect to a main pulse. This will be shown in FIG. 21 described below.

Among a plurality of write drivers 43-11 to 43-1j, an odd numbered write driver may be used as a main write driver and an even numbered write driver may be used as a sub write driver.

Figure 21:
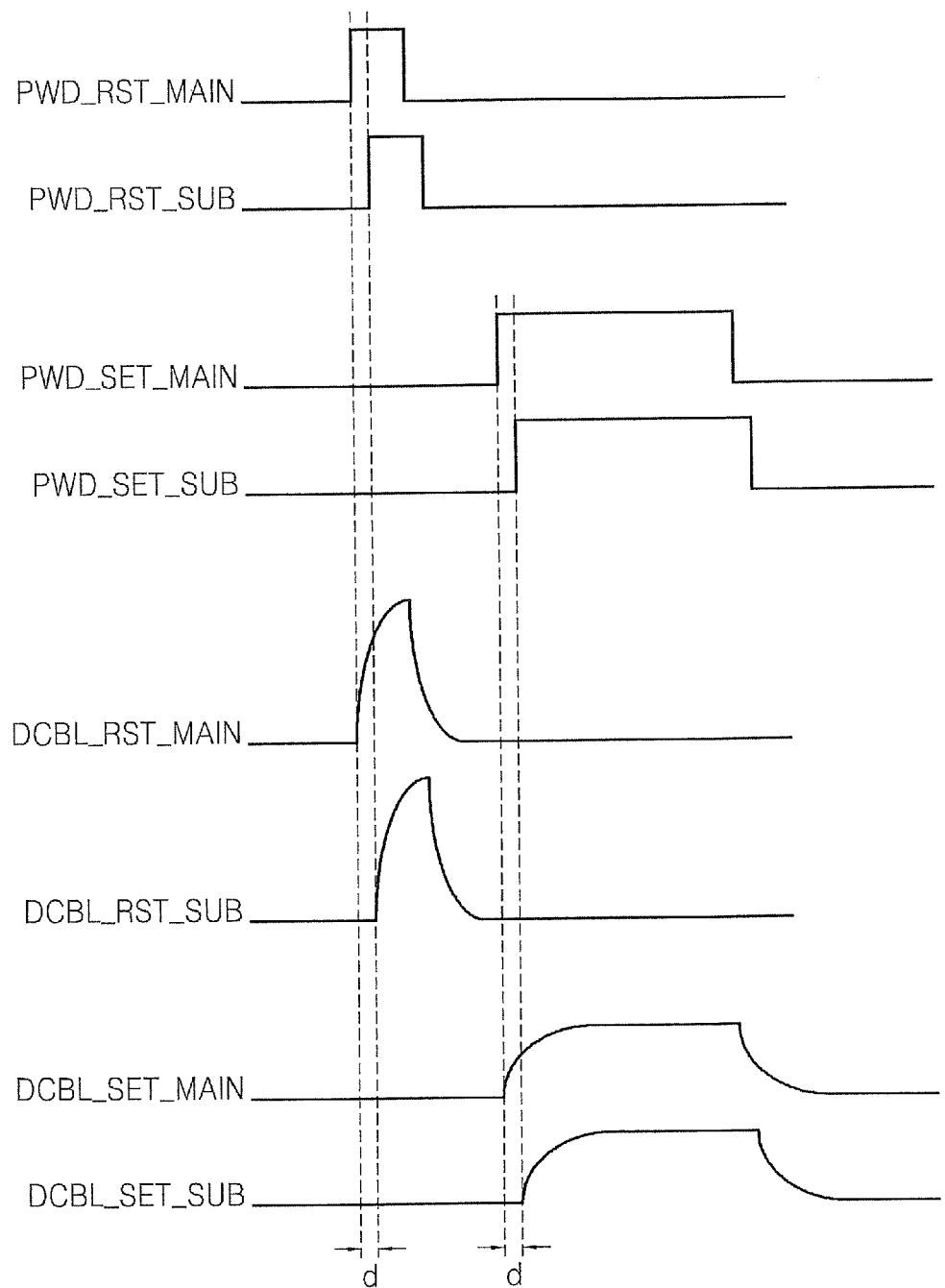
FIG. 21 shows waveforms of output signals of a program pulse generator illustrated in FIG. 20.

As illustrated in FIG. 20, the program control block 21 may perform a plurality of bit sequence loops. The number of write drivers included in each of the plurality of write circuits 24-1 to 24-i may be the same as the number of bit sequence loops. For example, when the number of bit sequence loops is j, the number of write drivers included in each of the plurality of write circuits 24-1 to 24-i may be j. Additionally, every $a^{th}$ (a is a natural number) write driver controller included in each of the plurality of write circuits 24-1 to 24-i is connected to each other. FIG. 21 shows waveforms of output signals of the program pulse generator illustrated in FIG. 20. As illustrated in FIG. 21, a predetermined time difference d is between a main reset pulse PWD_RST_MAIN and a sub reset pulse PWD_RST_SUB, and a predetermined time difference d is between a main set pulse PWD_SET_MAIN and a sub set pulse PWD_SET_SUB. In addition, a predetermined time difference d exists between a main reset bias voltage DCBL_RST_MAIN and a sub reset bias voltage DCBL_RST_SUB, and a predetermined time difference d exists between a main set bias voltage DCBL_SET_MAIN and a sub set bias voltage DCBL_SET_SUB. Time difference d illustrated in FIG. 21 is marked equally for an ease of explanation, however, it can be different according to an embodiment.

As illustrated in FIG. 21, signals for performing a reset operation and signals for performing a set operation are not generated simultaneously.

Figure 22:
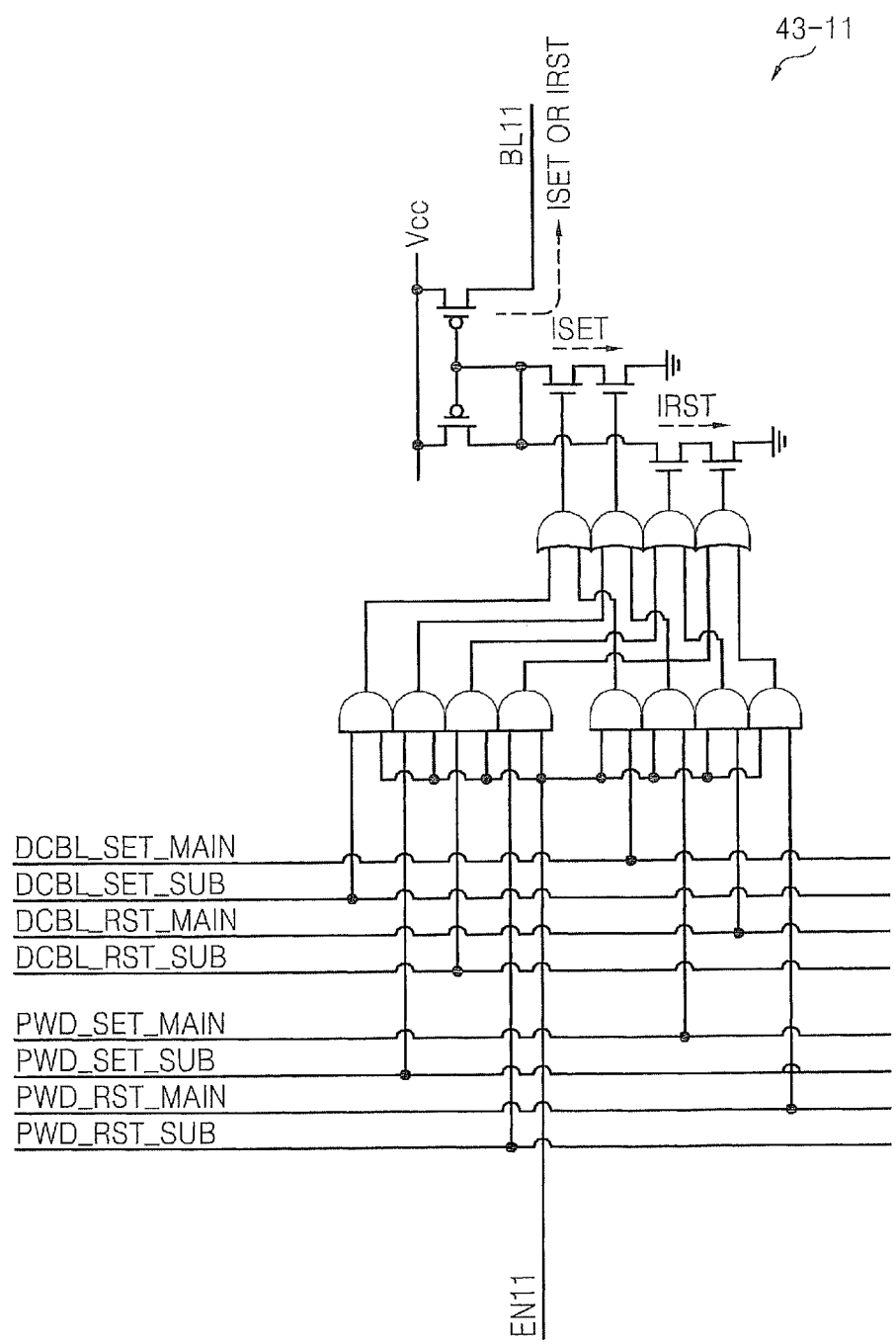
FIG. 22 shows an example embodiment of a circuit diagram of a write driver illustrated in FIG. 20.

FIG. 22 shows an example embodiment of a circuit diagram of a write diver illustrated in FIG. 20. The structure of each write driver 43-11 to 43-ij illustrated in FIG. 20 is substantially the same as one of the first write driver 43-11 illustrated in FIG. 22. Referring to FIG. 22, when the enable signal EN11 is at a high level and a main reset pulse PWD_RST_MAIN and a main reset bias voltage DCBL_RST_MAIN are at a high level, a reset current IRST is supplied to a bit line BL11. Moreover, when the enable signal EN11 is at a high level and a sub reset pulse PWD_RST_SUB and a sub reset bias voltage DCBL_RST_SUB are at a high level, the reset current IRST is supplied to the bit line BL11. As described above, supplying a reset current IRST to a bit line BL11 may mean that the reset current IRST is supplied, through one of the global bit lines connected to a write driver 43-11 and one of the local bit lines connected to the one global bit line, to a memory cell connected to the one local bit line. Here, each of the plurality of global bit lines and a write driver 43-11 may be connected to each other through each of a plurality of global bit line selection switches, and each of the plurality of local bit lines may be connected to the one global bit line through each of a plurality of local bit line selection switches. Each of the plurality of global bit line selection switches may be switched by each of a plurality of global bit line selection signals and each of the plurality of local bit line selection switches may be switched by each of a plurality of local bit line selection switches. These switches may be controlled by at least one of the decoders 14 and 20.

When the enable signal EN11 is at a high level and a main set pulse PWD_SET_MAIN and a main set bias voltage DCBL_SET_MAIN are at a high level, a set current ISET is supplied to the bit line BL11. In addition, when the enable signal EN11 is at a high level and a sub set pulse PWD_SET_SUB and a sub set bias voltage DCBL_SET_SUB are at a high level, the set current ISET is supplied to the bit line BL11. As described above, supplying a set current ISET to a bit line BL11 may mean that the set current ISET is supplied, through one of the global bit lines connected to a write driver 43-11 and one of the local bit lines connected to the one global bit line, to a memory cell connected to the one local bit line. Here, each of the plurality of global bit lines and a write driver 43-11 may be connected to each other through each of the global bit line selection switches, and each of the plurality of local bit lines may be connected to the one global bit line through each of the plurality of local bit line selection switches. Each of the plurality of global bit line selection switches may be switched by each of a plurality of global bit line selection signals and each of the plurality of local bit line selection switches may be switched by each of a plurality of local bit line selection switches.

Figure 23:
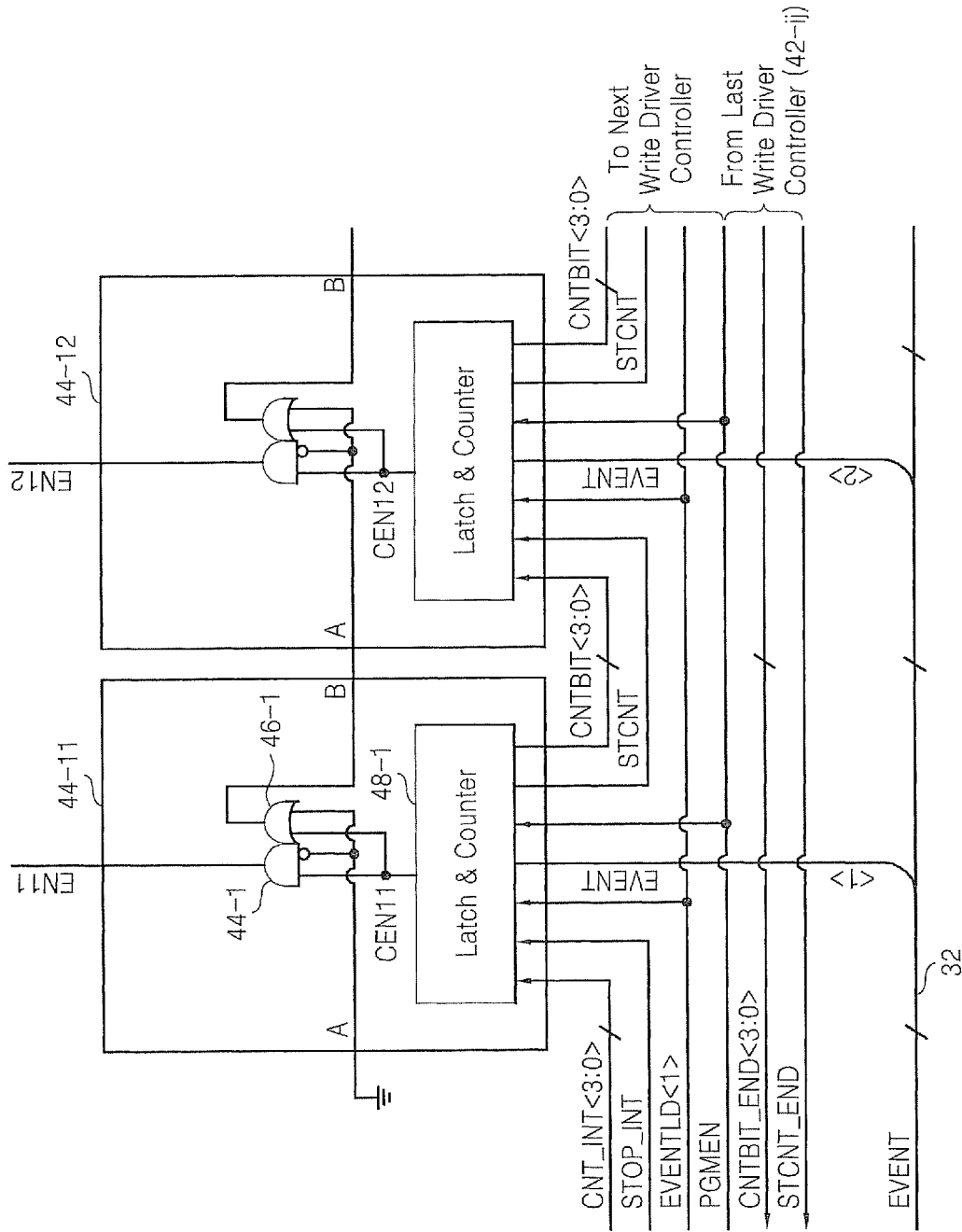
FIG. 23 shows an example embodiment of a circuit diagram of a write driver controller illustrated in FIG. 20.

FIG. 23 shows an example embodiment of a circuit diagram of a write driver controller illustrated in FIG. 20. The structure of each write driver controller 44-11 to 44-ij illustrated in FIG. 20 is substantially the same as one of a first write driver controller 44-11 illustrated in FIG. 23.

As illustrated in FIGS. 20 and 23, each of a plurality of write driver controllers 44-11 to 44-1j embodied in the first write circuit 24-1 is connected in series to each other. The terminal A of the first write driver controller 44-11 is connected to a ground, and the terminal B of the last write driver controller 44-1j may become floating. Except for the first write driver controller 44-11, the terminal A of a current write driver controller 44-12 to 44-1j is connected to the terminal B of a previous write driver controller 44-11 to 44-(1j−1).

Similarly, each of a plurality of write driver controllers 44-i1 to 44-ij embodied in an $m^{th}$ write circuit 24-i is connected in series to each other. The terminal A of the first write driver controller 44-i1 may be connected to a ground, and the terminal B of the last write driver controller 44-ij may become floating. Except for the first write driver controller 44-i1, the terminal A of the current write driver controller 44-i2 to 44-ij is connected to the terminal B of the previous write driver controller 44-11 to 44-(ij−1).

Referring to FIGS. 20 and 23, the operation of write driver controllers 44-11 and 44-12 is explained as follows.

When the first enable control signal CEN11 of the first write driver controller 44-11 is at a high level, the AND gate 44-1 outputs the first enable signal EN11 having a high level and the OR gate 46-1 outputs a signal having a high level to the terminal A of the second write driver controller 44-12 through the terminal B.

Although the second enable control signal CEN12 of the second write driver controller 44-12 is at a high level, the AND gate outputs the second enable signal EN12 having a low level and the OR gate outputs a signal having a high level to the terminal A of a next write driver controller through the terminal B thereof.

Accordingly, when the first write driver controller 44-11 of the first write circuit 24-1 outputs the first enable signal EN11 having a high level, the rest write driver controllers 44-12 to 44-1j except for the first write driver controller 44-11 output enable signals EN12 to EN1j each having a low level, so that only a first write driver 43-11 becomes enabled and the rest write drivers 43-12 to 43-1j become disabled.

When the first enable control signal CEN11 of the first write driver controller 44-11 is at a low level and the second enable control signal CEN12 of the second write driver controller 44-12 is at a high level, the AND gate 44-1 of the first write driver controller 44-11 outputs a first enable signal EN11 having a low level and the OR gate 46-1 outputs a signal having a low level to the terminal A of the second write driver controller 44-12 through the terminal B thereof.

Since the second enable control signal CEN12 of the second write driver controller 44-12 is at a high level, the AND gate of the second write driver controller 44-12 outputs a second enable signal EN11 having a high level and the OR gate outputs a signal having a high level through a terminal B thereof.

Accordingly, when the second write driver controller 44-12 of the first write circuit 24-1 outputs a second enable signal EN12 having a high level, the rest write driver controllers except for the second write driver controller 44-12 output enable signals having a low level, so that only a second write driver 43-12 becomes enabled and the rest write drivers become disabled.

In this manner, the program control block 21 may program only one of program bits assigned in each of a plurality of write circuit 24-1 to 24-i in a corresponding one of a plurality of non-volatile memory cells included in each of a plurality of unit cell arrays MG1 to MGi at the same time by using a program pulse.

Figure 24:
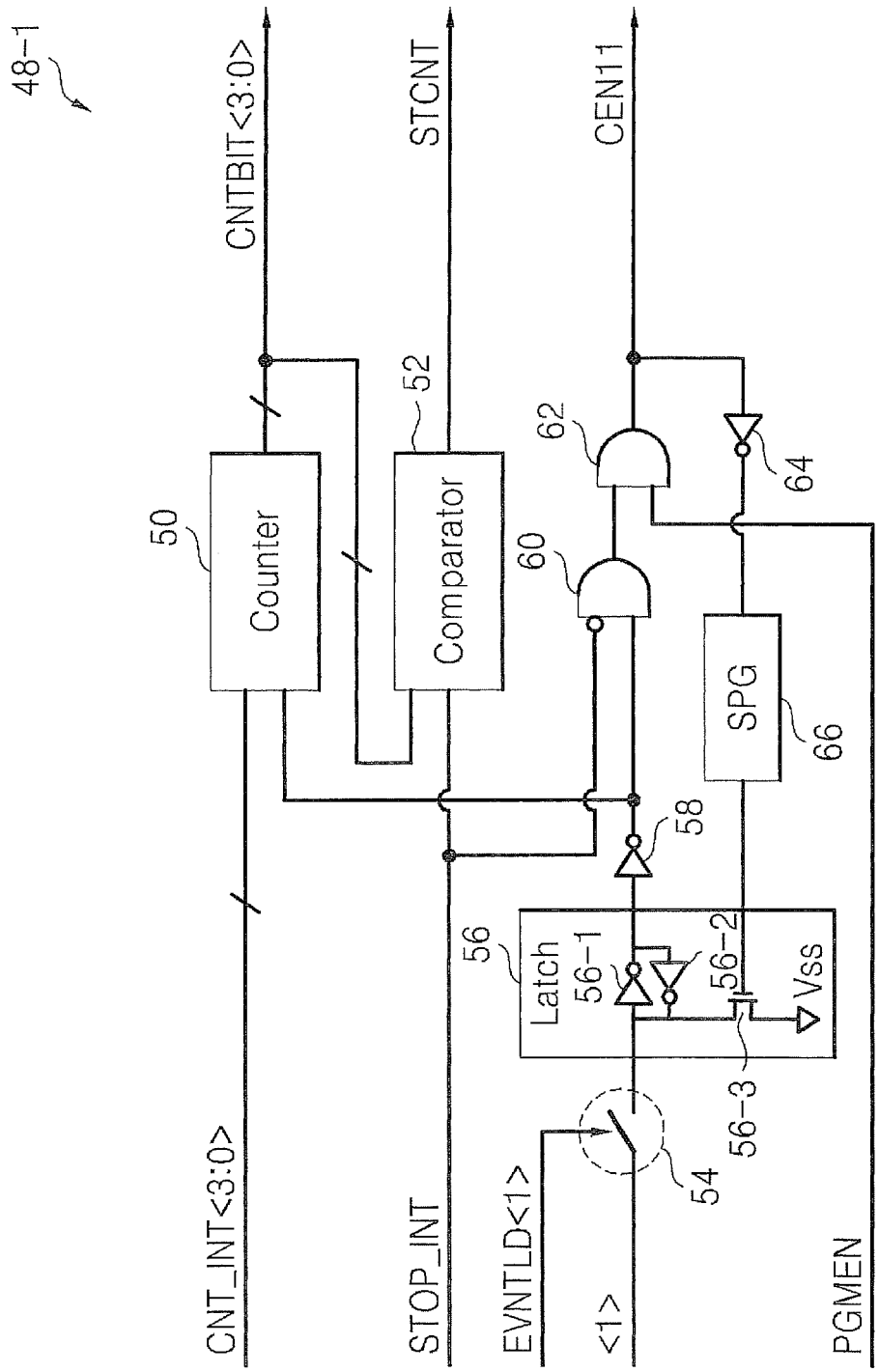
FIG. 24 shows an example embodiment of a block diagram of a counter & latch illustrated in FIG. 23.

FIG. 24 shows an example embodiment of a block diagram of a counter & latch illustrated in FIG. 23. As illustrated in FIGS. 23 and 24, the structure of the latch & counter 48-1 embodied in each of a plurality of write driver controllers 44-11 to 44-ij illustrated in FIG. 24 is equal to each other.

Referring to FIGS. 9, 10, 11 and 24, an operation of the latch & counter 48-1 is explained as follows. It is assumed that an initial count bit CNT_INT<3:0> is '0000', an initial comparison signal STOP_INT is '0' and an event <1> input to the first write driver controller 44-11 is T. Here, '1' is a program bit to be programmed in a non-volatile memory cell 13 connected to a bit line BL11 through the write driver 43-11.

When the event load signal EVNTLD<1> is at a high level, the event <1> is transmitted to a latch 56 through the switch 54 and the first inverter 58 connected to the latch 56 transmits '1' to the counter 50 and the AND gate 60. The counter 50 may retain a count bit CNTBIT<3:0> as it is or increase it by 1. For example, when the input event<1> is '0', the count bit CNT-BIT<3:0>=0000 is retained as an initial count bit CNT_INT<3:0>=0000, and when the input event<1> is '1', the count bit CNTBIT<3:0> is increased by 1 to 0001.

As illustrated in FIGS. 20, 23 and 24, the count bit CNT-BIT<3:0> output from the first write driver controller 43-11 is output to a counter of the second write driver controller 44-12. The count bit output from a counter of the second write driver controller 44-12 is output to a counter of a third write driver controller. The operation of a counter of a third or later write driver controller is substantially similar to an operation of a counter of the second write driver controller.

The count bit and the comparison signal output from each write driver controller 44-i1 to 44-ij included in the last write circuit 24-i are output to the bit sequence controller 28.

For example, referring to FIGS. 12 and 20, the last count bit CNTBIT_END_1ST and the last comparison signal STCNT_END_1ST output from the first write driver controller 44-i1 of an $i^{th}$ write circuit 24-i are output to the bit sequence controller 28. The last count bit CNTBIT_END_2nd and the last comparison signal STCNT_END_2nd output from the second write driver controller 44-i2 of the $i^{th}$ write circuit 24-i are output to the bit sequence controller 28.

The last count bit CNTBIT_END_3rd and the last comparison signal STCNT_END_3rd output from the third write driver controller of the mth write circuit 24-i are output to the bit sequence controller 28. The last count bit CNTBIT_END_4th and the last comparison signal STCNT_END_4th output from the fourth write driver controller of the $m^{th}$ write circuit 24-i are output to the bit sequence controller 28.

Figure 25A:
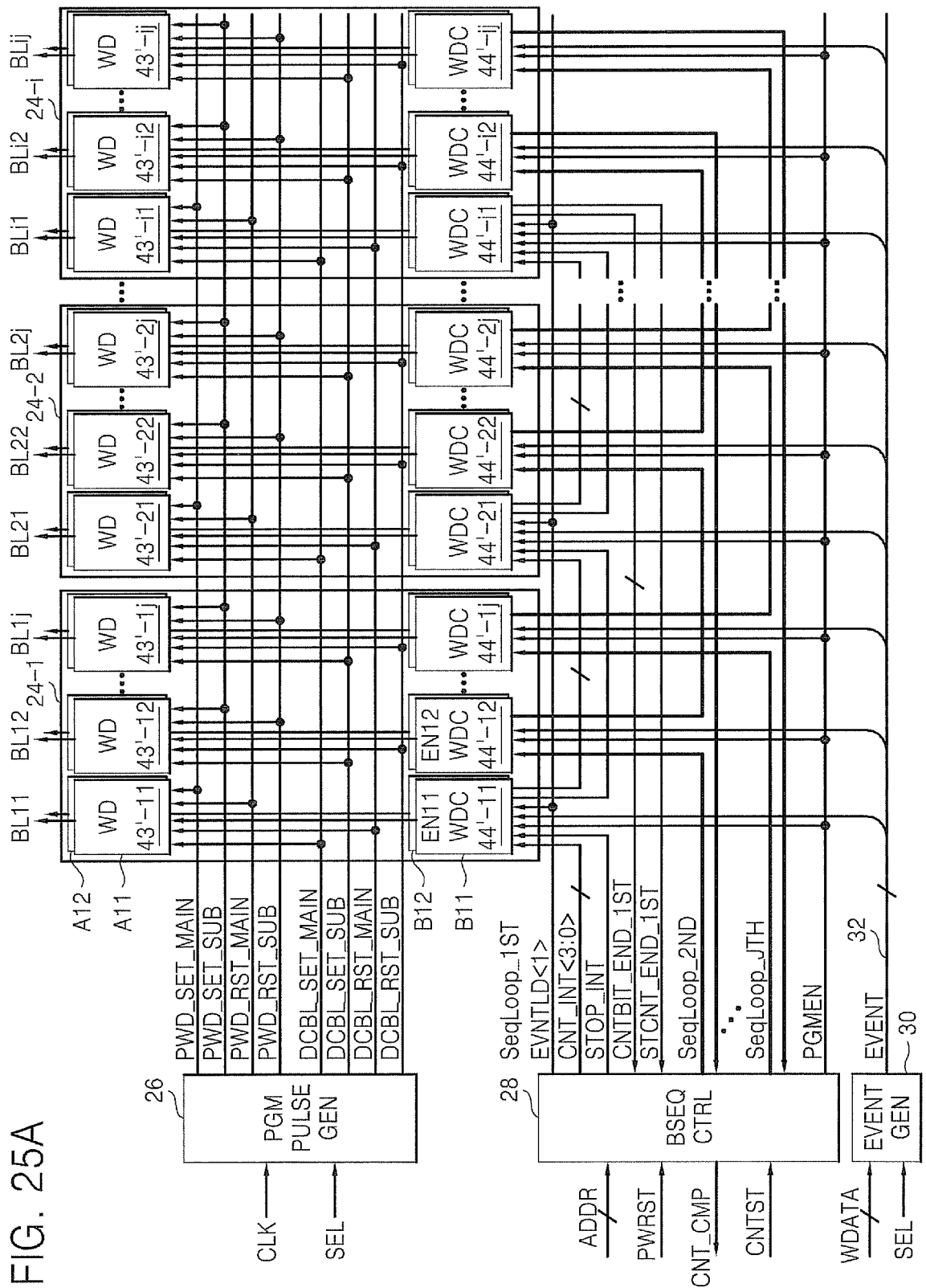
FIG. 25A shows a block diagram of a program control block illustrated in FIG. 1, which may perform a data processing operation according to still another example embodiment.

FIG. 25A shows a block diagram of a program control block illustrated in FIG. 1, which may perform a data processing operation according to still another example embodiment of the present invention. Referring to FIG. 25A, each of the plurality of write circuits 24-1 to 24-i includes a plurality of write drivers 43' and a plurality of write driver controllers 44'. Each pair of write drivers 43' includes a front write driver A11 and a rear write driver A12. The front write driver A11 and the rear write driver A12 are the same or substantially the same. Each write driver controllers 44' includes a front write driver controller B11 and a rear write driver controller B12. The front write driver controller B11 and the rear write driver controller B12 are the same or substantially the same.

FIG. 25B shows an example of a diagram for explaining a data process method of a memory device including a program control block illustrated in FIG. 25A. As with previous examples, each bit associated with a write circuit 24-i is associated with a different column in the corresponding cell array MGi.

Referring to FIGS. 1, 25A and 25B, it is assumed that the number of write circuits is 16, the program control block 21 performs an operation, e.g., a reset operation, programming data '1' included in a program data WDATA and the number of program bits programmed at once by using a program pulse, i.e., the number of write drivers operated simultaneously, is 8.

Additionally, it is also assumed that every front write driver A11 included in each write circuit 24-1 to 24-16 operates as a main write driver and every rear write driver A12 operates as a sub write driver for convenience of explanation.

In a first bit sequence loop (1st SeqLoop), a count value counting a number of an odd numbered program bits among at least one program bit allocated in each write circuit 24-1 to 24-16, i.e., the number of main write drivers which should be enabled in a first bit sequence loop (1st SeqLoop), is 11 and a count value counting the number of an even numbered program bit among the at least a program bit, i.e., the number of sub write driver enabled in the first bit sequence loop (1st SeqLoop), is 5. Here, 11 and 5 are counted count values, respectively.

Since the count value of 11 is greater than a reference count value of 8, the program control block 21 generates a main reset program pulse twice to program 11 program bits allocated in 11 main write drivers. In addition, the count value of 5 is less than the reference count value of 8, so that the program control block 21 generates a sub reset program pulse once to program 5 program bits allocated in five sub write drivers.

Each program pulse (1st PGM Pulse or 2nd PGM Pulse) illustrated in FIG. 25B includes at least one of main reset program pulses (PWD_RST_MAIN and DCBL_RST_MAIN) and a sub reset program pulse (PWD_RST_SUB or DCBL_RST_SUB).

That is, the program control block 21 may program every program bit allocated in each of 8 write circuits 24-1, 24-3, 24-4, 24-6, 24-8, 24-9. 24-10 and 24-12 in every memory cell included in each of 8 unit cell arrays one to one simultaneously by using a first main reset pulse in a first bit sequence loop (1st SeqLoop). The program control block 21 may also program each program bit allocated in each of 5 write circuits 24-2, 24-5, 24-9, 24-13 and 24-14 in every memory cell included in each of 5 unit cell arrays simultaneously (one to one) by using a first sub reset pulse in a first bit sequence loop (1st SeqLoop).

According to a first main reset program pulse, 8 of 11 program bits (Event Status) are programmed and 3 of them are remaining, so that the program control block 21 may program each program bit allocated in each of three write circuits 24-13, 24-15 and 24-16 in each memory cell included in each of three unit cell arrays one to one simultaneously by using a second main reset program pulse (2nd PGM Pulse) in the first bit sequence loop 1st SeqLoop.

The program control block 21 outputs a termination signal CNT_CMP having a high level to the control logic 34. Accordingly, the control logic 34 terminates a first bit sequence loop (1st SeqLoop) and controls a start of a second bit sequence loop.

In a second bit sequence loop (2nd SeqLoop), a count value counting the number of odd numbered program bits among at least a program bit allocated in each write circuit 24-1 to 24-16, i.e., the number of main write drivers enabled in a second bit sequence loop (2nd SeqLoop), is 7 and a count value counting the number of even numbered program bits among the at least a program bit, i.e., the number of sub write driver enabled in a second bit sequence loop (2nd SeqLoop), is 6. Here, 7 and 6 are counted count values, respectively.

Since each count value 7 or 6 is smaller than a reference count value of 8, the program control block 21 generates a main reset program pulse to program 7 program bits allocated in 7 main write drivers and generates a sub reset program pulse to program 6 program bits allocated in 6 sub write drivers.

That is, the program control block 21 may program each program bit allocated in each of 7 write circuits 24-2, 24-3, 24-6, 24-10, 24-12, 24-15 and 24-16 in each memory cell included in each of 7 unit cell arrays at the same time by using a first main reset pulse in a second bit sequence loop (2nd SeqLoop).

The program control block 21 may also program each program bit allocated in each of 6 write circuits 24-2, 24-5, 24-7, 24-9, 24-11 and 24-13 in each memory cell included in each of 6 unit cell arrays at the same time by using a first sub reset pulse in the second bit sequence loop 2nd SeqLoop. Since there is no remaining program bit, the program control block 21 outputs a termination signal CNT_CMP having a high level to the control logic 34. Subsequently, the control logic 34 terminates a second bit sequence loop $2^{nd}$ SeqLoop and controls a start of a third bit sequence loop.

In a third bit sequence loop $3^{rd}$ SeqLoop, a count value counting a number of odd numbered program bit among at least a program bit allocated in each write circuit 24-1 to 24-16, i.e., the number of main write driver which should be enabled in the third bit sequence loop $3^{rd}$ SeqLoop, is 3 and a count value counting a number of even numbered program bit among at least a program bit, i.e., the number of sub write driver which should be enabled in the third bit sequence loop, is 11. Here, 3 and 11 are counted count values, respectively.

Since the count value of 3 is smaller than a reference count value of 8, the program control block 21 generates a main reset program pulse to program 3 program bits allocated in 3 main write drivers. In addition, since the count value of 11 is greater than a reference count value of 8, the program control block 21 generates a sub write reset program pulse twice to program 11 program bits allocated in 11 sub write drivers.

That is, the program control block 21 may program each program bit allocated in each of 3 write circuits 24-1, 24-9 and 24-16 in each memory cell included in each of 3 unit cell arrays simultaneously by using a first main reset pulse in the third bit sequence loop (3rd SeqLoop). In addition, the program control block 21 may program each program bit allocated in each of 8 write circuits 24-1, 24-2, 24-4, 24-5, 24-7, 24-8, 24-9 and 24-10 in each memory cell included in each of 8 unit cell arrays at the same time by using a first sub reset pulse in the third bit sequence loop (3rd SeqLoop).

Since there are 8 program bits programmed and 3 program bits (Remain Event) remaining among 11 program bits (Event Status) according to a first sub reset pulse, the program control block 21 may program each program bit allocated in each of 3 write circuits 24-12, 24-15 and 24-16 in each memory cell included in each of 3 unit cell arrays simultaneously by using a second sub reset pulse (2nd PGM Pulse) in a third bit sequence loop (3rd SeqLoop). Since there is no remaining program bit, the program control block 21 outputs a termination signal CNT_CMP having a high level to the control logic 34. Accordingly, the control logic 34 terminates the third bit sequence loop (3rd SeqLoop).

Accordingly, as will be understood from the above description, a memory cell in the Tth column of no more than a reference number of unit cell arrays having an associated program bit are simultaneously programmed during a main programming operation of a bit sequence loop, and a memory cell in the (T+1)th column of no more than the reference number of unit cell arrays having an associated program bit are simultaneously programmed during a sub programming operation of the bit sequence loop. It will be understood, however, that the reference number for the main programming may differ from that for the sub programming.

Figure 26:
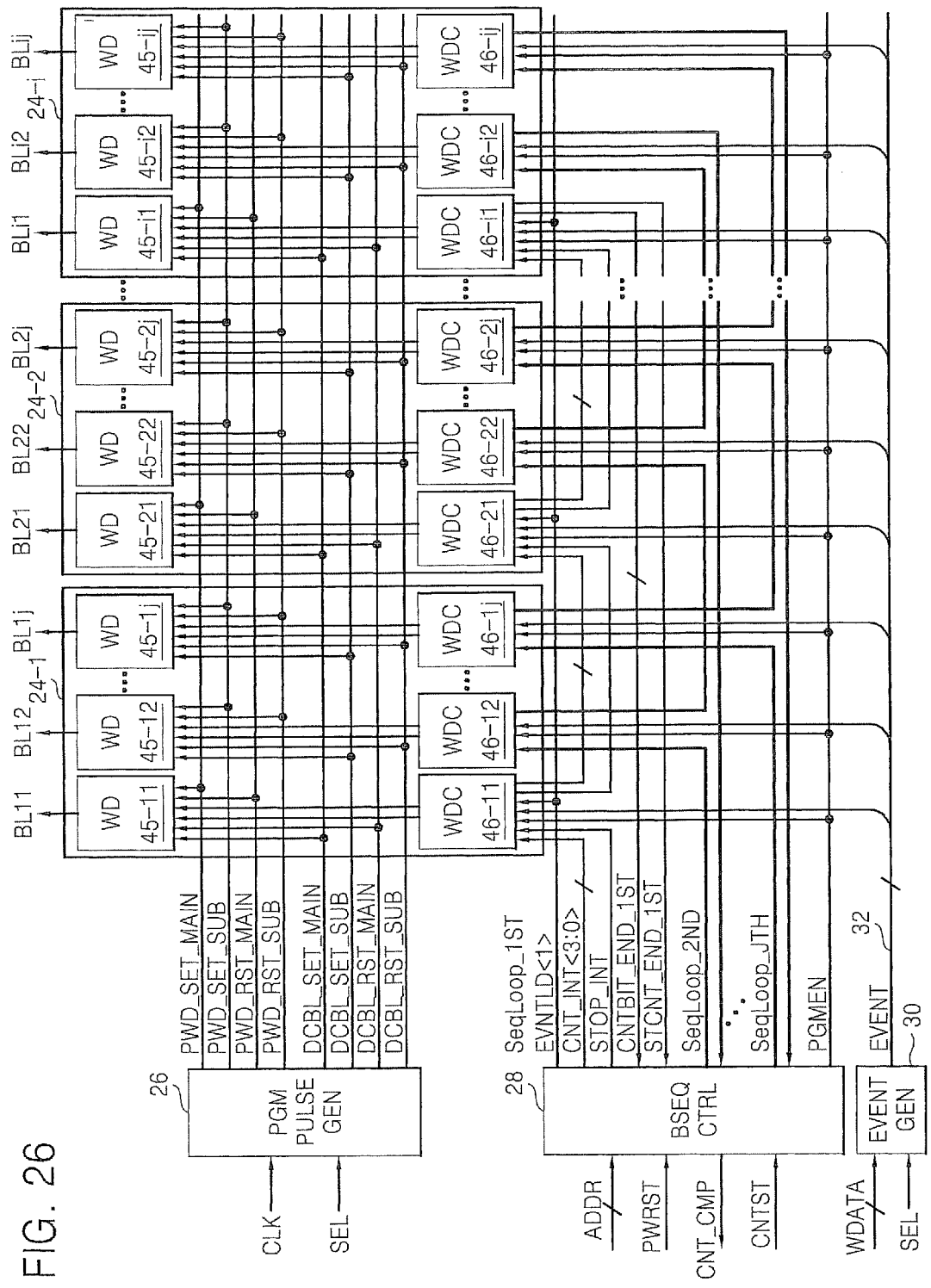
FIG. 26 shows a block diagram of a program control block illustrated in FIG. 1, which may perform a data process operation according to still another example embodiment.

FIG. 26 shows a block diagram of a program control block illustrated in FIG. 1, which may perform a data process operation according to another example embodiment.

As illustrated in FIG. 26, each write circuit 24-1 to 24-i includes each write driver 45-11 to 45-ij and each write driver controller 46-11 to 46-ij. Each write driver 45-11 to 45-ij may operate as one of a main driver and a sub driver according to enable signals output from each write driver controller 46-11 to 46-ij.

Figure 27:
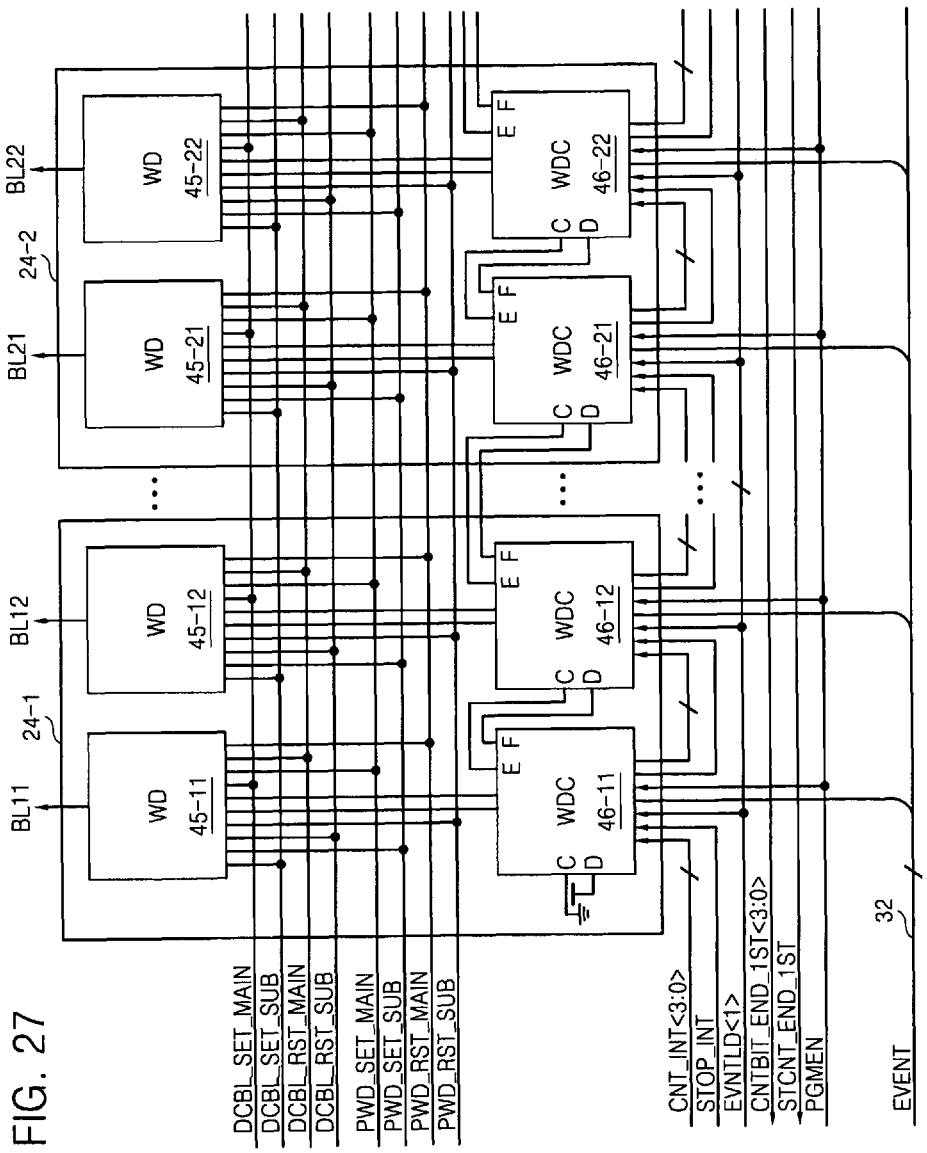
FIG. 27 shows connections of write drivers illustrated in FIG. 26.

FIG. 27 shows an example of connections for write drivers illustrated in FIG. 26. As illustrated in FIG. 27, the terminal C of the first write driver controller 46-11 is connected to a ground, the terminal D is connected to a power supply, and terminals E and F are connected to terminal C and terminal D of the second write driver controller 46-12, respectively. Then, the terminal E and the terminal F of the second write driver controller 46-12 are connected to the terminal C and the terminal D of a third write driver controller, respectively.

Figure 28:
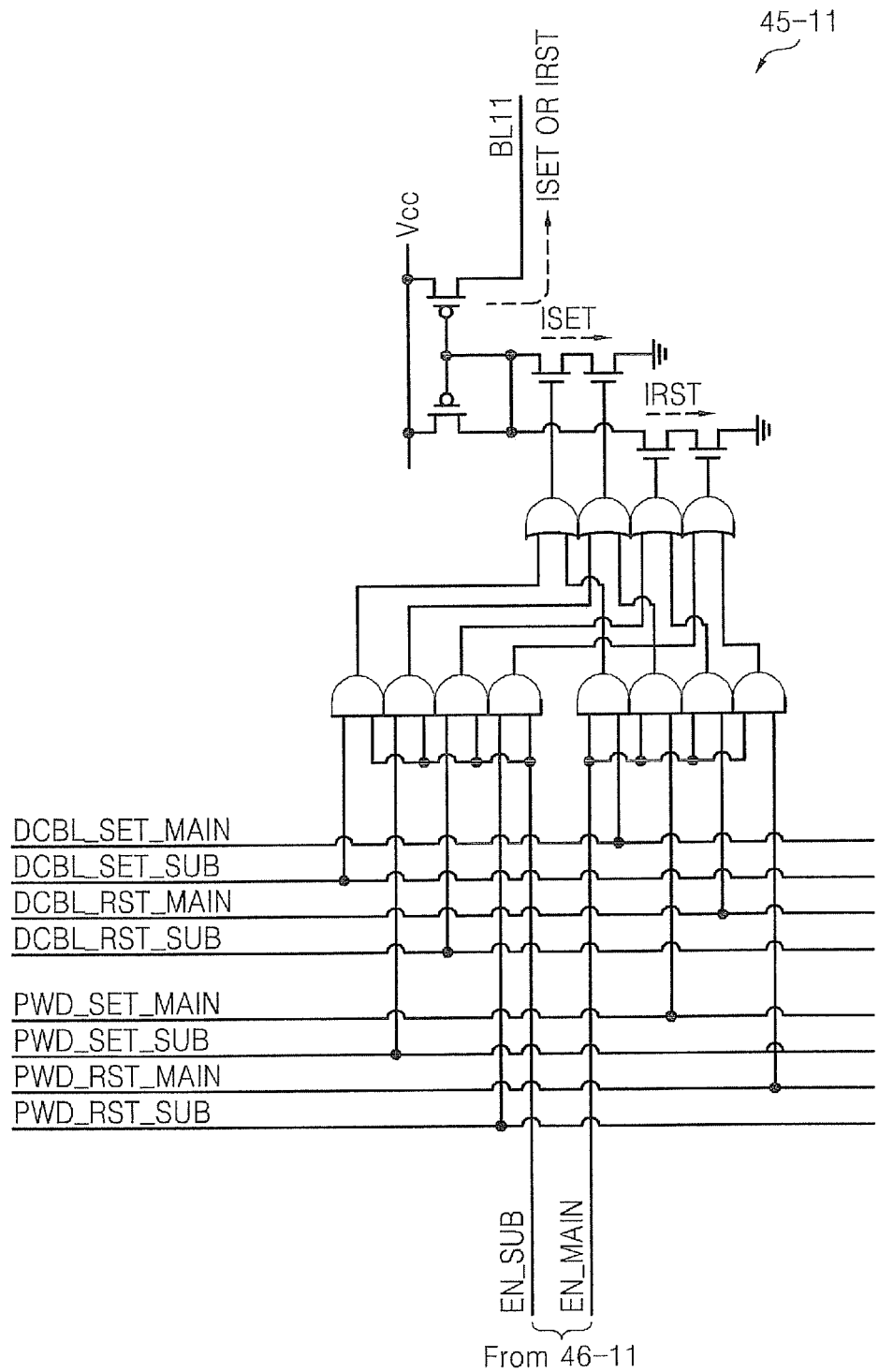
FIG. 28 shows an example embodiment of a circuit diagram of a write driver illustrated in FIG. 27.

FIG. 28 shows an example embodiment of a circuit diagram of a write driver illustrated in FIG. 27. Referring to FIG. 28, when the main enable signal EN_MAIN is at high level and the main reset pulse PWD_RST_MAIN and the main reset bias voltage DCBL_RST_MAIN are at a high level, the reset current IRST is supplied to the bit line BL11. In addition, when the sub enable signal EN_SUB is at a high level and the sub reset pulse PWD_RST_SUB and the sub reset bias voltage DCBL_RST_SUB are at a high level, the reset current IRST is supplied to the bit line BL11.

And, when the main enable signal EN_MAIN is at a high level and the main set pulse PWD_SET_MAIN and the main set bias voltage DCBL_SET_MAIN are at a high level, the set current ISET is supplied to the bit line BL11. Additionally, when the sub enable signal EN_SUB is at a high level and the sub set pulse PWD_SET_SUB and the sub set bias voltage DCBL_SET_SUB are at a high level, the set current ISET is supplied to the bit line BL11.

Figure 29:
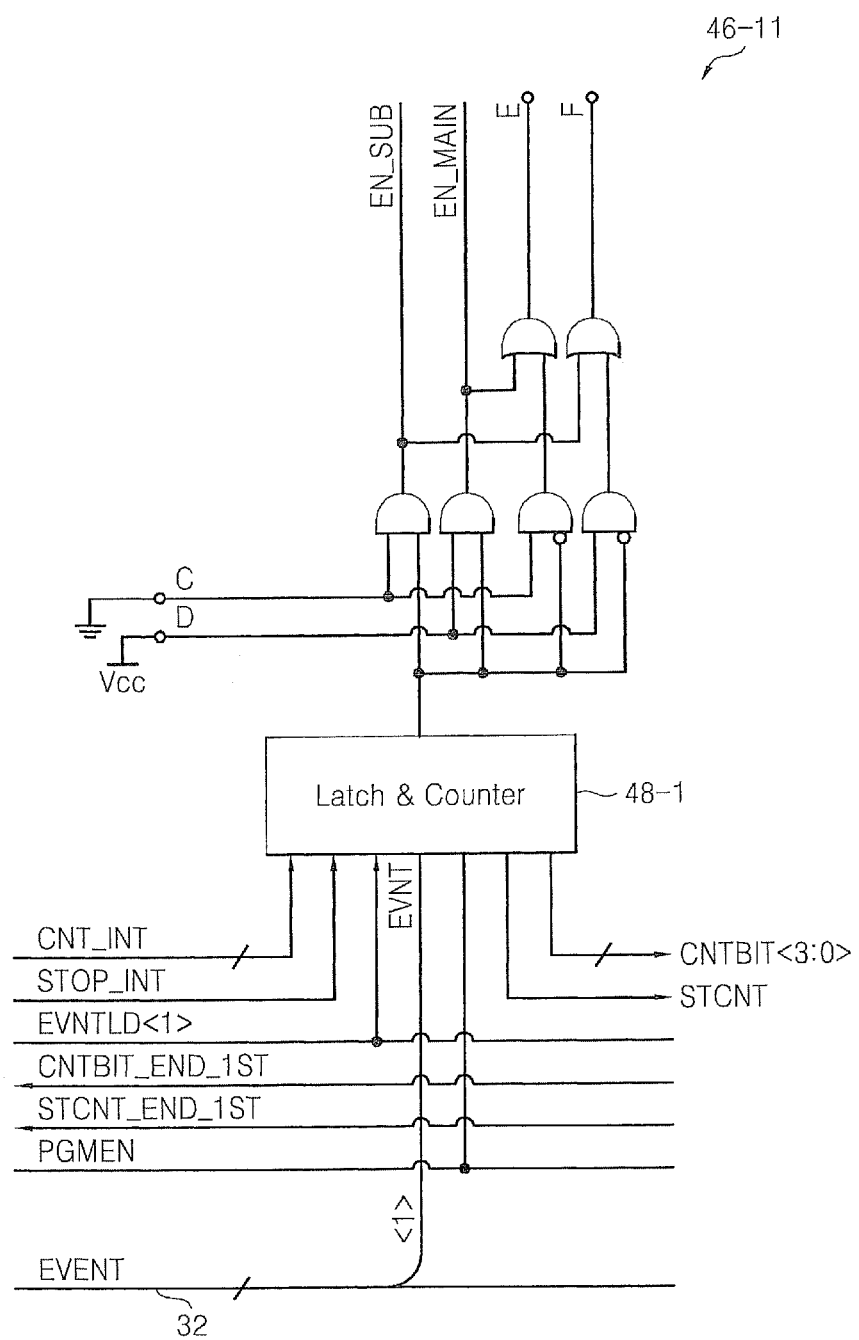
FIG. 29 shows an example embodiment of a circuit diagram of a write driver controller illustrated in FIG. 27.

FIG. 29 shows an example embodiment of a write driver controller illustrated in FIG. 28. Referring to FIGS. 24, 28 and 29, when the event EVENT<1> is '0', the enable control signal CEN11 output from the latch & counter 48-1 is at a low level, i.e., 0. Therefore, the main enable signal EN_MAIN, the sub enable signal EN_SUB and the terminal E are at a low level and the terminal F is at a high level.

However, when the event EVENT<1> is 1, the enable control signal CEN11 output from the latch & counter 48-1 is at a high level. The main enable signal EN_MAIN is at a high level, the sub enable signal EN_SUB is at a low level, the terminal E is at a high level and the terminal F is at a low level. Accordingly, the first write driver 45-11 operates as a main driver.

Continuously, when the event 1 is input to the second write driver controller 46-12, the terminal C of the second write driver controller 46-12, connected to the terminal E of the first write driver controller 46-11, is at a high level and the terminal D of the second write driver controller 46-12, connected to the terminal F of the first write driver controller 46-11, is at a low level.

Accordingly, the main enable signal EN_MAIN is at a low level and the sub enable signal EN_SUB is at a high level. When the first write driver 45-11 operates as a main write driver, the second write driver 45-12 operates as a sub write driver. The terminal E of the second write driver controller 46-12 is at a low level, and the terminal F is at a high level.

Each write driver controller 46-12 to 46-ij included in each write circuit 24-1 to 24-i illustrated in FIG. 26 may generate a sub enable signal EN_SUB or a main enable signal EN_MAIN according to whether a previous write driver controller generates a main enable signal EN_MAIN or a sub enable signal EN_SUB.

Figure 30:
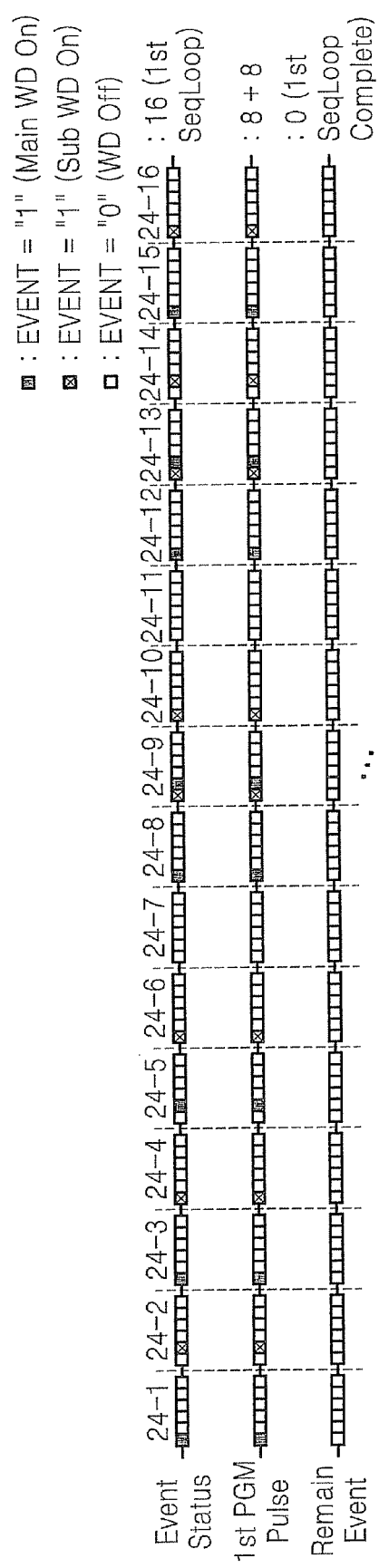
FIG. 30 shows an example of a diagram for explaining a data process method of the memory device of FIG. 1, which includes a program control block illustrated in FIG. 26.

FIG. 30 shows an example of a diagram for explaining a data process method of a memory device including a program control block illustrated in FIG. 26 and described above. Here, each bit associated with a write circuit 24 is associated with a different column in the corresponding cell array MG. The example of FIG. 30 also assumes 16 write circuits 24. In the data processing method, the program control block 21 first processes the first two events (e.g., first and second events) associated with each write circuit 24i during a first bit sequence loop; processes the next two events (e.g., third and fourth events) associated with each write circuit 24i during a next bit sequence loop; etc. Accordingly, during each bit sequence loop, the program control block processes the any program bits associated with a Tth and (T+1)th column of each cell array MG associated with the write circuits 24. For the purposes of discussion, FIG. 30 only illustrates the first bit sequence loop for the sake of brevity since each bit sequence loop is the same but for the two events (or columns) under consideration. Accordingly, FIG. 30 also only illustrates the first and second events associated with each write circuit 24.

As evident from FIG. 30, the program control block 21 assigns the first program bit for the first write circuit 24-1 to the main program operation. The next program bit is the second event of the second write circuit 24-2. This program bit is assigned to the sub program operation. The program control block 21 will continue to alternate assigning the program bits to either the main program operation or the sub program operation. Stated another way, consecutively assigned program bits are assigned to different ones of the main and sub program operations. Stated yet another way, two consecutively assigned program bits are not assigned to a same one of the main and sub program operations.

Again, only two consecutive events from each of the write circuits 24 are considered during each programming loop, and each of these two consecutive events correspond to Tth and (T+1)th columns of a cell array MGi. Accordingly, as evident from the FIG. 30 and the above discussion, the program control block 21 assigns Tth and (T+1)th columns of each of the unit cell arrays MG to a current main programming operation and a current sub programming operation such that two consecutively assigned columns are assigned to different ones of the current main programming operation and the current sub programming operation. As will be recalled, the program control block 21 simultaneously programs the Tth and (T+1)th columns assigned to the current main programming operation, and simultaneously programs the Tth and (T+1)th columns assigned to the current sub programming operation. It will also be recalled that the current sub programming operation may overlap a portion of the current main programming operation.

Accordingly, in the example of FIG. 30, the first write drive of the first write circuit 24-1 operates as a main write driver, the second write driver of the second write circuit 24-2 operations as a sub write driver, the first write driver of the third write circuit 24-3 operates as main write driver, etc. Also, in this example, 8 program bits are assigned to the main program operation and 8 program bits are assigned to the sub program operation. Namely, this embodiment operates to divide the program bits equally between the main and sub program operations for each bit sequence loop.

Figure 32:
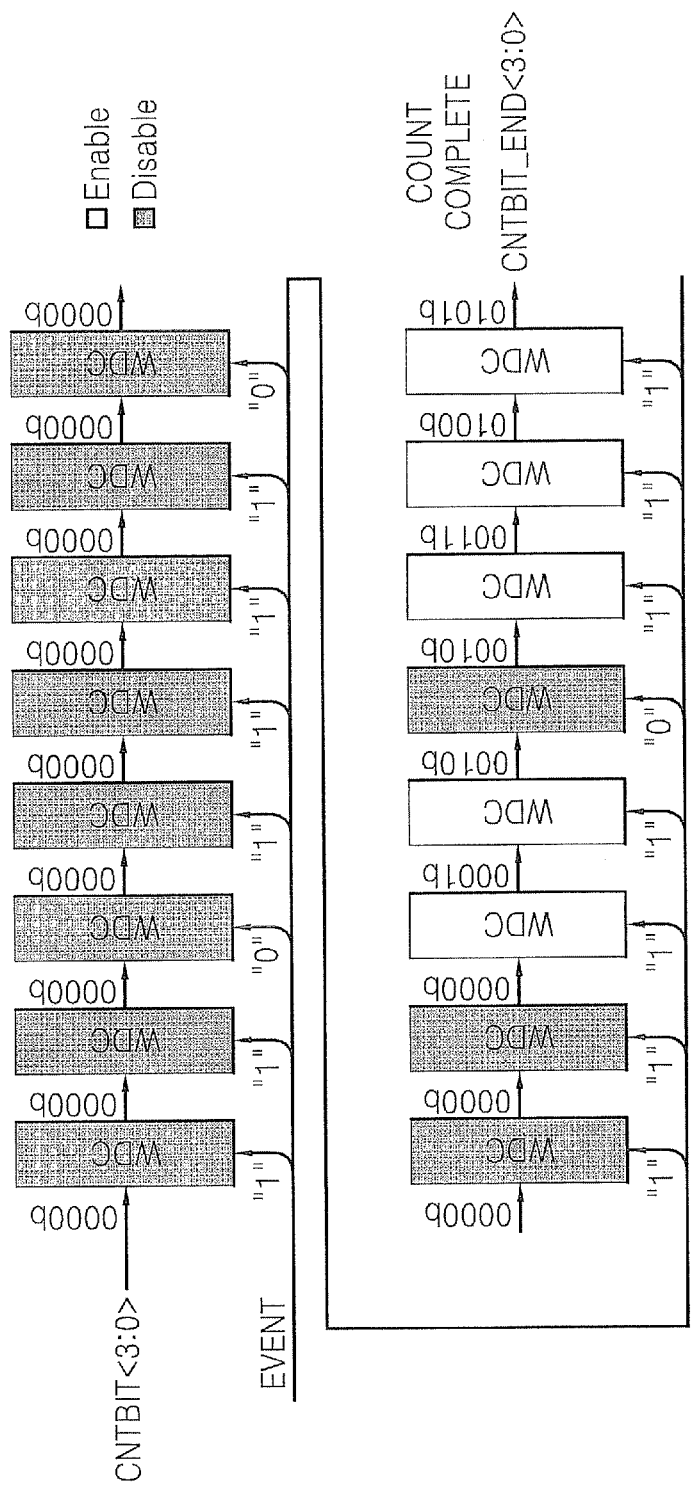

FIGS. 31 and 32 show diagrams for explaining an operation of a plurality of write driver controllers included in a write circuit block illustrated in FIG. 1. Referring to FIGS. 1, 6, 10, 15, 31 and 32, it is assumed that the number of write circuits 24-1 to 24-i embodied in a write circuit block 22 is 16, the number of write drivers which may operate simultaneously during a program operation is 8, and the comparator 52 is designed to output a comparison signal STCNT having a high level when the count bit CNTBIT<3:0> is '1000'.

Moreover, it is also assumed that the event bus 32 is 16 bit and the event generator 30 generates '1101111011110111' as an event in response to the program data WDATA.

Each write driver controller increases a count bit by 1 when receiving '1' included in the event EVENT. The tenth write driver controller illustrated in FIG. 31 outputs '1000' as a count bit CNTBIT<3:0>. Here, a comparator, embodied in the tenth write driver controller, outputs the comparison signal STCNT having a high level. That is, the program control block 21 outputs the comparison signal STCNT having a high level when the number of program bits reaches a reference count value, e.g., '1000'.

As illustrated in FIG. 10, a comparator embodied in the tenth write driver controller outputs a comparison signal STCNT having a high level. A count value of 13 counting an event <1> in a bit sequence loop is greater than a reference count value of 8, so that a bit sequence controller 28 outputs a termination signal CNT_CMP having a low level to a control logic 34. The program control block 21 programs each program bit allocated in each of 8 enabled write drivers in each one of a plurality of memory cells included in each of 8 unit cell arrays among a plurality of unit cell arrays 24-1 to 24-i at the same time by using a first program pulse.

Figure 33:
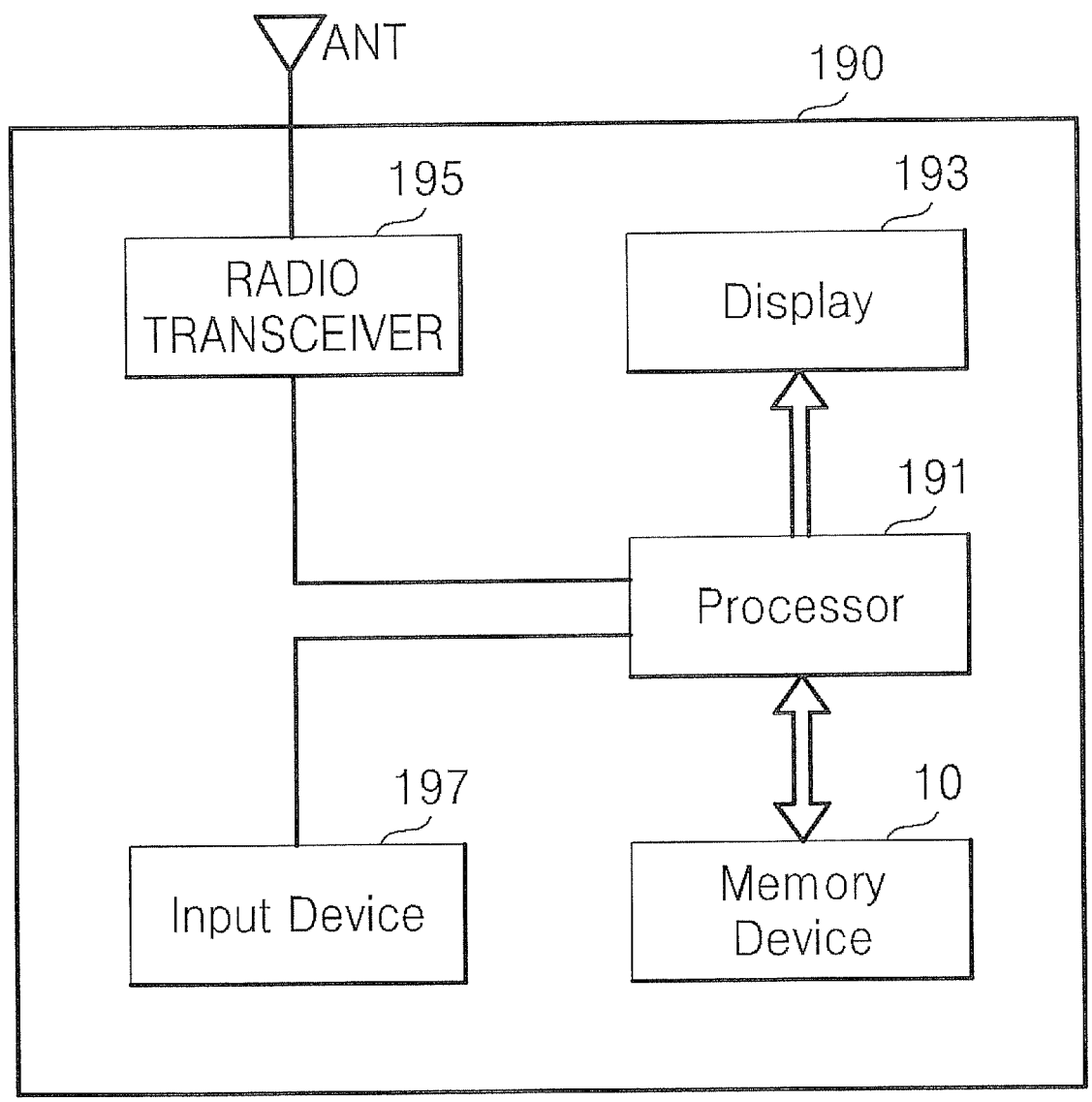
FIG. 33 shows an example embodiment of an electronic device including the memory device illustrated in FIG. 1.

The program control block 21 also programs each one of a remaining 5 program bits among 13 program bits in each one of a plurality of memory cells included in each of 5 unit cell arrays among a plurality of unit cell arrays 24-1 to 24-i at the same time by using a second program pulse. FIG. 33 shows an example embodiment of an electronic device including the memory device illustrated in FIG. 1. Referring to FIG. 33, the electronic device 190 which may be embodied as a cellular phone, a smart phone, or a wireless internet device includes the memory device 10 programming a program bit according to a bit sequence loop scheme and the processor 191 controlling a data process operation of the memory device 10, e.g., a program operation of a program bit.

Data, e.g., programmed bits, stored in the memory device 10 may be displayed through the display 193 under a control of the processor 191.

The radio transceiver 195 may transmit or receive radio signals through an antenna ANT. For example, the radio transceiver 195 may change radio signals received through the antenna ANT into signals which the processor 191 may process. Accordingly, the processor 191 may process signals output from the radio transceiver 195, store processed signals in the memory device 10, and display them through the display 193. The radio transceiver 195 may change signals output from the processor 191 into radio signals and output the radio signals through the antenna ANT.

The input device 197 is a device inputting control signals for controlling an operation of the processor 191 or data to be processed by the processor 191, and may be embodied as a pointing device such as a touch pad and a computer mouse, a keypad or a keyboard. The processor 191 may control an operation of the display 193 so that data output from the memory device 10, data output from the radio transceiver 195, or data output from the input device 197 may be displayed through the display 193.

Figure 34:
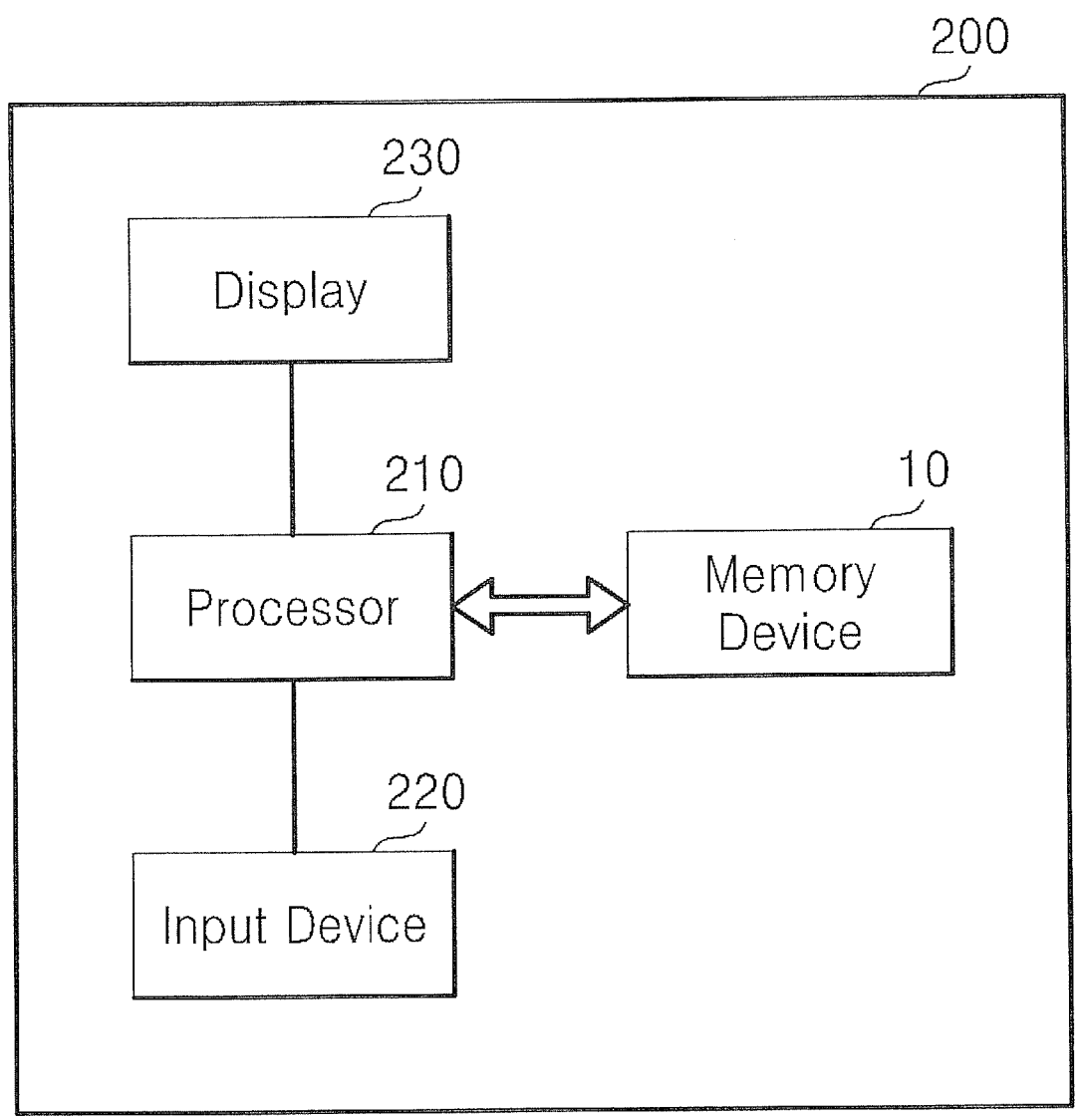
FIG. 34 shows another example embodiment of an electronic device including the memory device illustrated in FIG. 1.

FIG. 34 shows another example embodiment of an electronic device including a memory device illustrated in FIG. 1. Referring to FIG. 34, the electronic device 200, which may be embodied as a data process device such as personal computer (PC), a tablet computer, a net-book, an e-reader, a personal digital assistant (PDA), a portable multimedia player (PMP), a MP3 player or a MP4 player, includes the memory device 10 storing a program bit and a processor 210 controlling a data process operation of the memory device 10.

The process 210 may display data stored in the memory device 10 through a display 230 according to an input signal generated by an input device 220. For example, the input device 220 may be embodied as a pointing device such as a touch pad or a computer mouse, a keypad or a keyboard.

Figure 35:
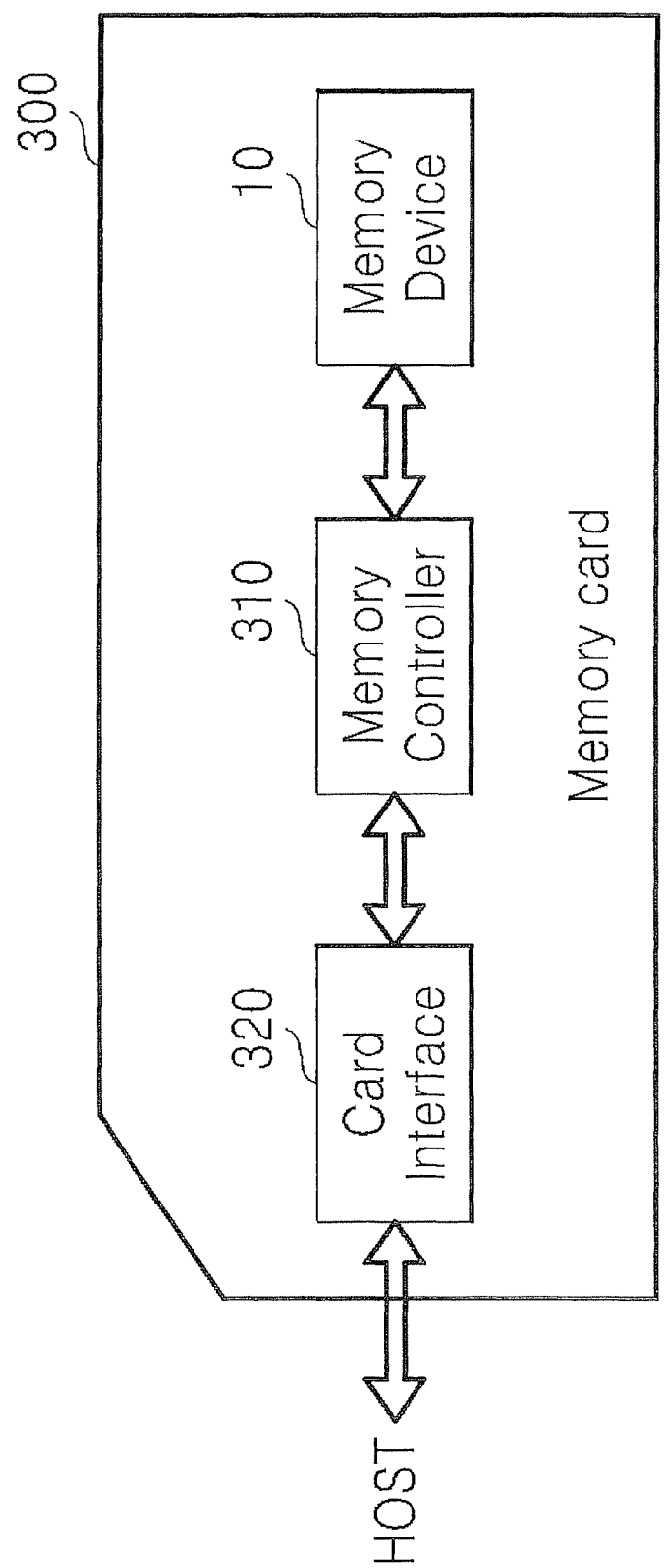
FIG. 35 shows still another example embodiment of an electronic device including the memory device illustrated in FIG. 1.

FIG. 35 shows still another example embodiment of an electronic device including a memory device illustrated in FIG. 1. Referring to FIG. 35, the electronic device 300 which may be embodied as a memory card or a smart card includes the memory device 10, a memory controller 310 and a card interface 320.

The memory controller 310 may control an exchange of data between the memory device 10 and the card interface 320. According to embodiments, the card interface 320 may be a secure digital (SD) card interface or a multi-media card (MMC) interface, however, it is not restricted thereto. The card interface 320, according to a protocol of a host, may interface an exchange of data between the host and the memory controller 310.

When the electronic device 300 is connected to a host such as a computer, a digital camera, a digital audio player, a cellular phone, console video game hardware, or a digital set-top box, the host may transmit or receive data stored in the memory device 10 through the card interface 320 and the memory controller 310.

Figure 36:
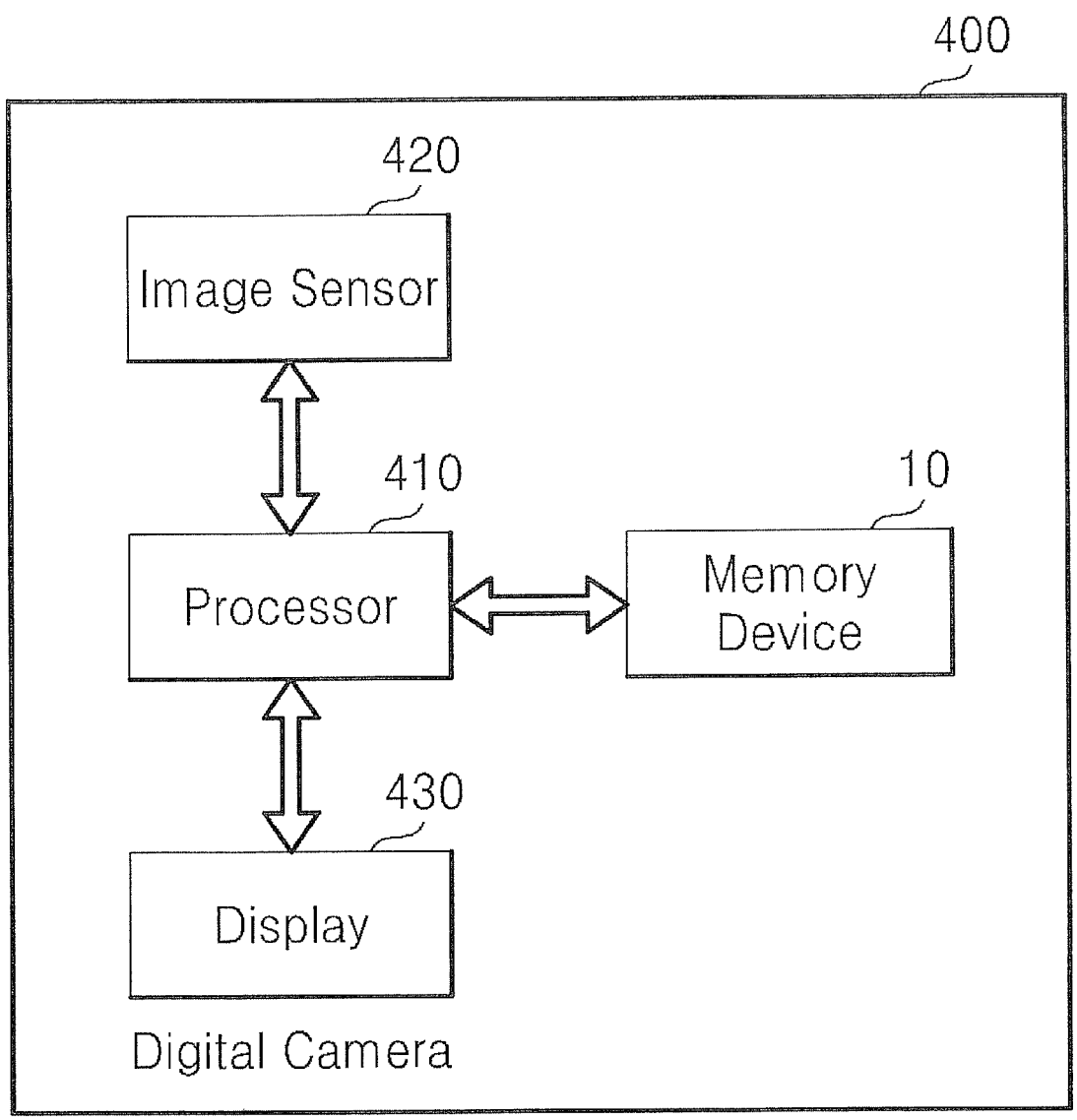
FIG. 36 shows still another example embodiment of an electronic device including the memory device illustrated in FIG. 1.

FIG. 36 shows still another example embodiment of an electronic device including the memory device illustrated in FIG. 1. Referring to FIG. 36, the electronic device 400 which may be embodied as a digital camera, or a cellular phone with a digital camera installed includes the memory device 10 storing a program bit and the processor 410 controlling a data process operation of the memory device 10.

The image sensor 420 of the electronic device 400 converts an optical image to digital signals, and converted digital signals are stored in the memory device 10 or displayed through a display 430 under a control of the processor 410.

Figure 37:
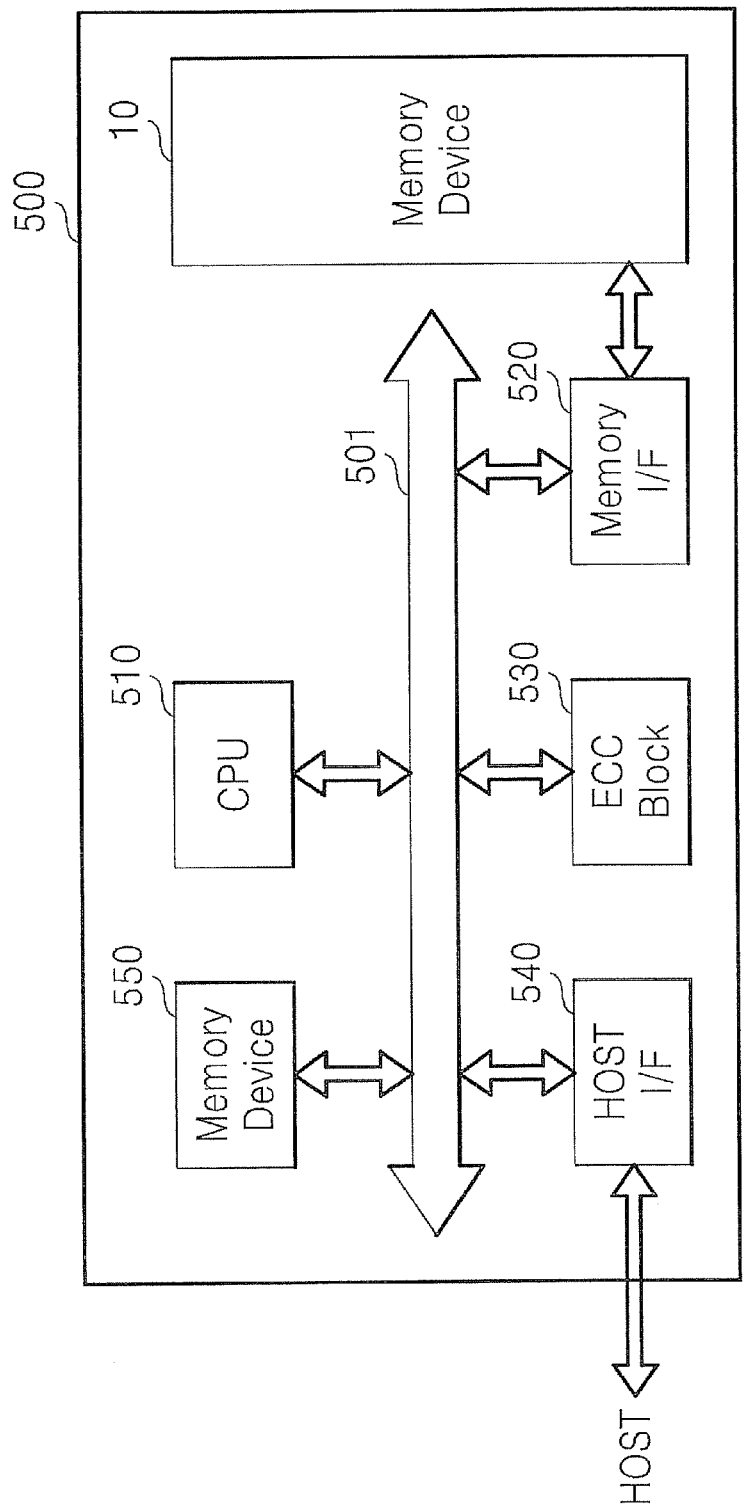
FIG. 37 shows still another example embodiment of an electronic device including the memory device illustrated in FIG. 1.

FIG. 37 shows still another example embodiment of an electronic device including a memory device illustrated in FIG. 1. Referring to FIG. 37, the electronic device 500 includes a memory device 10 and a CPU 510 controlling an operation of the memory device 10.

The electronic device 500 includes a memory device 550 which may be used as an operation memory of the CPU 510. The memory device 550 may be embodied as a non-volatile memory like a ROM. A host connected to the electronic device 500 may exchange data with the memory device through a memory interface 520 and a host interface 540.

An error correction code (ECC) block 530 operating under a control of the CPU 510 may detect and correct an error included in data read from the memory device 10 through a memory interface 520. The CPU 510 may control an exchange of data among the memory interface 520, the ECC block 530, a host interface 540 and a memory device 550 through a bus 501. The electronic device 500 may be embodied as a Universal serial bus (USB) memory drive or a memory stick.

Figure 38:
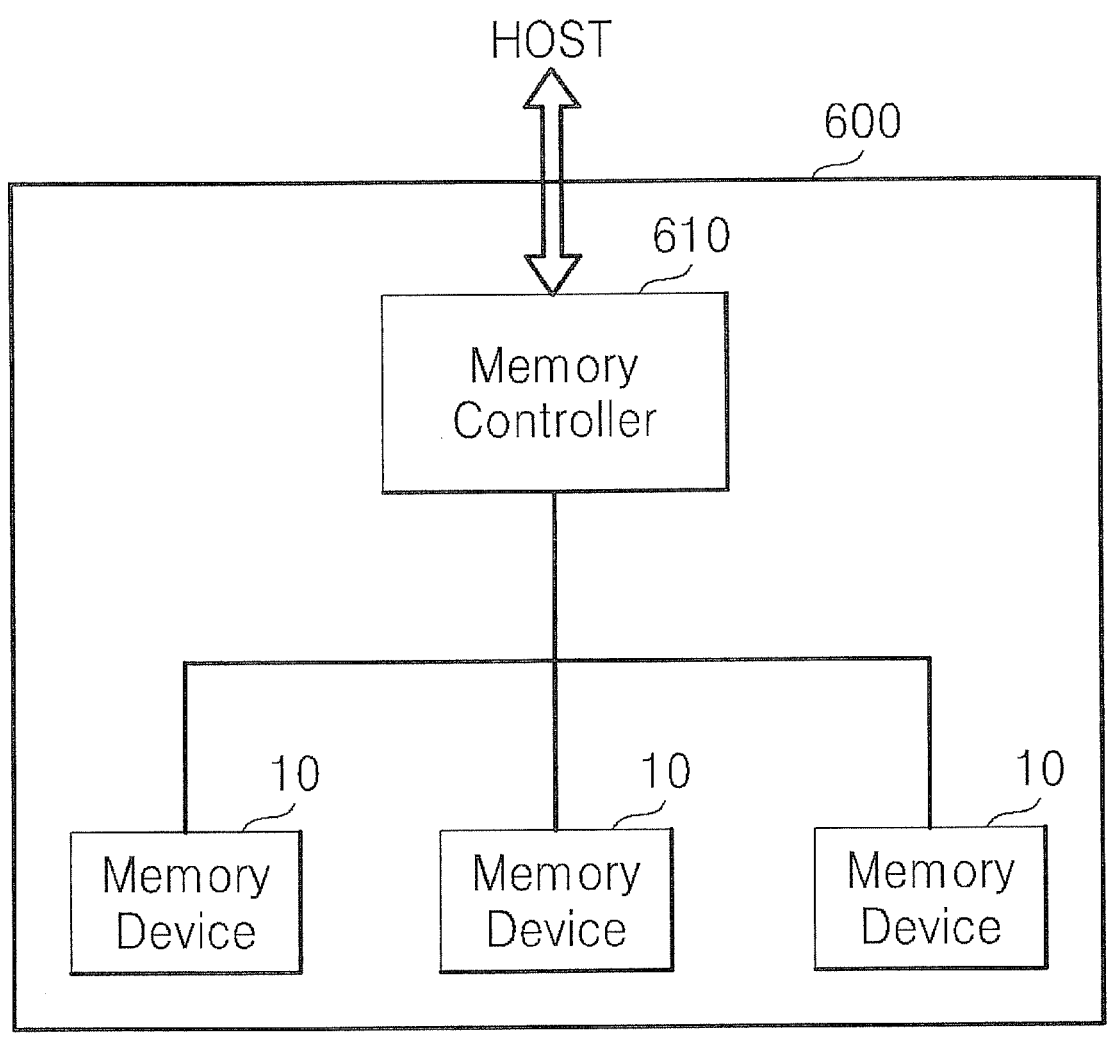
FIG. 38 shows still another example embodiment of an electronic device including the memory device illustrated in FIG. 1.

FIG. 38 shows still another example embodiment of an electronic device including a memory device illustrated in FIG. 1. Referring to FIG. 38, an electronic device 600 may be embodied as a data storage device like a solid state drive (SSD). The electronic device 600 may include a plurality of memory devices 10 and a memory controller 610 controlling a data process operation of each of the plurality of memory devices 10. The electronic device 600 may be embodied as a memory module.

Figure 39:
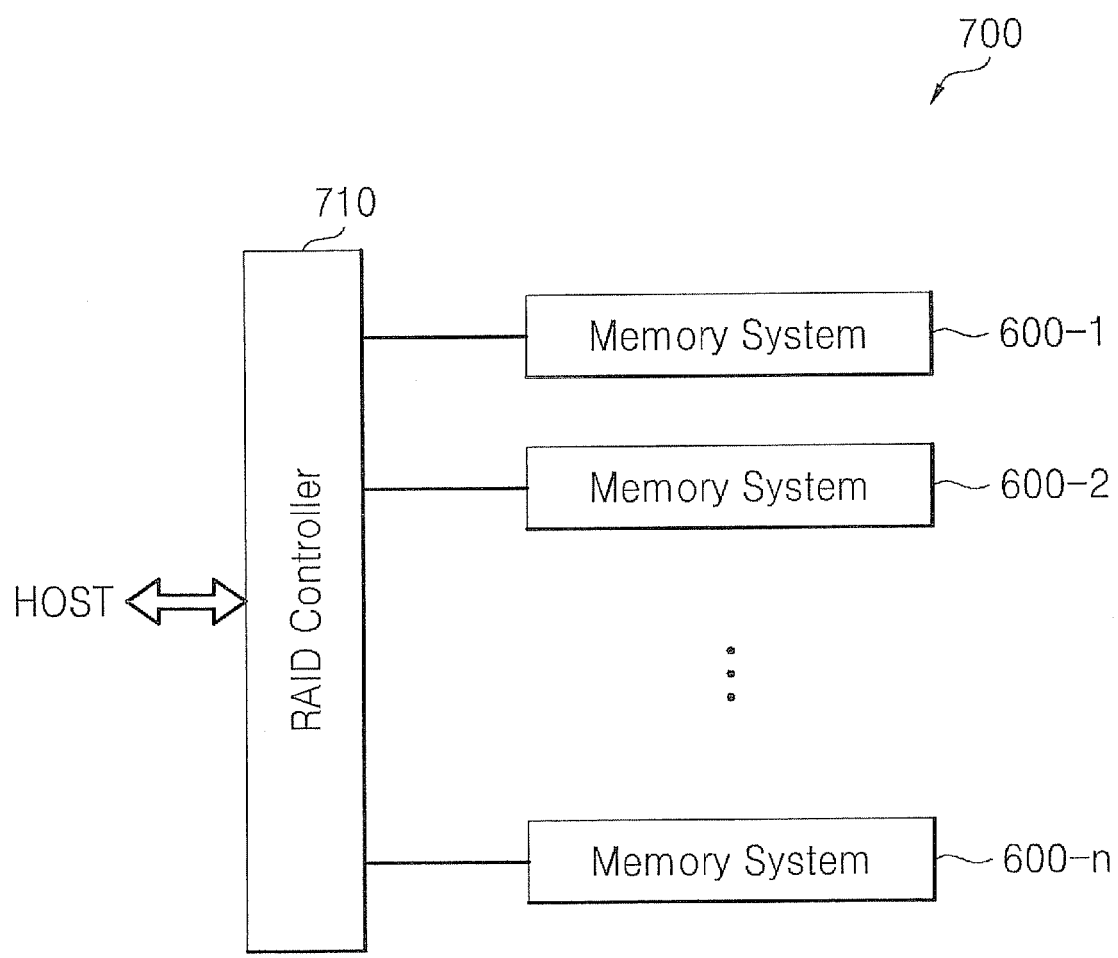
FIG. 39 shows an example embodiment of a data process device including an electronic device illustrated in FIG. 38.

FIG. 39 shows an example embodiment of a data process device including an electronic device illustrated in FIG. 38. Referring to FIGS. 38 and 39, a data storage device 700, which may be embodied as a redundant array of independent disks (RAID) system, may include a RAID controller 710 and a plurality of modules 600-1 to 400-n, where n is a natural number.

Each of a plurality of memory modules 600-1 to 600-n may be an electronic device 600 illustrated in FIG. 38. The plurality of memory modules may compose a RAID array. A data storage device 700 may be embodied as a personal computer (PC) or a SSD.

The RAID controller 710 during a program operation, according to a program command output from a host, may output a program data output from the host to one of the plurality of memory modules 600-1 to 600-n according to a RAID level selected among a plurality of RAID levels based on RAID level information. In addition, the RAID controller 710 may transmit data, read from one of the plurality of memory modules according to a read command of a host, to the host according to a RAID level selected among a plurality of RAID levels based on RAID level information.

Figure 40:
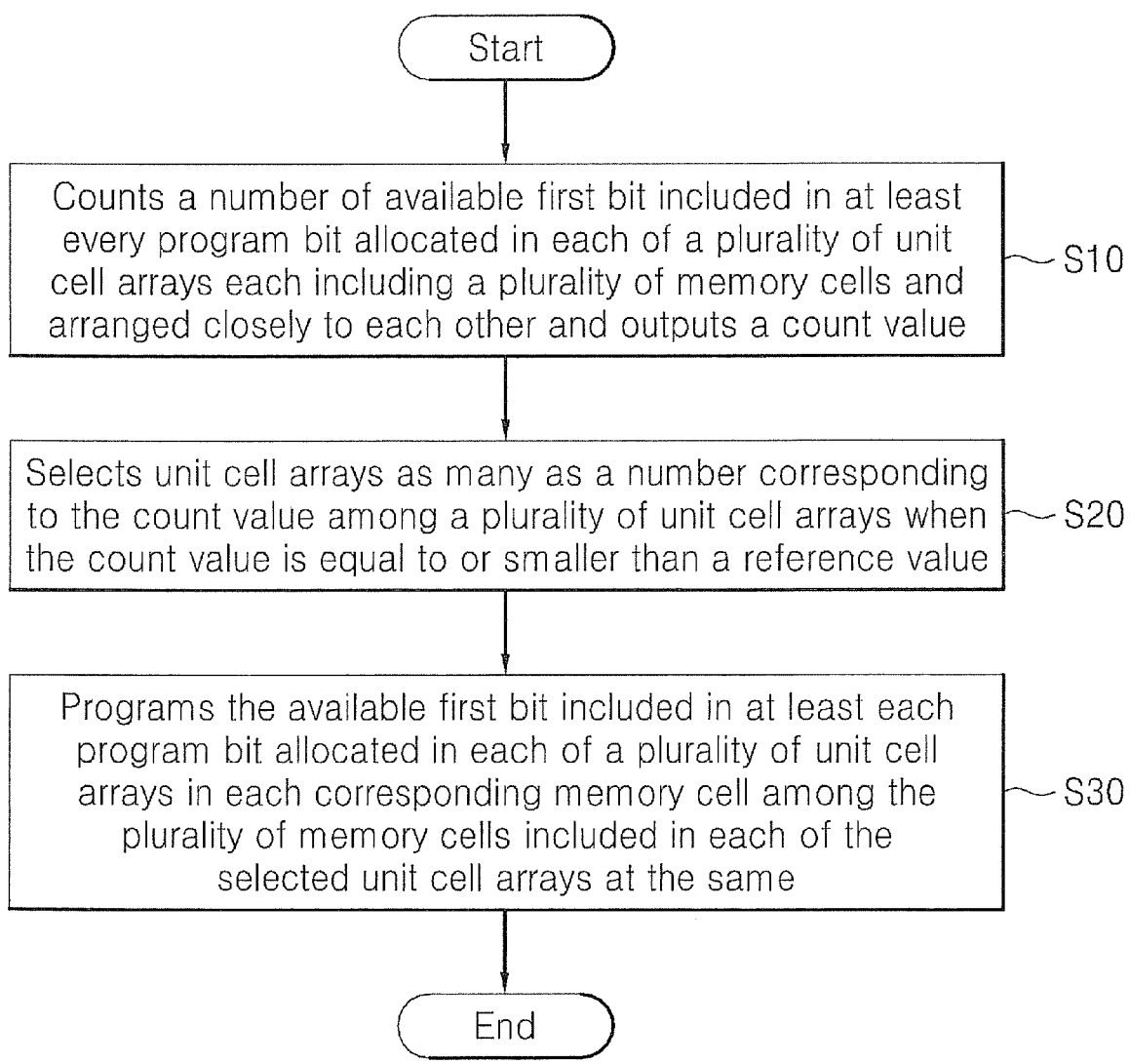
FIG. 40 is a flowchart for explaining a data process method according to embodiments of the present invention.

FIG. 40 is a flowchart for explaining a data process method according to an example embodiment.

Referring to FIGS. 1 and 40, the program control block 21 or the processor 210 counts a number of available first bit included in at least every program bit allocated in each of a plurality of unit cell arrays MG1 to MGi each including a plurality of memory cells and arranged closely to each other and outputs a count value (S10). The remaining description will refer to the processor 210, but the description equally applies to the program control block 21.

The processor 210 selects unit cell arrays as many as a number corresponding to the count value among a plurality of unit cell arrays MG1 to MGi when the count value is equal to or smaller than a reference value (S20). The processor 210 programs the available first bit included in at least each program bit allocated in each of a plurality of unit cell arrays MG1 to MGi in each corresponding memory cell among the plurality of memory cells included in each of the selected unit cell arrays at the same time by using a program pulse (S30).

Figure 41:
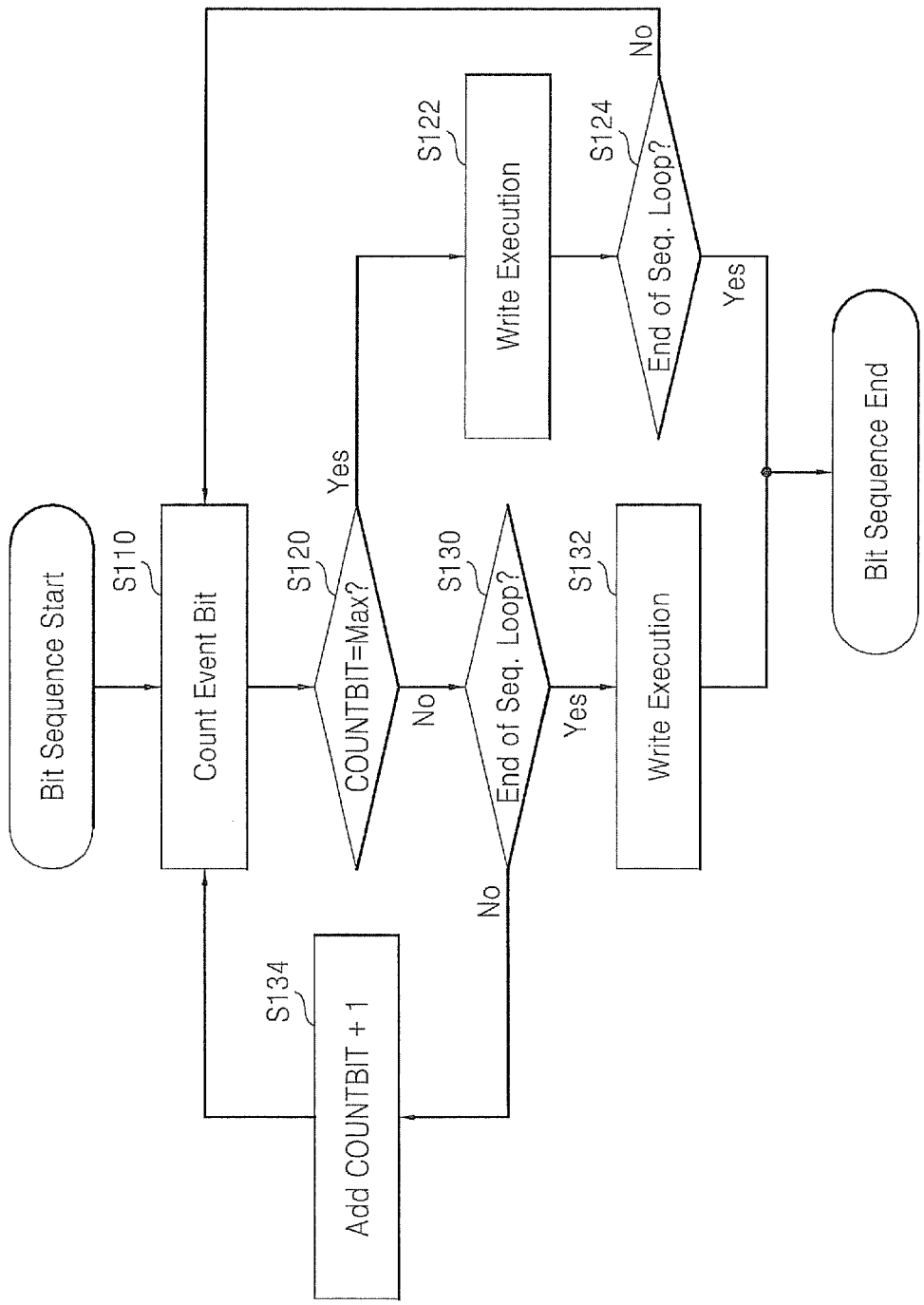
FIG. 41 is a flowchart for explaining an operation of the memory device illustrated in FIG. 1.

FIG. 41 is a flowchart for explaining an operation of a memory device illustrated in FIG. 1. To explain a multi bit sequence scheme referring to FIGS. 1 to 41, the program control block 21 or the processor 210 counts the number of available first bits included in at least each program bit allocated in each of a plurality of unit cell arrays MG1 to MGi each including a plurality of memory cells and arranged adjacently to each other and outputs a count value (S110). The remaining description will refer to the processor 210, but the description equally applies to the program control block 21.

The processor 210 compares the count value with a reference count value, i.e., a maximum number of write drivers which may operate simultaneously (S120). When the count value is equal to the reference count value, the program control block 210 programs the available first bit included in at least each program bit allocated in each of a plurality of unit cell arrays MG1 to MGi in each corresponding memory cell among the plurality of memory cells included in each of the selected unit cell arrays (S122).

The processor 210 determines if a bit sequence loop is terminated, terminates the bit sequence loop when it determines that the bit sequence loop is terminated (S124), and performs S110 again when it determines the bit sequence loop is not terminated (S124). As a result of comparison of S120, when the count value is different from the reference count value, the processor 210 determines if a bit sequence loop is terminated or not (S130). For example, when the count value is less than the reference count value, the processor 210 determines that the bit sequence loop is terminated, selects unit cell arrays as many as a number corresponding to the count value among a plurality of unit cell arrays MG1 to MGi, and programs the available first bit, which is included in at least each program bit allocated in each of a plurality of unit cell arrays MG1 to MGi, in a corresponding one of the plurality of memory cells, which are included in each of the selected unit cell arrays, simultaneously by using a program pulse (S132).

For example, when the count value is greater than the reference count value, the processor 210 may determine that the bit sequence loop is not terminated and perform S110 again. The processor 210 may also increase a count value by 1 and perform S110.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A memory device, comprising:
a plurality of unit cell arrays, each unit cell array including an array of memory cells arranged in a plurality of columns, each column associated with a bit line;
a program control circuit configured to program cells in the plurality of unit cell arrays based on program bits associated with the plurality of unit cell arrays, the program control unit configured to simultaneously program one memory cell in each unit cell array having at least one associated program bit.

2. The device of claim 1, wherein
the program control unit is configured to simultaneously program at least one memory cell in each unit cell array having at least one associated program bit during a current programming operation;
the program control unit is configured to, in a subsequent programming operation, simultaneously program at least one memory cell in each unit cell array having an associated programming bit not programmed in a preceding programming operation.

3. The device of claim 1, wherein the program control unit is configured to simultaneously program only one memory cell in each unit cell array having at least one associated program bit.

4. The device of claim 1, wherein the program control unit includes a plurality of write circuits, each of the plurality of write circuits associated with a different one of the plurality of unit cell arrays, each write circuit configured to program one memory cell in the associated unit cell array having at least one associated program bit.

5. The device of claim 4, wherein each write circuit comprises:
a write driver associated with each column of memory cells in the unit cell array associated with the write circuit, each write driver configured to drive memory cells in the associated column; and
a write driver controller associated with each write driver, each write driver controller configured to control whether the associated write driver operates.

6. The device of claim 5, wherein, for each write circuit, the write driver controllers communicate in sequence, and each write driver controller is configured to control the associated write driver to program an associated program bit if none of the previous write driver controllers in the sequence controlled the write drivers associated therewith to program a program bit.

7. A memory device, comprising:
a plurality of unit cell arrays, each unit cell array including an array of memory cells, the unit cell arrays being grouped into pairs;
a program control circuit configured to program cells in the plurality of unit cell arrays based on program bits associated with the plurality of unit cell arrays, the program control unit configured to simultaneously program one memory cell in each pair of unit cell arrays having at least one associated programming bit.

8. The device of claim 7, wherein
the program control unit is configured to simultaneously program at least one memory cell in each pair of unit cell arrays having at least one associated program bit during a current programming operation;
the program control unit is configured to, in a subsequent programming operation, simultaneously program at least one memory cell in each pair of unit cell arrays having an associated programming bit not programmed in a preceding programming operation.

9. The device of claim 7, wherein the program control unit is configured to simultaneously program only one memory cell in each pair of unit cell arrays having at least one associated program bit.

10. The device of claim 7, wherein the program control unit includes a plurality of write circuits, each of the plurality of write circuits associated with a different one of the plurality of unit cell arrays such that each pair of unit cell arrays is associated with a pair of the write circuits, and each pair of write circuits is configured to program one memory cell in each associated pair of unit cell arrays having at least one associated programming bit.

11. The device of claim 10, wherein each write circuit comprises:
a write driver associated with each column of memory cells in the unit cell array associated with the write circuit, each write driver configured to drive memory cells in the associated column; and
a write driver controller associated with each write driver, each write driver controller configured to control whether the associated write driver operates.

12. The device of claim 11, wherein, for each pair of write circuits,
the write driver controllers communicate in sequence, and
each write driver controller is configured to control the associated write driver to program an associated program bit if none of the previous write driver controllers in the sequence controlled the write drivers associated therewith to program a program bit.

* * * * *